(12) United States Patent
Kim et al.

(10) Patent No.: US 11,710,762 B2
(45) Date of Patent: Jul. 25, 2023

(54) DISPLAY DEVICE AND METHOD OF FABRICATING THE SAME

(71) Applicant: Samsung Display Co., LTD., Yongin-si (KR)

(72) Inventors: Woong Sik Kim, Yongin-si (KR); Ji Hyun Kim, Yongin-si (KR); Sang Hyun Lee, Yongin-si (KR); Sae Hee Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 169 days.

(21) Appl. No.: 17/324,618

(22) Filed: May 19, 2021

(65) Prior Publication Data

US 2022/0130891 A1     Apr. 28, 2022

(30) Foreign Application Priority Data

Oct. 23, 2020   (KR) .................. 10-2020-0138677

(51) Int. Cl.
*H01L 27/15*     (2006.01)
*H01L 25/075*    (2006.01)
(Continued)

(52) U.S. Cl.
CPC ........ *H01L 27/156* (2013.01); *H01L 25/0753* (2013.01); *H01L 25/18* (2013.01); *H01L 27/124* (2013.01); *H01L 24/24* (2013.01); *H01L 24/32* (2013.01); *H01L 24/73* (2013.01); *H01L 24/92* (2013.01); *H01L 2224/24226* (2013.01); *H01L 2224/32225* (2013.01); *H01L 2224/73217* (2013.01); *H01L 2224/92144* (2013.01)

(58) Field of Classification Search
None
See application file for complete search history.

(56) References Cited

U.S. PATENT DOCUMENTS 9,773,761 B2   9/2017  Do
10,109,655 B2  10/2018 Lee
(Continued)

FOREIGN PATENT DOCUMENTS

EP   3 683 832     7/2020
JP   2005-266616   9/2005
(Continued)

*Primary Examiner* — Bo B Jang
(74) *Attorney, Agent, or Firm* — Kile Park Reed & Houtteman PLLC

(57) ABSTRACT

A display device includes a substrate including a display area and a non-display area, and a first surface and a second surface; pixels disposed on the first surface; a signal line disposed on the first surface, and electrically connected to each pixel; a cushion layer disposed on the pixels and the signal line, and including at least one contact hole that exposes a portion of the signal line; a connector disposed in the at least one contact hole and electrically connected to the signal line; and a driver disposed on the cushion layer and electrically connected to the pixels through the connector. Each pixel includes a display element layer disposed on the first surface and including at least one light emitting element, and a pixel circuit layer disposed on the display element layer and including at least one transistor electrically connected to the at least one light emitting element.

20 Claims, 28 Drawing Sheets

(51) Int. Cl.
*H01L 25/18* (2023.01)
*H01L 27/12* (2006.01)
*H01L 23/00* (2006.01)

(56) References Cited

U.S. PATENT DOCUMENTS

| | | | |
|---|---|---|---|
| 2008/0224599 A1* | 9/2008 | Kim | H01L 27/3276 |
| | | | 445/24 |
| 2016/0218318 A1* | 7/2016 | Chung | H01L 51/5259 |
| 2017/0288003 A1* | 10/2017 | Kim | H01L 27/3262 |
| 2018/0006058 A1 | 1/2018 | Lee | |
| 2019/0244567 A1 | 8/2019 | Cho et al. | |
| 2020/0075667 A1 | 3/2020 | Lee et al. | |
| 2021/0358393 A1* | 11/2021 | Kang | H01L 33/005 |

FOREIGN PATENT DOCUMENTS

| | | |
|---|---|---|
| KR | 10-1490758 | 2/2015 |
| KR | 10-2019-0096475 | 8/2019 |
| KR | 10-2067090 | 1/2020 |

* cited by examiner

DISPLAY DEVICE AND METHOD OF FABRICATING THE SAME

CROSS-REFERENCE TO RELATED APPLICATION(S)

This application claims priority to and benefits of Korean Patent Application No. 10-2020-0138677 under 35 U.S.C. § 119 filed on Oct. 23, 2020 in the Korean Intellectual Property Office, the entire contents of which are incorporated herein by reference.

BACKGROUND

1. Technical Field

Embodiments relate to a display device and a method of fabricating the display device.

2. Description of the Related Art

With an increase in interest in an information display and an increase in demand to use portable information media, demand for display devices is markedly increased, and commercialization thereof is in progress.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments are directed to a display device formed through a simple fabricating process with minimized dead space and a reduced number of masks, and a method of fabricating the display device.

An embodiment may provide a display device that may include a substrate including a display area and a non-display area, and including a first surface and a second surface that face each other; a plurality of pixels disposed on the first surface in the display area; a signal line disposed on the first surface in the non-display area, and electrically connected to each of the plurality of pixels; a cushion layer disposed on the plurality of pixels and the signal line, the cushion layer including at least one contact hole that exposes a portion of the signal line; a connector disposed in the at least one contact hole and electrically connected to the signal line; and a driver disposed on the cushion layer and electrically connected to the pixels through the connector.

In an embodiment, each of the plurality of pixels may include a display element layer disposed on the first surface of the substrate and including at least one light emitting element; and a pixel circuit layer disposed on the display element layer and including at least one transistor electrically connected to the at least one light emitting element.

In an embodiment, the display device may further include a pad electrode disposed in the non-display area between the pixel circuit layer and the cushion layer. The pad electrode may electrically connect the signal line to the connector through the at least one contact hole.

In an embodiment, the display element layer may include a first bottom layer including a first bottom pattern and a second bottom pattern spaced apart from each other; the at least one light emitting element disposed between the first bottom pattern and the second bottom pattern; and a first electrode and a second contact electrode disposed on the at least one light emitting element. The pixel circuit layer may include a first conductive pattern electrically connected to the first contact electrode; a second conductive pattern electrically connected to the second contact electrode; a second bottom layer disposed on the display element layer and spaced apart from the first conductive pattern and the second conductive pattern; and the at least one transistor disposed on the first conductive pattern and the second conductive pattern.

In an embodiment, the second bottom layer may overlap the at least one light emitting element and the at least one transistor.

In an embodiment, the second bottom layer may include a light block component disposed between the at least one light emitting element and the at least one transistor that blocks light to the at least one transistor. The second bottom layer may be a gate electrode of the at least one transistor.

In an embodiment, the first conductive pattern, the second conductive pattern, and the second bottom layer each may include a conductive material having a reflectivity.

In an embodiment, the display element layer may include a first insulating layer disposed on the first bottom layer and exposing a portion of each of the first bottom pattern and the second bottom pattern; and a second insulating layer disposed on the first contact electrode and the second contact electrode and exposing a portion of each of the first contact electrode and the second contact electrode. The pixel circuit layer may include a planarization layer disposed on the first conductive pattern and the second conductive pattern on the second insulating layer; a third insulating layer disposed on the at least one transistor exposing a portion of each of the first conductive pattern and the second conductive pattern; a first bridge pattern disposed on the third insulating layer and electrically connected to the first conductive pattern; and a second bridge pattern spaced apart from the first bridge pattern and electrically connected to the second conductive pattern.

In an embodiment, each of the plurality of pixels may include an emission area that emits light. The first bottom layer may overlap the emission area.

In an embodiment, the first bottom layer, the first contact electrode, and the second contact electrode may each include a transparent conductive material.

In an embodiment, the planarization layer may include sections disposed on only the first conductive pattern and the second conductive pattern.

In an embodiment, the planarization layer may be disposed on the first conductive pattern, the second conductive pattern, and the second bottom layer and overlaps all of the first conductive pattern and the second conductive pattern and the second bottom layer.

In an embodiment, the display device may further include a dummy layer disposed on the second surface of the substrate.

In an embodiment, the display element layer may further include a first insulating layer disposed on the first bottom layer; a first electrode and a second electrode disposed on the first insulating layer and spaced apart from each other; and a second insulating layer disposed on the first contact electrode and the second contact electrode and exposing a portion of each of the first contact electrode and the second contact electrode. The pixel circuit layer may include a planarization layer disposed on the first conductive pattern and the second conductive pattern on the second insulating layer; a third insulating layer disposed on the at least one transistor and exposing a portion of each of the first conductive pattern and the second conductive pattern; a first bridge pattern disposed on the third insulating layer and electrically connected to the first conductive pattern; and a second bridge pattern spaced apart from the first bridge pattern and electrically connected to the second conductive pattern.

In an embodiment, each of the plurality of pixels may include an emission area thar emits light. The first bottom layer may not overlap the emission area.

In an embodiment, the first bottom layer may include a light block component that absorbs or blocks external light.

In an embodiment, the at least one light emitting element may be disposed on the first insulating layer between the first electrode and the second electrode.

In an embodiment, the display element layer may further include an additional insulating layer disposed between the first electrode and the second electrode and the first contact electrode and the second contact electrode. The at least one light emitting element may be disposed on the additional insulating layer between the first electrode and the second electrode.

In an embodiment, the at least one transistor may include an insulating layer disposed between a semiconductor layer and the second bottom layer; a gate electrode that overlaps an area of the semiconductor layer; a gate insulating layer disposed between the gate electrode and the semiconductor layer; and a first terminal and a second terminal electrically contacting opposite ends of the semiconductor layer.

An embodiment may provide a display device that may include a plurality of display devices each including a display panel having a plurality of pixels disposed on a substrate; a cushion layer disposed on the display panel and including a contact hole and exposing a portion of the display panel; and a driver disposed on the cushion layer and electrically connected to the plurality of pixels through a connector disposed in the contact hole. Each of the plurality of pixels may include a first bottom layer disposed on the substrate and including a first bottom pattern and a second bottom pattern spaced apart from each other; at least one light emitting element disposed between the first bottom pattern and the second bottom pattern; and a first contact electrode and a second contact electrode disposed on the at least one light emitting element; a first insulating layer disposed on the first contact electrode and the second contact electrode and exposing a portion of each of the first contact electrode and the second contact electrode; a second bottom layer disposed on the first insulating layer that overlaps a first conductive pattern electrically connected to the first contact electrode, a second conductive pattern electrically connected to the second contact electrode, and the at least one light emitting element; a second insulating layer disposed on the first conductive pattern, the second conductive pattern, and the second bottom layer; at least one transistor disposed on the second insulating layer and electrically connected to the at least one light emitting element; a first bridge pattern disposed on the transistor and electrically connected to the first conductive pattern; and a second bridge pattern spaced apart from the first bridge pattern and electrically connected to the second conductive pattern.

The display device according to the foregoing embodiment may be fabricated by a method including providing a pixel including at least one pixel area on a substrate.

In an embodiment, the providing of the pixel may include forming a first bottom layer including a first bottom pattern and a second bottom pattern spaced apart from each other on a first surface of the substrate; aligning at least one light emitting element between the first bottom pattern and the second bottom pattern; and forming a first contact electrode and a second contact electrode spaced apart from each other on the at least one light emitting element; forming a first insulating layer on the first contact electrode and the second contact electrode, the first insulating layer exposing a portion of each of the first contact electrode and the second contact electrode; forming a first conductive pattern, a second conductive pattern, and a second bottom layer spaced apart from each other on the first insulating layer; forming at least one transistor on the first conductive pattern, the second conductive pattern, and the second bottom layer; forming a second insulating layer exposing an area of each of the first conductive pattern and the second conductive pattern on the at least one transistor; and forming a first bridge pattern electrically connected to the first conductive pattern, and a second bridge pattern electrically connected to the second conductive pattern on the second insulating layer.

In an embodiment, the second bottom layer may be disposed between the at least one light emitting element and the at least one transistor, and overlaps the light at least one emitting element and the at least one transistor.

BRIEF DESCRIPTION OF THE DRAWINGS

The above and other aspects and features of the disclosure will become more apparent by describing in detail embodiments thereof with reference to the attached drawings, in which:

FIG. 6 is a perspective view schematically illustrating a light emitting element in accordance with an.

DETAILED DESCRIPTION OF THE EMBODIMENTS

Figure 1:
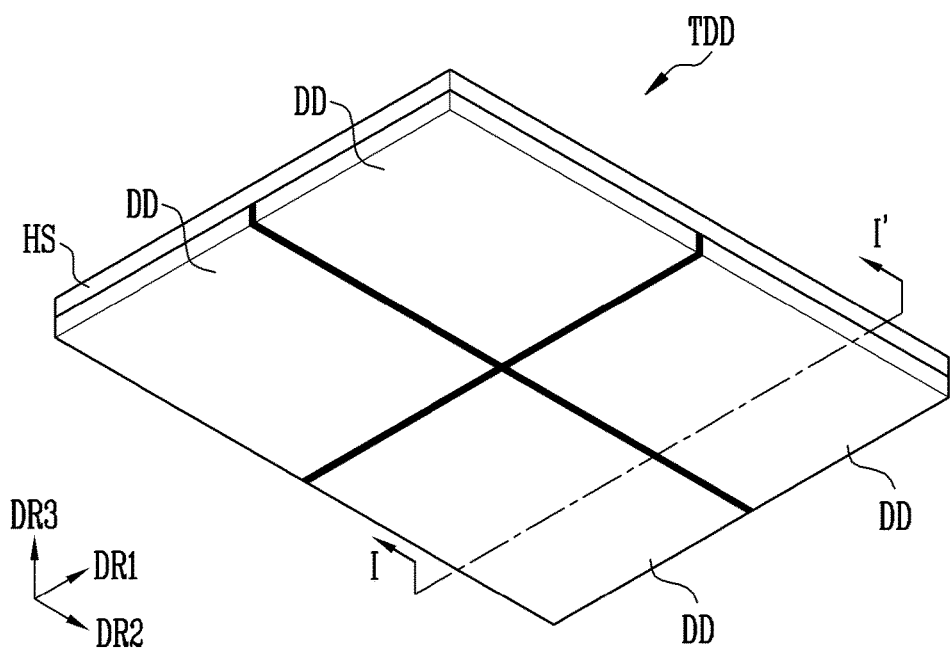
FIG. 1 is a perspective view schematically illustrating a multi-screen display device in accordance with an embodiment.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes within the spirit and technical scope of the disclosure are encompassed in the disclosure.

Throughout the disclosure, like reference numerals refer to like parts throughout the various figures and embodiments. The sizes of elements in the accompanying drawings may be exaggerated for clarity of illustration. It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprise," "include," "have," and variations thereof when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under or below a second part, the first part may be not only directly under or below the second part but a third part may intervene between them.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments and required details of the disclosure are described with reference to the accompanying drawings in order to describe the disclosure in detail so that those having ordinary skill in the art to which the disclosure pertains can easily practice the disclosure. Furthermore, a singular form may include a plural form as long as it is not specifically mentioned in a sentence.

Figure 2:
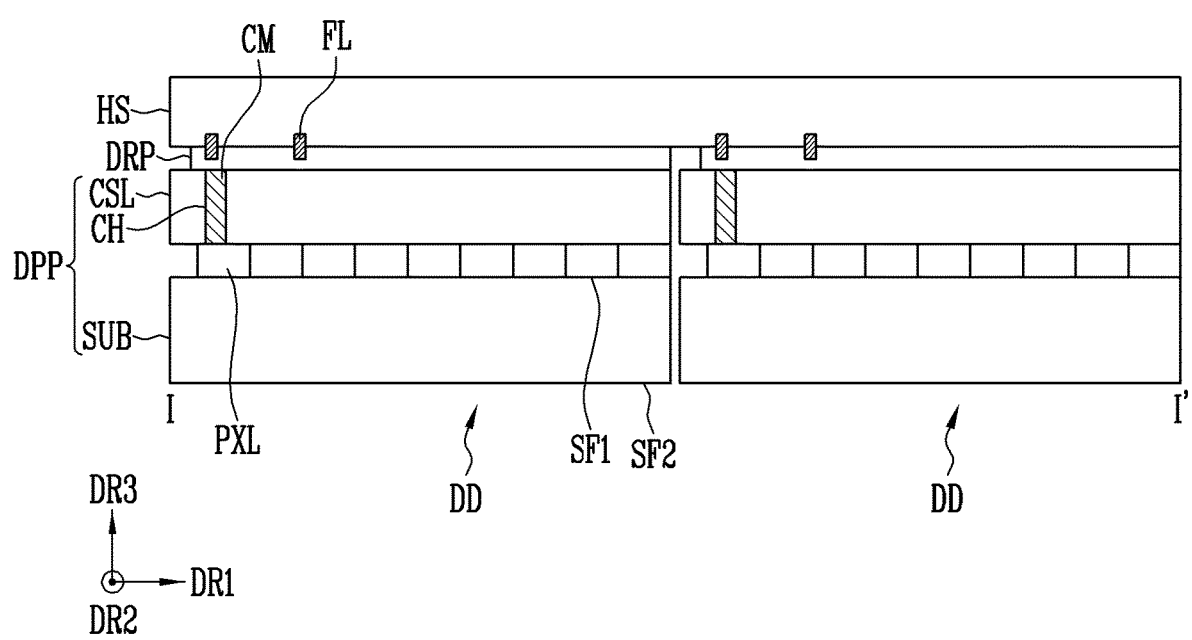
FIG. 2 is a schematic cross-sectional view taken along line I-I' of FIG. 1.
Figure 3A:
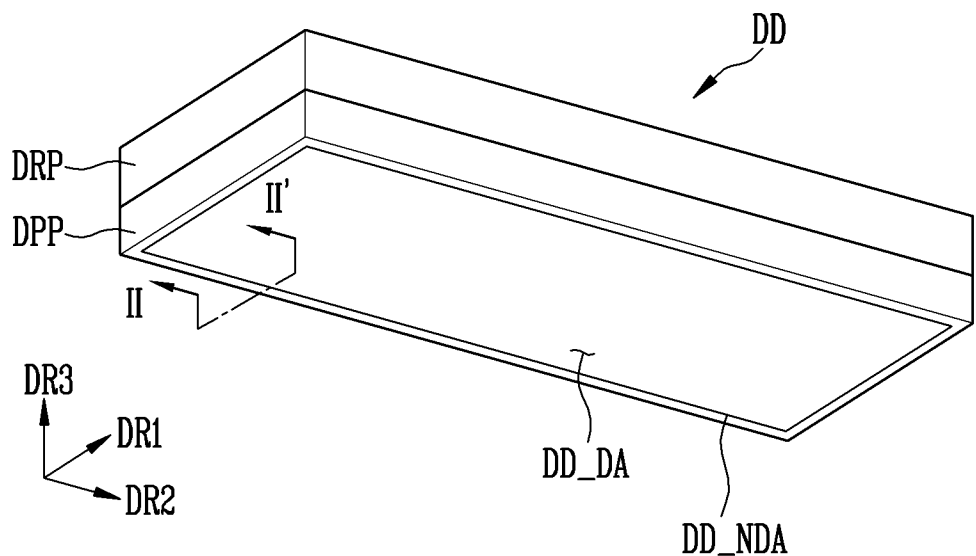
FIG. 3A is a perspective view schematically illustrating a display device in accordance with an embodiment.
Figure 3B:
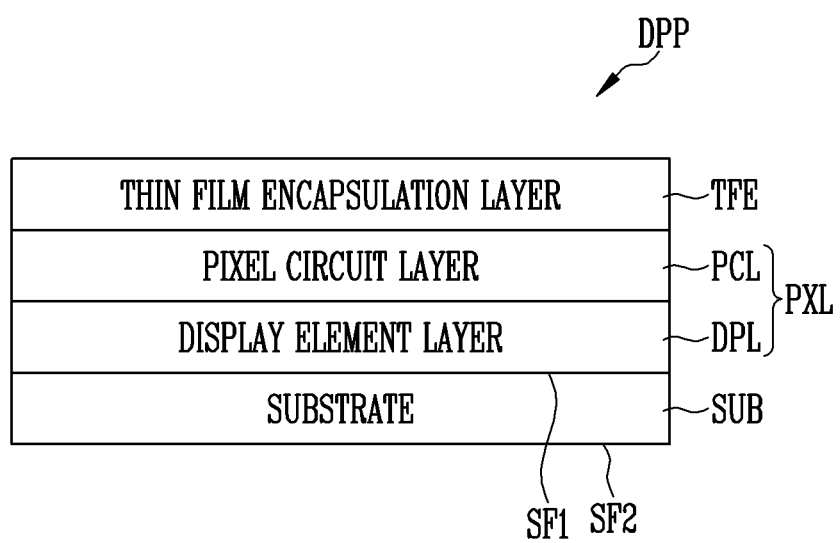
FIG. 3B is a schematic cross-sectional view of a display panel of FIG. 3A.
Figure 4:
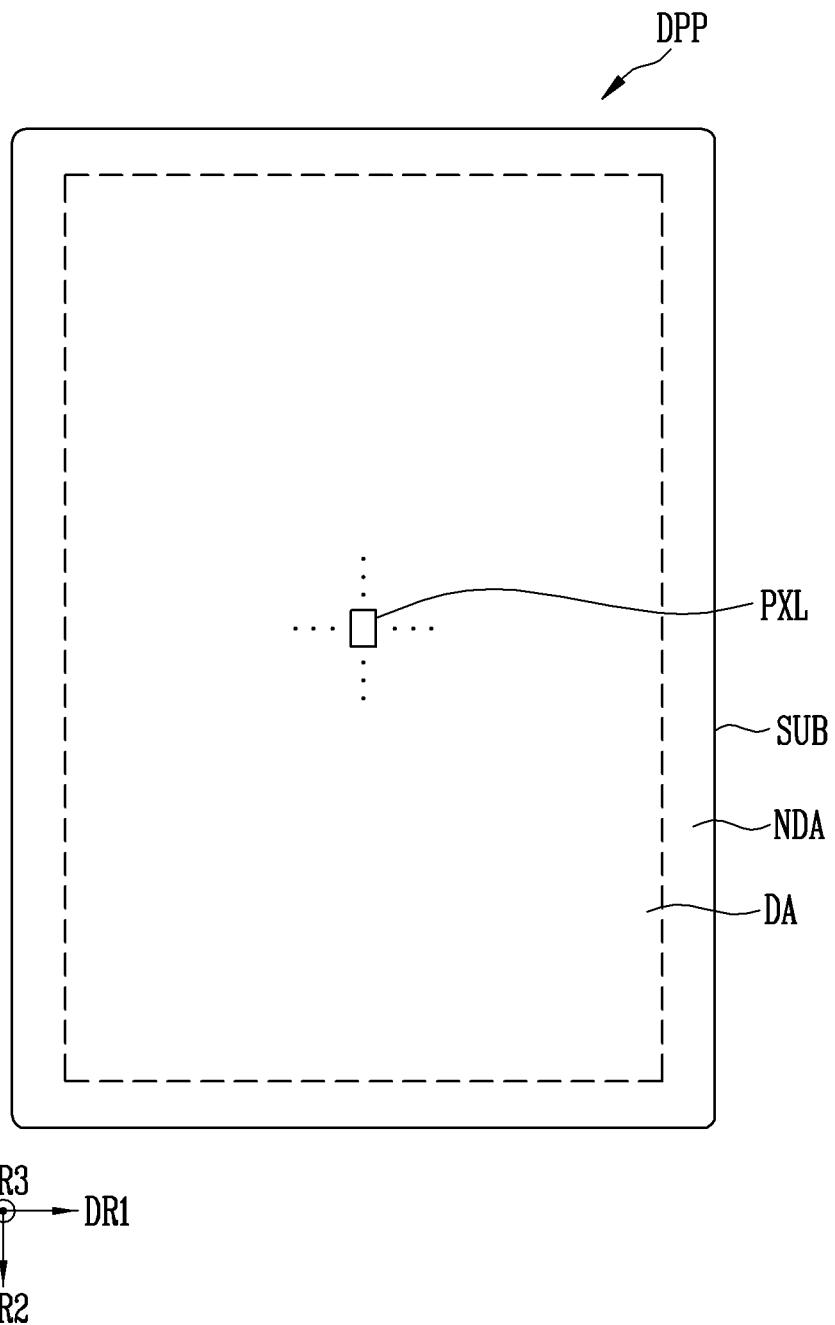
FIG. 4 is a plan view schematically illustrating the display panel in accordance with an embodiment.
Figure 5A:
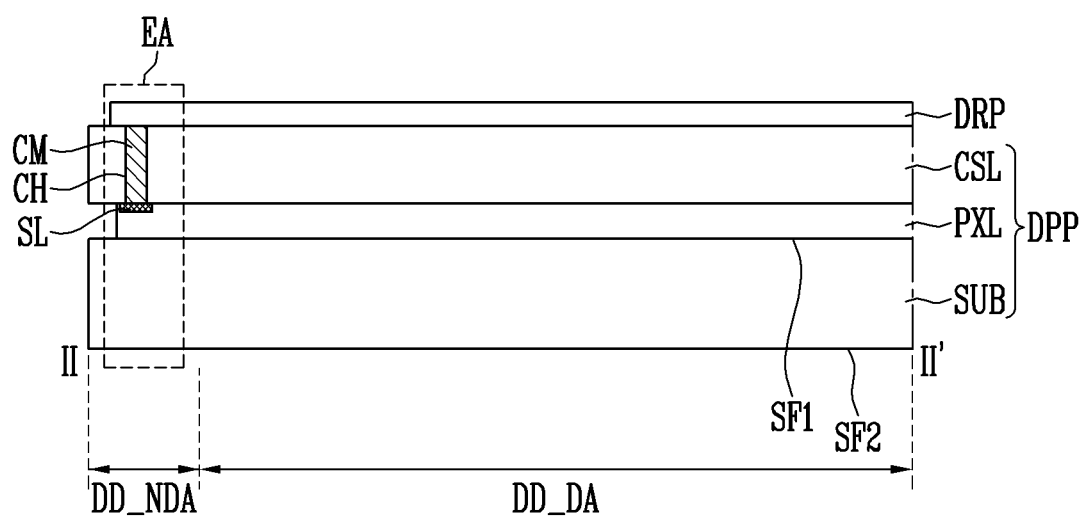
FIG. 5A is a sectional diagram taken along line II-IF of FIG. 3A.

FIG. 1 is a perspective view schematically illustrating a multi-screen display device TDD in accordance with an embodiment. FIG. 2 is a sectional view taken along line I-I' of FIG. 1. FIG. 3A is a perspective view schematically illustrating a display device DD in accordance with an embodiment. FIG. 3B is a schematic cross-sectional view of a display panel DPP of FIG. 3A. FIG. 4 is a plan view schematically illustrating a display panel DPP in accordance with an embodiment. FIG. 5A is a schematic sectional diagram taken along line II-II' of FIG. 3A.

Referring to FIGS. 1 to 5A, the display device in accordance with an embodiment may be a multi-screen display device TDD including display devices DD.

If the display device DD is an electronic device using at least one surface as a display surface, e.g., a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical appliance, a camera, or a wearable device, the disclosure may be applied to the display device DD.

The multi-screen display device TDD (or also referred to as "tiled display") may include display devices DD arranged or disposed in a matrix shape in a first direction DR1 and a second direction DR2, and a housing HS. The display devices DD may display individual images or partitively display an image. The display devices DD may include display panels having a same type, structure, size, or method, but the disclosure is not limited thereto.

The display devices DD may be arranged or disposed in a matrix shape. The matrix shape may include at least one row and at least two columns.

The housing HS may physically connect the display devices DD so that the display devices DD may form a multi-screen display device TDD. The housing HS may be disposed on surfaces (or upper surfaces) of the display devices DD and may control movement of the display devices DD or fix the display devices DD. Each of the display devices DD may be removably fastened to the housing HS by at least one fastener FL. Therefore, it is easy to attach the display device DD to the housing HS or detach the same therefrom, so that even if a display device DD malfunctions, the display device DD may be easily repaired.

Each of the display devices DD may be provided in various forms, for example, in the form of a rectangular plate having two pairs of parallel sides, but the disclosure is not limited thereto. In case that each of the display devices DD is provided in the form of a substantially rectangular plate, one of the two pairs of sides may be longer than the other thereof. Although in the drawing each of the display devices DD has an angled corner formed by linear lines, the disclosure is not limited thereto. In an embodiment, in each display device DD provided in the form of a substantially rectangular plate, a corner where a long side and a short side meet each other may have a substantially round shape.

In an embodiment, for the sake of explanation, there is illustrated an example in which each display device DD has a substantially rectangular shape with a pair of long sides and a pair of short sides. The direction in which the long sides extend refers to the second direction DR2, the direction in which the short sides extend refers to the first direction DR1, and the direction perpendicular to the long sides and the short sides refers to a third direction DR3. The first to third directions DR1, DR2, and DR3 may refer to the directions indicated by the first to third directions DR1, DR2, and DR3, respectively.

In an embodiment, at least a portion of each display device DD may have flexibility, and the display device DD may be folded at the portion having the flexibility.

Each display device DD may include a display area DD_DA that displays an image, and a non-display area DD_NDA provided or disposed on at least one or a side of the display area DD_DA. The non-display area DD_NDA may be an area in which no image is displayed. However, the disclosure is not limited to this. In an embodiment, the shape of the display area DD_DA and the shape of the non-display area DD_NDA may be designed to be relative to each other.

In an embodiment, each display device DD may include a sensing area and a non-sensing area. Each display device DD may not only display an image through the sensing area but may also sense a touch input made on an image display surface (or an input surface) or sense light that is incident from the front. The non-sensing area may enclose the sensing area, but this is only for illustrative purposes, and the disclosure is not limited thereto. In an embodiment, an area of the display area DA may correspond to the sensing area.

An image displayed on a screen of the multi-screen display device TDD may be disconnected by the non-display area DD_NDA that is disposed on a boundary area between display devices DD, for example, by a seam area. In case that the width (or the surface area) of the non-display area DD_NDA is relatively large, a sense of disconnection in the image on the boundary area between the display devices DD may be intensified.

In contrast, in case that the width (or the surface area) of the non-display area DD_NDA is reduced, the size of the display area DD_DA may be increased without increasing the size of the display device DD. Therefore, a larger display area DD_DA may be provided. Furthermore, in case that the non-display area DD_NDA is reduced, when the multi-screen display device TDD is implemented using the display devices DD, visibility of boundaries between the display devices DD may be minimized, so that a smoother image may be displayed.

Each display device DD may include a display panel DPP and a driver DRP.

The display panel DPP may display an image. A self-emissive display panel, such as an organic light emitting display (OLED) panel using an organic light emitting diode as a light emitting element, a nano-scale light emitting diode (LED) display panel using a nano-scale LED as a light emitting element, and a quantum dot (QD) OLED panel using a quantum dot and an organic light emitting diode, may be used as the display panel DPP. A non-emissive display panel such as a liquid crystal display (LCD) panel, an electro-phoretic display (EPD) panel, or an electro-wetting display (EWD) panel may be used as the display panel DPP. In case that the non-emissive display panel is used as the display panel DPP, the display device DD may include a backlight unit or other light emitting unit that supplies light to the display panel DPP.

The display panel DPP may include a substrate SUB, pixels PXL, and a cushion layer CSL.

The substrate SUB may be formed of an area having an approximately rectangular shape. However, the number of areas provided in the substrate SUB may be changed. The shape of the substrate SUB may be changed depending on areas provided in the substrate SUB. In an embodiment, the substrate SUB may include a first surface SF1 and a second surface SF2 that face each other in the third direction DR3. The first surface SF1 (or an upper surface) may be a surface of the substrate SUB on which the display panel DPP and the driver DRP are successively provided. The second surface SF2 (or a lower surface) may be an image display surface on which an image is displayed.

The substrate SUB may be made of insulating material such as glass or resin. Furthermore, the substrate SUB may be made of material having flexibility so as to be bendable or foldable and have a single or multilayer structure. For instance, examples of the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB is not limited to that of the foregoing embodiments.

The substrate SUB may include a display area DA and a non-display area NDA. The display area DA may be an area in which the pixels PXL are provided or disposed and an image is thus displayed. The non-display area NDA may be an area in which the pixels PXL are not provided or disposed, and may be an area in which no image is displayed.

The display area DA of the display panel DPP may correspond to the display area DD_DA of the corresponding display device DD. The non-display area NDA of the display panel DPP may correspond to the non-display area DD_NDA of the corresponding display device DD.

The pixels PXL may be provided or disposed on the first surface SF1 of the substrate SUB. For the sake of explanation, FIG. 4 illustrates only a pixel PXL, but pixels PXL may be substantially provided or disposed in the display area DA of the substrate SUB.

The pixels PXL may be disposed in the display area DA of the substrate SUB. Each of the pixels PXL refers to a smallest unit for displaying an image. The pixels PXL each may include a light emitting element which emits white light and/or color light. Each of the pixels PXL may emit a color of red, green, and blue, but the disclosure is not limited to this, and the pixel PXL may emit a color such as cyan, magenta, or yellow.

The pixels PXL may be arranged or disposed in a matrix form in rows extending in the first direction DR1 and columns extending in the second direction DR2 intersecting with the first direction DR1. However, the arrangement of the pixels PXL is not limited to a particular arrangement. For example, the pixels PXL may be arranged or disposed in various forms. Although each of the pixels PXL has been illustrated as having a substantially rectangular shape, the disclosure is not limited to this. The pixel PXL may have various shapes. Furthermore, when pixels PXL are provided, the pixels PXL may have different surface areas (or different sizes). For example, in case that pixels PXL emit different colors of light, the pixels PXL may have different surface areas (or different sizes) or different shapes by color.

In an embodiment, each of the pixels PXL may include a display element layer DPL and a pixel circuit layer PCL that are successively disposed on the first surface SF1 of the substrate SUB.

The display element layer DPL may be provided or disposed on the first surface SF1 of the substrate SUB and include a light emitting element that emits light, and an electrode electrically connected with the light emitting element. For example, the light emitting element may be an inorganic light emitting element including inorganic light emitting material, but the disclosure is not limited thereto. In an embodiment, the light emitting element may be a light emitting element (a quantum dot display element) that emits light such that the wavelength of light to be emitted is changed using an organic light emitting diode or quantum dots. Detailed descriptions of the light emitting element will be made with reference to FIGS. 6 and 7.

The pixel circuit layer PCL may be disposed on the display element layer DPL. The pixel circuit layer PCL may include at least one or more transistors electrically connected with some or a number of components of the display element layer DPL, and signal lines electrically connected to the transistors. The transistors each may be provided such that a semiconductor layer, a gate electrode, and first and second terminals are successively stacked therein with insulating layers interposed therebetween, but the disclosure is not limited thereto. Here, the semiconductor layer may include amorphous silicon, polycrystalline silicon, low temperature polycrystalline silicon, and an organic semiconductor.

In an embodiment, a thin-film encapsulation layer TFE may be disposed on the display element layer DPL. The display panel DPP may selectively include the thin-film encapsulation layer TFE.

The thin-film encapsulation layer TFE may be an encapsulation substrate or have the form of an encapsulation layer having a multilayer structure. In case that the thin-film encapsulation layer TFE has the form of the encapsulation layer, the thin-film encapsulation layer TFE may include an inorganic and/or organic layer. For example, the thin-film encapsulation layer TFE may have a structure formed by successively stacking an inorganic layer, an organic layer, and an inorganic layer. The thin-film encapsulation layer TFE may prevent outside air or water from permeating the display element layer DPL or the pixel circuit layer PCL. In an embodiment, the thin-film encapsulation layer TFE may be omitted.

A line part electrically connected with the pixels PXL may be disposed in the non-display area NDA of the substrate SUB. The line part may electrically connect the driver DRP with the pixels PXL. The line part may be a fan-out line electrically connected with signal lines, e.g., a scan line, a data line, and an emission control line, which are electrically connected to each pixel PXL to provide signals to the pixel PXL. Furthermore, the line part may be a fan-out line electrically connected to signal lines, e.g., a control line and a sensing line, which are electrically connected to each pixel PXL to compensate in real time for changes in electrical characteristics of the pixel PXL.

The cushion layer CSL may be provided or disposed on the thin-film encapsulation layer TFE. The cushion layer CSL may be a protective film for protecting the pixels PXL disposed therebelow. The cushion layer CSL may include an organic insulating layer including organic material, but the disclosure is not limited thereto. In an embodiment, the cushion layer CSL may function to mitigate an external shock and include elastically deformable material. In an embodiment, the cushion layer CSL and the substrate SUB may include a same material or similar material, or the cushion layer CSL may include one or more materials selected from among materials provided as examples of the material of the substrate SUB. However, the material of the cushion layer CSL is not limited to that of the foregoing embodiment, and an appropriate material or materials may be selected and may form the cushion layer CSL so long as it does not affect image display by the display device DD.

The cushion layer CSL may include one or more contact holes CH. The contact holes CH may be disposed in the display area DA, in which the pixels PXL may be provided, to be dispersed therein, or may be disposed in a specific or selected area, e.g., a non-display area NDA, and may pass through the cushion layer CSL. A connector CM (a connecting member) may be provided or disposed in each contact hole CH.

The connector CM may be a conductive adhesive component. As illustrated in FIG. 5A, the connector CM may electrically connect a signal line SL, electrically connected to each of the pixels PXL, with the driver DRP disposed on the display panel DPP. Here, the conductive adhesive component may be formed as an anisotropic conductive film, but the disclosure is not limited thereto.

The signal line SL may be electrically connected with each pixel PXL to apply a signal (or voltage) to the corresponding pixel PXL. For example, the signal line SL may be a scan line that transmits a scan signal to the corresponding pixel PXL or may be a fan-out line electrically connected to the scan line. Furthermore, the signal line SL may be a data line that transmits a data signal to the corresponding pixel PXL or may be a fan-out line electrically connected to the data line. The signal line SL may be a power line that transmits a voltage of a driving power supply to the corresponding pixel PXL or may be a fan-out line electrically connected to the power line. Furthermore, the signal line SL may be an emission control line that transmits an emission control signal to the corresponding pixel PXL or may be a fan-out line electrically connected to the emission control line. However, the disclosure is not limited to this. In an embodiment, the connector CM may be a pad electrode electrically connected to the conductive adhesive component.

The driver DRP may be disposed on the cushion layer CSL of the display panel DPP to be electrically connected with the pixels PXL through the connectors CM. The driver DRP may include a circuit substrate (not illustrated) on which a driving chip electrically connected to the light emitting element provided or disposed in each pixel PXL is mounted.

Hereinafter, connection relationship between the display panel DPP and the driver DRP will be described with reference to FIG. 5B, focusing on the case that the contact hole CH passing through the cushion layer CSL is formed in the non-display area NDA.

Figure 5B:
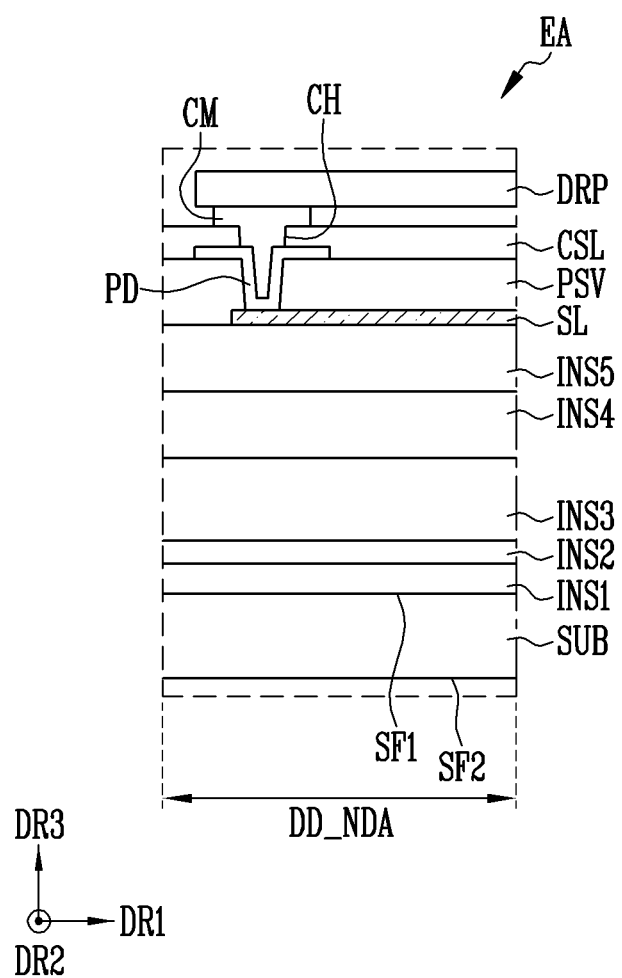
FIG. 5B is a schematic enlarged sectional view illustrating portion EA of FIG. 5A.

FIG. 5B is a schematic enlarged sectional view illustrating portion EA of FIG. 5A.

Regarding the display device of FIG. 5B, the following description will be focused on differences from that of the foregoing embodiment to avoid repetitive descriptions.

Referring to FIGS. 3A, 4, 5A, and 5B, the display panel DPP and the driver DRP may be disposed in the non-display area DD_NDA of the display device DD.

The display panel DPP disposed in the non-display area DD_NDA may include insulating layers, a signal line SL, a pad electrode PD, a cushion layer CSL, and a connector CM which may be successively provided or disposed on the first surface SF1 of the substrate SUB.

The insulating layers may include first to fifth insulating layers INS1, INS2, INS3, INS4, and INS5, and a passivation layer PSV which are successively provided or disposed and/or formed on the first surface SF1.

The first to fifth insulating layers INS1, INS2, INS3, INS4, and INS5 may be an inorganic insulating layer including inorganic material or an organic insulating layer including organic material.

The first insulating layer INS1 may be provided or disposed and/or formed on the first surface SF1 of the substrate SUB. In an embodiment, the first insulating layer INS1 may be an inorganic insulating layer including inorganic material. For example, the inorganic material may include at least one of metal oxides such as silicon nitride ($SiN_x$), silicon oxide ($SiO_x$), silicon oxynitride ($SiO_xN_y$), and aluminum oxide ($AlO_x$). However, the material of the first insulating layer INS1 is not limited to that of the foregoing embodiments. In an embodiment, the first insulating layer INS1 may include an organic insulating layer including organic material. The first insulating layer INS1 may be provided in a single-layer structure, and the first insulating layer INS1 may also be provided in a multilayer structure having at least two or more layers.

The second insulating layer INS2 may be provided or disposed and/or formed on the first insulating layer INS1. In an embodiment, the second insulating layer INS2 may be provided or disposed in only an area of the display area DD_DA of the display device DD and may not be provided or disposed in the non-display area DD_NDA.

The third insulating layer INS3 may be provided or disposed and/or formed on the second insulating layer INS2. The third insulating layer INS3 may include an organic insulating layer including organic material to reduce a step difference caused by components disposed therebelow.

The fourth insulating layer INS4 may be provided or disposed and/or formed on the third insulating layer INS3. The fourth insulating layer INS4 and the first insulating layer INS1 may include a same material or similar material, or the fourth insulating layer INS4 may include one or more materials selected from among materials provided as examples of the material of the first insulating layer INS1.

The fifth insulating layer INS5 may be provided or disposed and/or formed on the fourth insulating layer INS4. The fifth insulating layer INS5 may be formed as an inorganic insulating layer including inorganic material or an organic insulating layer including organic material. The signal line SL may be provided and/or disposed on the fifth insulating layer INS5.

The passivation layer PSV may be provided or disposed and/or formed on the fifth insulating layer INS5 including the signal line SL. The passivation layer PSV may be an organic insulating layer including organic material and may be partially open to expose at least a portion of the signal line SL. The passivation layer PSV may be formed as an inorganic insulating layer including inorganic material or an organic insulating layer including organic material. The inorganic insulating layer may include, for example, at least one of metal oxides such as silicon oxide ($SiO_x$), silicon nitride ($SiN_x$), silicon oxynitride ($SiO_xN_y$), and aluminum oxide ($AlO_x$). The organic insulating layer may include, for example, at least one of polyacrylate resin, epoxy resin, phenolic resin, polyamide resin, polyimide rein, unsaturated polyester resin, poly-phenylen ether resin, poly-phenylene sulfide resin, and benzocyclobutene resin.

The signal line SL may be a fan-out line electrically connected to the driver DRP through the connector CM to transmit a signal (or a voltage) to the pixels PXL disposed in the display area DD_DA of the display device DD (or the display area DA of the substrate SUB). The signal line SL may be the signal line SL described with reference to FIG. 5A. The signal line SL may be provided or disposed and/or formed on any one of an insulating layer of the first to fifth insulating layers INS1, INS2, INS3, INS4, and INS5. For example, the signal line SL may be provided or disposed and/or formed on the fifth insulating layer INS5, but the disclosure is not limited thereto.

The pad electrode PD may be provided or disposed and/or formed on the passivation layer PSV and electrically connected with the signal line SL that is exposed to the outside. The pad electrode PD may be an intermediate medium that electrically connects the signal line SL with the driver DRP. A side of the pad electrode PD may contact the connector CM disposed in the contact hole CH passing through the cushion layer CSL, and the other side of the pad electrode PD may contact the signal line SL. The connector CM and the signal line SL may be electrically connected to each other through the pad electrode PD in the non-display area DD_NDA of the display device DD. Therefore, the display panel DPP and the driver DRP may be electrically connected to each other in the non-display area DD_NDA.

In an embodiment, the pad electrode PD may be omitted. The signal line SL may contact or directly contact the connector CM and be electrically and/or physically connected with the connector CM.

The cushion layer CSL may be provided or disposed and/or formed on the pad electrode PD and the passivation layer PSV. The cushion layer CSL may include a contact hole CH which exposes a portion of the pad electrode PD. The contact hole CH may be formed in the non-display area DD-NDA. A connector CM may be provided or disposed in the contact hole CH. The connector CM may be a conductive adhesive component.

As described in the foregoing embodiment, the driver DRP disposed on the display panel DPP may be electrically connected with the display panel DPP through the contact hole CH of the cushion layer CSL disposed in the non-display area DD_NDA. However, the disclosure is not limited thereto. In an embodiment, the driver DRP disposed on the display panel DPP may be electrically connected with the display panel DPP through the contact hole CH that is formed in the display area DD_DA.

Figure 6:
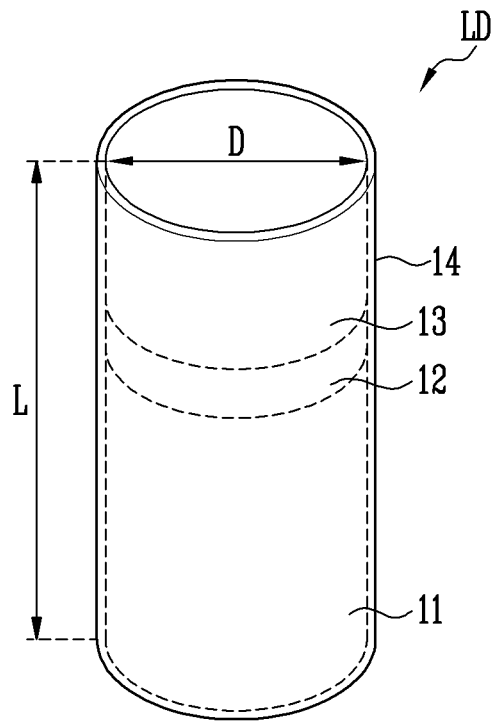
Figure 7:
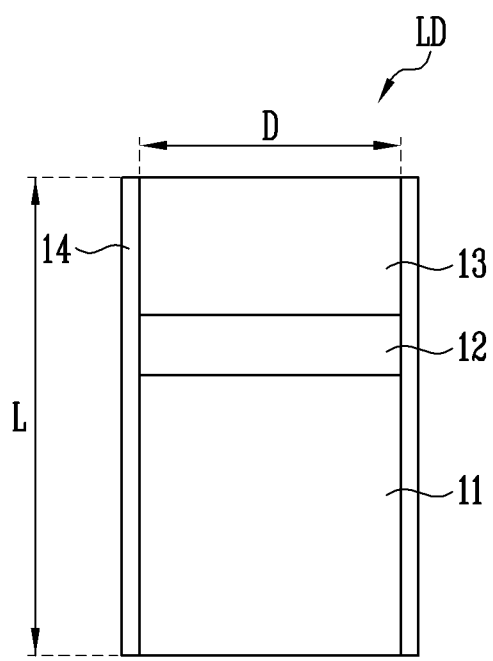
FIG. 7 is a sectional view illustrating the light emitting element of FIG. 6.

FIG. 6 is a perspective diagram schematically illustrating a light emitting element in accordance with an embodiment, and FIG. 7 is a schematic sectional diagram of the light emitting element of FIG. 6.

In an embodiment, the type and/or shape of the light emitting element is not limited to that of the embodiment illustrated in FIGS. 6 and 7.

Referring to FIGS. 6 and 7, the light emitting element LD may include a first semiconductor layer 11, a second semiconductor layer 13, and an active layer 12 interposed between the first and second semiconductor layers 11 and 13. For example, the light emitting element LD may be formed as a light emitting stack formed by successively stacking the first conductive semiconductor layer 11, the active layer 12, and the second conductive semiconductor layer 13.

The light emitting element LD may be formed in a shape extending in a direction. If the direction in which the light emitting element LD extends is defined as a longitudinal direction, the light emitting element LD may have a first end (or a lower end) and a second end (or an upper end) in the longitudinal direction. One of the first and second semiconductor layers 11 and 13 may be disposed on the first end (or the lower end) of the light emitting element LD. The other of the first and second semiconductor layers 11 and 13 may be disposed on the second end (or the upper end) of the light emitting element LD. For example, the first semiconductor layer 11 may be disposed on the first end (or the lower end) of the light emitting element LD, and the second semiconductor layer 13 may be disposed on the second end (or the upper end) of the light emitting element LD.

The light emitting element LD may have various shapes. For example, the light emitting element LD may have a substantially rod-like shape, a substantially bar-like shape, or a substantially pillar-like or substantially column-like shape which may be long in the longitudinal direction (for example, having an aspect ratio greater than one). However, the disclosure is not limited thereto. In an embodiment, the light emitting element LD may have a substantially rod-like shape, a substantially bar-like shape, or a substantially pillar-like or substantially column-like shape which may be short in the longitudinal direction (for example, having an aspect ratio less than one). In an embodiment, the light emitting element LD may have a substantially rod-like shape, a substantially bar-like shape, or a substantially pillar-like or substantially column-like shape in which the length L thereof and the diameter D thereof may be the same as each other.

In an embodiment, the length L of the light emitting element LD in the longitudinal direction may be greater than the diameter D thereof (or a width of a cross-section thereof). The light emitting element LD may include a light emitting diode (LED) fabricated to have a subminiature or an ultrasmall size, e.g., a diameter D and/or a length L to a degree of microscale to nanoscale.

In case that the light emitting element L is long in the longitudinal direction, the diameter D of the light emitting element LD may approximately range from about 0.5 μm to about 6 μm, and the length L thereof may approximately range from about 1 μm to about 10 μm. However, the diameter D and the length L of the light emitting element LD are not limited thereto. The size of the light emitting element LD may be changed to meet conditions (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which may include a semiconductor material of InAlGaN, GaN, AlGaN, InGaN, AlN, and InN and is doped with a first conductive dopant (or an n-type dopant) such as Si, Ge, Sn, or Te. However, the material of the first semiconductor layer 11 is not limited to this, and the first semiconductor layer 11 may be formed of various other materials. In an embodiment, the first semiconductor layer 11 may include gallium nitride (GaN) semiconductor material doped with a first conductive dopant (or an n-type dopant). The first semiconductor layer 11 may include an upper surface contacting the active layer 12 and a lower surface exposed to the outside in the longitudinal direction of the light emitting element LD. The lower surface of the first semiconductor layer 11 may correspond to the first end (or the lower end) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically and repeatedly stacking a barrier layer (not shown), a stain reinforcing layer, and a well layer which are provided as a unit. The stain reinforcing layer may have a lattice constant less than that of the barrier layer so that strain, e.g., compressive strain, to be applied to the well layer can be further reinforced. However, the structure of the active layer 12 is not limited to that of the foregoing embodiment.

The active layer 12 may emit light having a wavelength ranging from about 400 nm to about 900 nm and use a double hetero structure. In an embodiment, a clad layer (not illustrated) doped with a conductive dopant may be formed on an upper and/or lower portion of the active layer 12 in the longitudinal direction of the light emitting element LD. For example, the cladding layer may be formed as an AlGaN layer or an InAlGaN layer. In an embodiment, a material such as AlGaN or InAlGaN may be used to form the active layer 12, and various other materials may form the active layer 12. The active layer 12 may include a first surface contacting the first semiconductor layer 11 and a second surface contacting the second semiconductor layer 13.

If an electric field having a voltage or more is applied to the opposite ends of the light emitting element LD, the light emitting element LD may emit light by coupling of electron-hole pairs in the active layer 12. Since light emission of the light emitting element LD can be controlled by using the foregoing principle, the light emitting element LD may be used as a light source (a light emitting source) of various light emitting devices as well as a pixel of the display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which may include a semiconductor material of InAlGaN, GaN, AlGaN, InGaN, AlN, and InN and is doped with a second conductive dopant (or a p-type dopant) such as Mg, Zn, Ca, Sr, or Ba. However, the material for forming the second semiconductor layer 13 is not limited to this, and the second semiconductor layer 13 may be formed of various other materials. In an embodiment, the second semiconductor layer 13 may include gallium nitride (GaN) semiconductor material doped with a second conductive dopant (or a p-type dopant). The second semiconductor layer 13 may include a lower surface contacting the second surface of the active layer 12 and an upper surface exposed to the outside in the longitudinal direction of the light emitting element LD. Here, the upper surface of the second semiconductor layer 13 may correspond to the second end (or the upper end) of the light emitting element LD.

In an embodiment, the first semiconductor layer 11 and the second semiconductor layer 13 may have different thicknesses in the longitudinal direction of the light emitting element LD. For example, the first semiconductor layer 11 may have a thickness greater than that of the second semiconductor layer 13 in the longitudinal direction of the light emitting element LD. Therefore, the active layer 12 of the light emitting element LD may be disposed closer to an upper surface of the second semiconductor layer 13 than to a lower surface of the first semiconductor layer 11.

Although the first semiconductor layer 11 and the second semiconductor layer 13 each is illustrated as being formed as a single layer, the disclosure is not limited thereto. In an embodiment, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer of which a lattice structure is disposed between other semiconductor layers so that the strain relief layer functions as a buffer layer to reduce a difference in lattice constant. Although the TSBR layer may be formed as a p-type semiconductor layer such as p-GaInP, p-AlInP, or p-AlGaInP, the disclosure is not limited thereto.

In an embodiment, the light emitting element LD may further include an additional electrode (not illustrated, and hereinafter referred to as a "first additional electrode") disposed on the second semiconductor layer 13, as well as including the first semiconductor layer 11, the active layer 12, and the second semiconductor layer 13. In an embodiment, the light emitting element LD may further include another additional electrode (not illustrated, and hereinafter referred to as a "second additional electrode") disposed on the first end of the first semiconductor layer 11.

Each of the first and second additional electrodes may be an ohmic contact electrode, but the disclosure is not limited thereto. In an embodiment, each of the first and second additional electrodes may be a Schottky contact electrode. The first and second additional electrodes may include conductive material. For example, the first and second additional electrodes may include opaque metal such as chrome (Cr), titanium (Ti), aluminum (Al), gold (Au), nickel (Ni), and oxides or alloys thereof, which are used alone or in combination, but the disclosure is not limited thereto. In an embodiment, the first and second additional electrodes may also include transparent conductive oxides such as indium tin oxide (ITO), indium zinc oxide (IZO), zinc oxide (ZnO), indium gallium zinc oxide (IGZO), and indium tin zinc oxide (ITZO).

Materials included in the first and second additional electrodes may be equal to or different from each other. The first and second additional electrodes may be substantially transparent or translucent. Therefore, light generated by the light emitting element LD may pass through the first and second additional electrodes and be emitted outside the light emitting element LD. In an embodiment, in case that light generated by the light emitting element LD is emitted outside the light emitting element LD through a region except the opposite ends of the light emitting element LD rather than passing through the first and second additional electrodes, the first and second additional electrodes may include opaque metal.

In an embodiment, the light emitting element LD may further include an insulating film (or an insulating layer) 14. However, in embodiments, the insulating film 14 may be omitted or may cover or overlap only some or a number of the first semiconductor layer 11, the active layer 12, and the second semiconductor layer 13.

The insulating film 14 may prevent the active layer 12 from short-circuiting because of contact with conductive material except the first and second semiconductor layers 13. Furthermore, the insulating film 14 may minimize a defect in the surface of the light emitting element LD, thus enhancing the life of the light emitting element LD and the emission efficiency thereof. In case that light emitting elements LD are disposed in close contact with each other, the insulating film 14 may prevent undesired short-circuit that may occur between the light emitting elements LD. Whether the insulating film 14 is provided is not limited so long as the active layer 12 may be prevented from short-circuiting with external conductive material.

The insulating film 14 may enclose an overall outer circumferential surface of the emission stack including the first semiconductor layer 11, the active layer 12, and the second semiconductor layer 13.

Although in the foregoing embodiment, the insulating film 14 has been described as enclosing the entirety of the respective outer circumferential surfaces of the first semiconductor layer 11, the active layer 12, the second semiconductor layer 13, the disclosure is not limited thereto. In an embodiment, in case that the light emitting element LD may include the first additional electrode, the insulating film 14 may enclose the entirety of the respective outer circumferential surfaces of the first semiconductor layer 11, the active layer 12, the second semiconductor layer 13, and the first additional electrode. In an embodiment, the insulating film 14 may not enclose the entirety of the outer circumferential surface of the first additional electrode, or may enclose only a portion of the outer circumferential surface of the first additional electrode but may not enclose the remainder of the outer circumferential surface of the first additional electrode. Furthermore, in an embodiment, in case that the first additional electrode is disposed on the second end (or the upper end) of the light emitting element LD and the second additional electrode is disposed on the first end (or the lower end) of the light emitting element LD, the insulating film 14 may expose at least one or an area of each of the first and second additional electrodes.

The insulating film 14 may include transparent insulating material. For example, the insulating film 14 may be include one or more insulating materials selected from the group constituting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the disclosure is not limited thereto, and various materials having insulation may be used as the material of the insulating film 14.

The insulating film 14 may be provided in the form of a single layer or in the form of multiple layers including at least double layers.

In an embodiment, the light emitting element LD may be implemented as a light emitting pattern having a core-shell structure. The first semiconductor layer 11 may be disposed in a core of the light emitting element LD, for example, a central portion of the light emitting element LD. The active layer 12 may be provided or disposed and/or formed to enclose the outer circumferential surface of the first semiconductor layer 11. The second semiconductor layer 13 may be provided or disposed and/or formed to enclose the active layer 12. Furthermore, the light emitting element LD may further include an additional electrode (not illustrated) enclosing at least one or a side of the second semiconductor layer 13. In an embodiment, the light emitting element LD may further include an insulating film 14 which is provided or disposed on the outer circumferential surface of the light emitting pattern having a core-shell structure and may include a transparent insulating material. The light emitting element LD implemented as the light emitting pattern having the core-shell structure may be fabricated by a growth method.

The light emitting element LD may be employed as a light emitting source (or a light source) for various display devices. The light emitting element LD may be fabricated by a surface treatment process. For example, the light emitting element LD may be surface-treated so that, when light emitting elements LD are mixed with a fluidic solution (or a solvent) and supplied to each pixel area (e.g., an emission area of each pixel or an emission area of each sub-pixel), the light emitting diodes LD can be evenly distributed rather than unevenly aggregating in the solution.

A light emitting unit (or a light emitting device) including the light emitting element LD described above may be used in various types of devices including a display device which require a light source. For instance, in case that light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device which require a light source.

Figure 8:
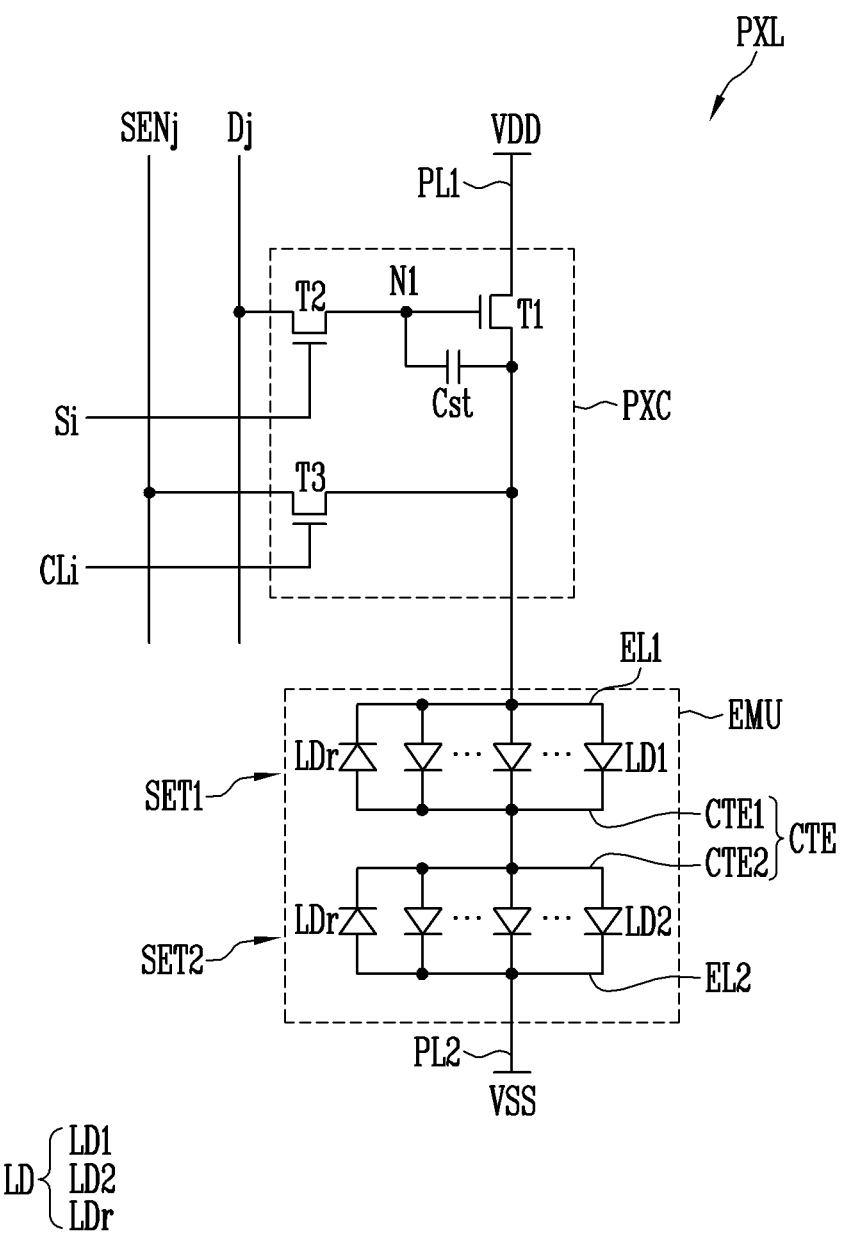
FIG. 8 is an equivalent circuit diagram illustrating an embodiment of electrical connection relationship of components included in each pixel illustrated in FIG. 5A and FIG. 5B.

FIG. 8 is a diagram of an equivalent circuit illustrating an embodiment of electrical connection relationship of components included in each pixel illustrated in FIG. 5A and FIG. 5B.

For example, FIG. 8 illustrates the electrical connection relationship of components included in a pixel PXL which may be employed in an active display device in accordance with an embodiment. However, the types of the components included in the pixel PXL to which embodiments may be applied are not limited thereto.

In FIG. 8, not only the components included in each of the pixels illustrated in FIG. 5A and FIG. 5B but also an area in which the components are provided or disposed are referred to as a "pixel PXL."

Referring to FIGS. 5A to 8, each pixel PXL (hereinafter referred to as a "pixel") may include an emission unit EMU that generates light having a luminance corresponding to a data signal. Furthermore, the pixel PXL may selectively further include a pixel circuit PXC that drives the emission unit EMU.

The pixel circuit PXC may be electrically connected to a scan line Si and a data line Dj of the corresponding pixel PXL. For example, in case that the pixel PXL is disposed in an i-th row (where i is an integer) and a j-th column (where j is an integer) of the display area DA, the pixel circuit PXC of the pixel PXL may be electrically connected to an i-th scan line Si and a j-th data line Dj of the display area DA. Furthermore, the pixel circuit PXC may be electrically connected to an i-th control line CLi and a j-th sensing line SENj of the display area DA.

The pixel circuit PXC may include first to third transistors T1, T2, and T3, and a storage capacitor Cst.

The first transistor T1 (a driving transistor) may include a first terminal electrically connected to a first driving power supply VDD, and a second terminal electrically connected to a first electrode EL1 of each of the light emitting elements LD. A gate electrode of the first transistor T1 may be electrically connected to a first node N1. The first transistor T1 may control the amount of driving current to be supplied to the light emitting elements LD in response to the voltage of the first node N1.

The second transistor T2 (a switching transistor) may include a first terminal electrically connected to the data line Dj, and a second terminal electrically connected to a first node N1. Here, the first terminal and the second terminal of the second transistor T2 may be different from each other, and, for example, if the first terminal is a drain electrode, the second terminal may be a source electrode. A gate electrode of the second transistor T2 may be electrically connected to the i-th scan line Si.

When a scan signal having a voltage capable of turning on the second transistor T2 is supplied to the second transistor T2 from the i-th scan line Si, the second transistor T2 may be turned on to electrically connect the j-th data line Dj to the first node N1. Here, a data signal of a corresponding frame may be supplied to the j-th data line Dj, and thus the data signal may be transmitted to the first node N1. The data signal transmitted to the first node N1 may be charged to the storage capacitor Cst.

The third transistor T3 may be electrically connected between the first transistor T1 and the j-th sensing line SENj. For example, a first terminal of the third transistor T3 may be electrically connected to the first terminal of the first transistor T1 electrically connected to the first electrode ELL A second terminal of the third transistor T3 may be electrically connected to the j-th sensing line SENj. A gate electrode of the third transistor T3 may be electrically connected to the i-th control line CLi. The third transistor T3 may be turned on by a control signal having a gate-on voltage supplied to the i-th control dine CLi during a sensing period, so as to electrically connect the j-th sensing line SENj to the first transistor T1.

The sensing period may be a period in which characteristic information (e.g., a threshold voltage or the like of the first transistor T1) of each of the pixels PXL disposed in the display area DA is extracted.

The storage capacitor Cst may include a first electrode electrically connected to the first driving power supply VDD, and a second electrode electrically connected to the first node N1. The storage capacitor Cst may be charged with a voltage corresponding to a data signal supplied to the first node N1 and maintain the charged voltage until a data signal of a subsequent frame is supplied thereto.

The emission unit EMU may include light emitting elements LD electrically connected between a first power line PL1 to which the voltage of a first driving power supply VDD is applied and a second power line PL2 to which the voltage of a second driving power supply VSS is applied. For example, the emission unit EMU may include a first electrode EL1 (or a "first alignment electrode") electrically connected to the first driving power supply VDD via the pixel circuit PXC and the first power line PL1, a second electrode EL2 (or a "second alignment electrode") electrically connected to the second driving power supply VSS through the second power line PL2, and light emitting elements LD electrically connected in parallel to each other in a same direction between the first and second electrodes EL1 and EL2.

Each of the light emitting elements LD included in the emission unit EMU may include a first end electrically connected to the first driving power supply VDD through the first electrode EL1 and a second end electrically connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than that of a threshold voltage of the light emitting elements LD during an emission period of the pixel PX.

As described above, the light emitting elements LD may form respective valid light sources and may be electrically connected in parallel to each other in a same direction (e.g., in a forward direction) between the first electrode EL1 and the second electrode EL2 to which voltages having different potentials are respectively supplied. The valid light sources may form the emission unit EMU of the pixel PXL.

The light emitting elements LD of the emission unit EMU may emit light having a luminance corresponding to driving current supplied thereto through the pixel circuit PXC. For example, during each frame period, the pixel circuit PXC may supply driving current, corresponding to a grayscale value of corresponding frame data, to the emission unit EMU. The driving current supplied to the emission unit EMU may flow into the respective light emitting elements LD. Therefore, each of the light emitting elements LD may emit light having a luminance corresponding to current applied thereto, so that the emission unit EMU may emit light having a luminance corresponding to the driving current.

In an embodiment, the emission unit EMU may further include at least one invalid light source, e.g., a reverse light emitting element LDr, as well as the light emitting elements LD that form the respective valid light sources. The reverse light emitting element LDr may be electrically connected in parallel to each other between the first and second electrodes EL1 and EL2, along with the light emitting elements LD that form the valid light sources. Here, the reverse light emitting element LDr may be electrically connected between the first and second electrodes EL1 and EL2 in a direction opposite to that of the light emitting elements LD. Even when a driving voltage (e.g., a forward driving voltage) is applied between the first and second electrodes EL1 and EL2, the reverse light emitting element LDr may remain deactivated. Therefore, current substantially does not flow through the reverse light emitting element LDr.

Each emission unit EMU may include at least one serial stage including light emitting elements LD electrically connected in parallel to each other. For example, as illustrated in FIG. 8, the emission unit EMU may have a serial or parallel structure.

The emission unit EMU may include first and second serial stages SET1 and SET2 which are successively and electrically connected between the first and second driving power supplies VDD and VSS. Each of the first and second serial stages SET1 and SET2 may include two electrodes EL1 and CTE1 and CTE2 and EL2 that form an electrode pair of the corresponding serial stage, and light emitting elements LD electrically connected in parallel to each other in a same direction between the two electrodes EL1 and CTE1 and CTE2 and EL2.

The first serial stage SET1 may include a first electrode EL1, a first intermediate electrode CTE1, and at least one first light emitting element LD1 electrically connected between the first electrode EL1 and the first intermediate electrode CTE1. Furthermore, the first serial stage SET1 may include a reverse light emitting element LDr electrically connected between the first electrode EL1 and the first intermediate electrode CTE1 in a direction opposite to that of the first light emitting element LD1.

The second serial stage SET2 may include a second intermediate electrode CTE2, a second electrode EL2, and at least one second light emitting element LD2 electrically connected between the second intermediate electrode CTE2 and the second electrode EL2. Furthermore, the second serial stage SET2 may include a reverse light emitting element LDr electrically connected between the second intermediate electrode CTE2 and the second electrode EL2 in a direction opposite to that of the second light emitting element LD2.

The first intermediate electrode CTE1 of the first serial stage SET1 and the second intermediate electrode CTE2 of the second serial stage SET2 may be integral with and electrically connected to each other. For example, the first intermediate electrode CTE1 and the second intermediate electrode CTE2 may form an intermediate electrode CTE that electrically connects the first serial stage SET1 to the second serial stage SET2 that are successively provided. In case that the first intermediate electrode CTE1 and the second intermediate electrode CTE2 are integral with, the first intermediate electrode CTE1 and the second intermediate electrode CTE2 may be different areas of the intermediate electrode CTE.

In the foregoing embodiment, the first electrode EL1 of the first serial stage SET1 may be an anode electrode of the emission unit EMU of each pixel PXL. The second electrode EL2 of the second serial stage SET2 may be a cathode electrode of the emission unit EMU.

Although FIG. 8 illustrates an embodiment where the first to third transistors T1 to T3 are N-type transistors, the disclosure is not limited thereto. For example, at least one of the first to third transistors T1 to T3 may be changed to a P-type transistor. Furthermore, although FIG. 8 illustrates an embodiment where the emission unit EMU is electrically connected between the pixel circuit PXC and the second driving power supply VSS, the emission unit EMU may be electrically connected between the first driving power supply VDD and the pixel circuit PXC.

The structure of the pixel circuit PXC may be changed in various ways. For example, the pixel circuit PXC may further include at least one transistor element such as a transistor element that initializes the first node N1, and/or a transistor element that controls an emission time of the light emitting elements LD, or other circuit elements such as a boosting capacitor for boosting the voltage of the first node N1.

The structure of the pixel PXL which may be applied to the disclosure is not limited to the embodiment illustrated in FIG. 8, and the pixel PXL may have various structures. For example, each pixel PXL may be provided in a passive light emitting display device or the like within the spirit and the scope of the disclosure. The pixel circuit PXC may be omitted, and the opposite ends of the light emitting elements LD included in the emission unit EMU may be electrically connected or directly and electrically connected to the i-th scan lines Si, the j-th data line Dj, the first power line PL1 to which the first driving power supply VDD is to be applied, the second power line PL2 to which the second driving power supply VSS is to be applied, and/or a control line.

FIGS. 9A to 11 are schematic cross-sectional views of a display panel in accordance with an embodiment. FIG. 12 is a schematic cross-sectional view illustrating a display device in accordance with an embodiment. FIG. 12 is a sectional view of the display device, schematically showing a driver DRP disposed over the display panel of FIG. 9B.

Figure 9A:
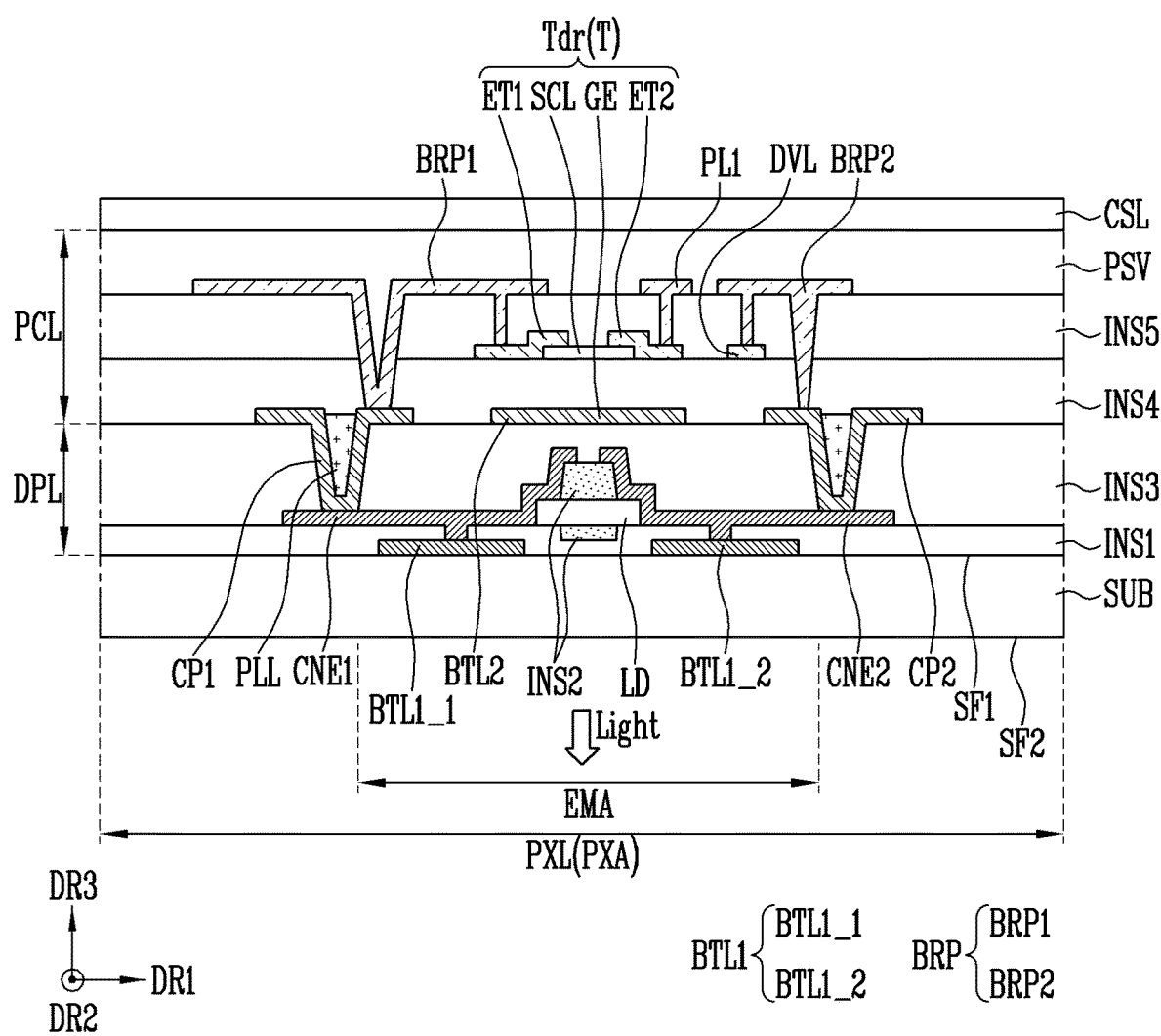
FIGS. 9A to 11 are schematic cross-sectional views of the display panel in accordance with an embodiment.
Figure 9B:
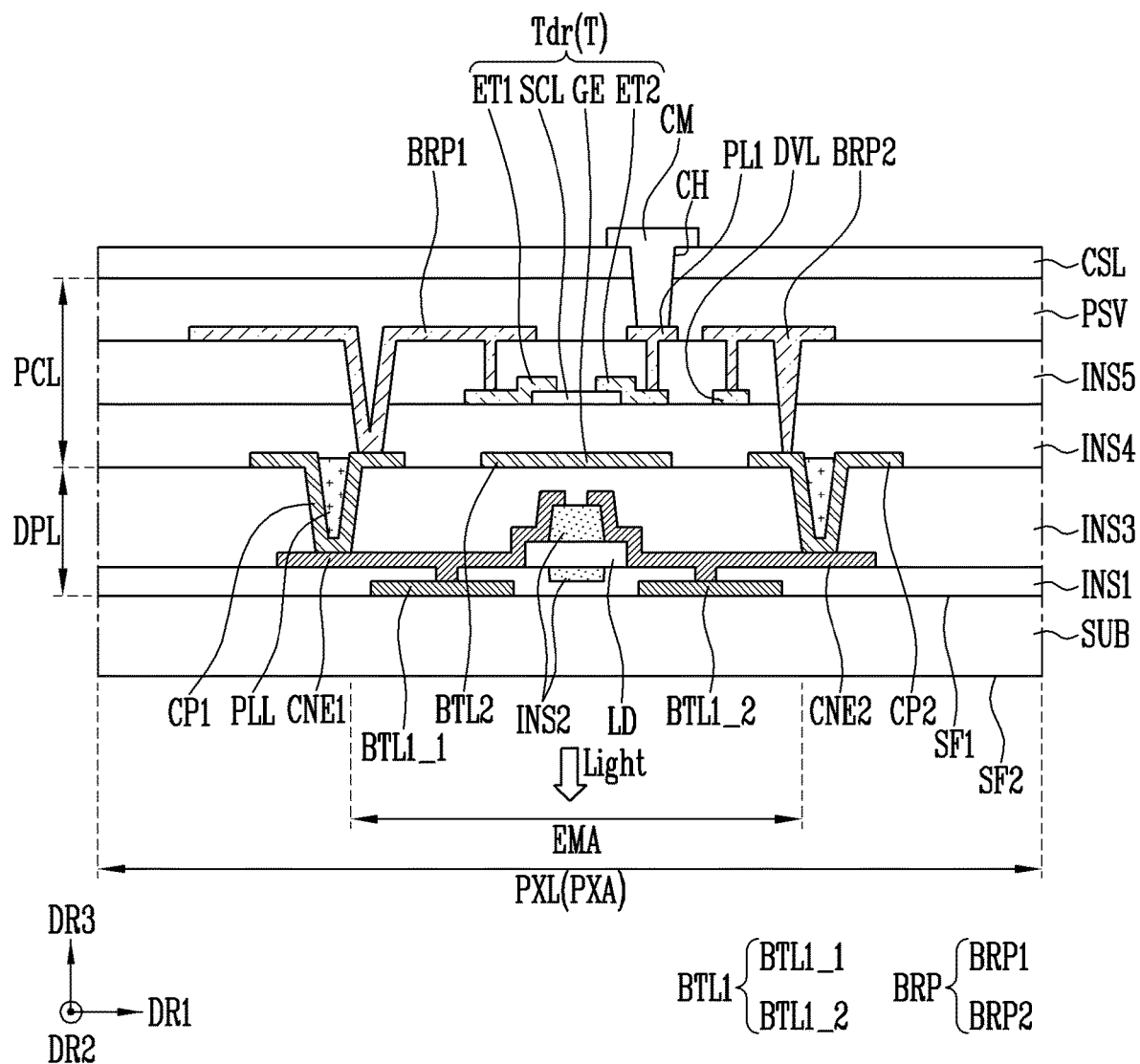
Figure 9C:
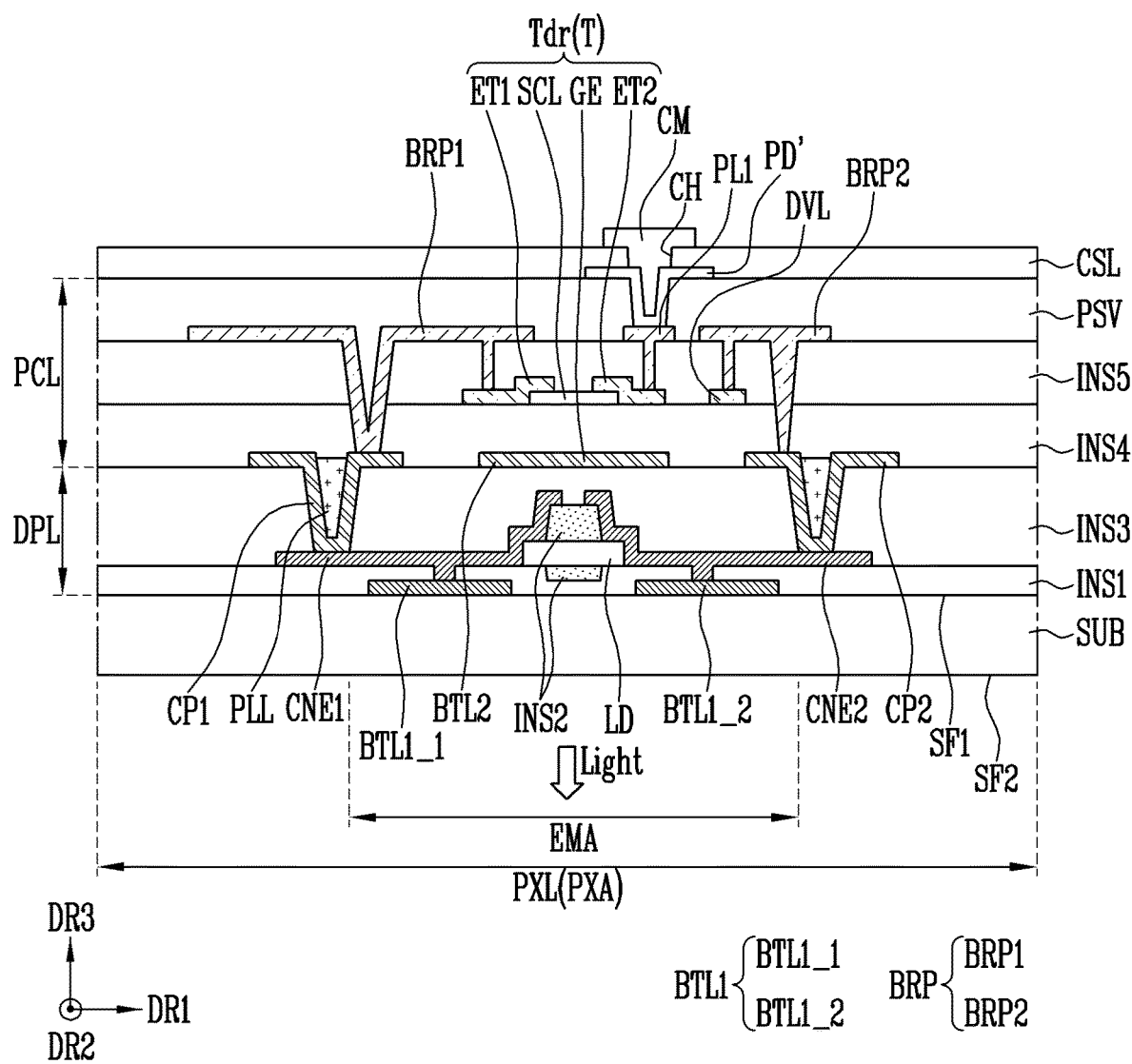
Figure 10:
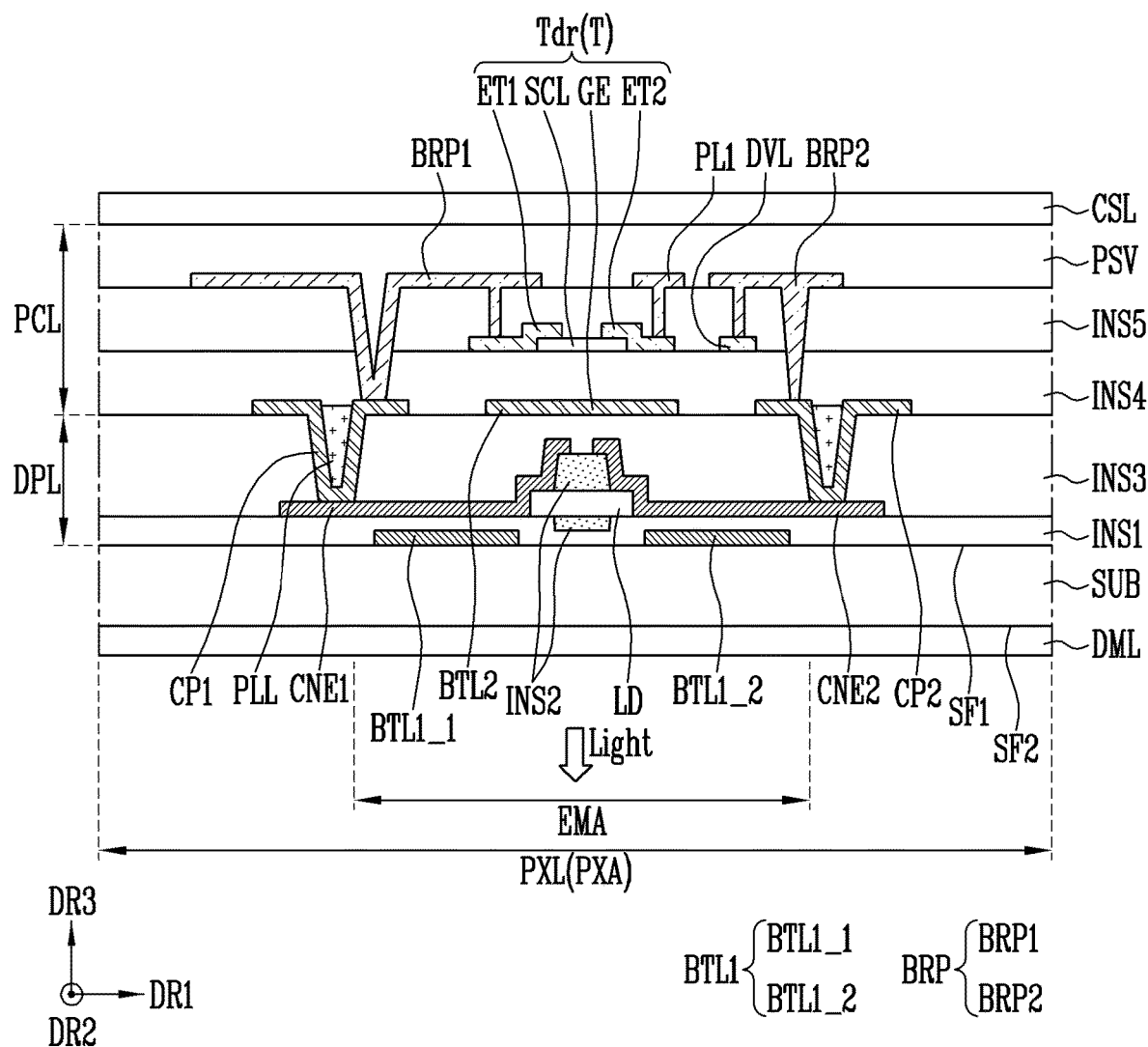
Figure 11:
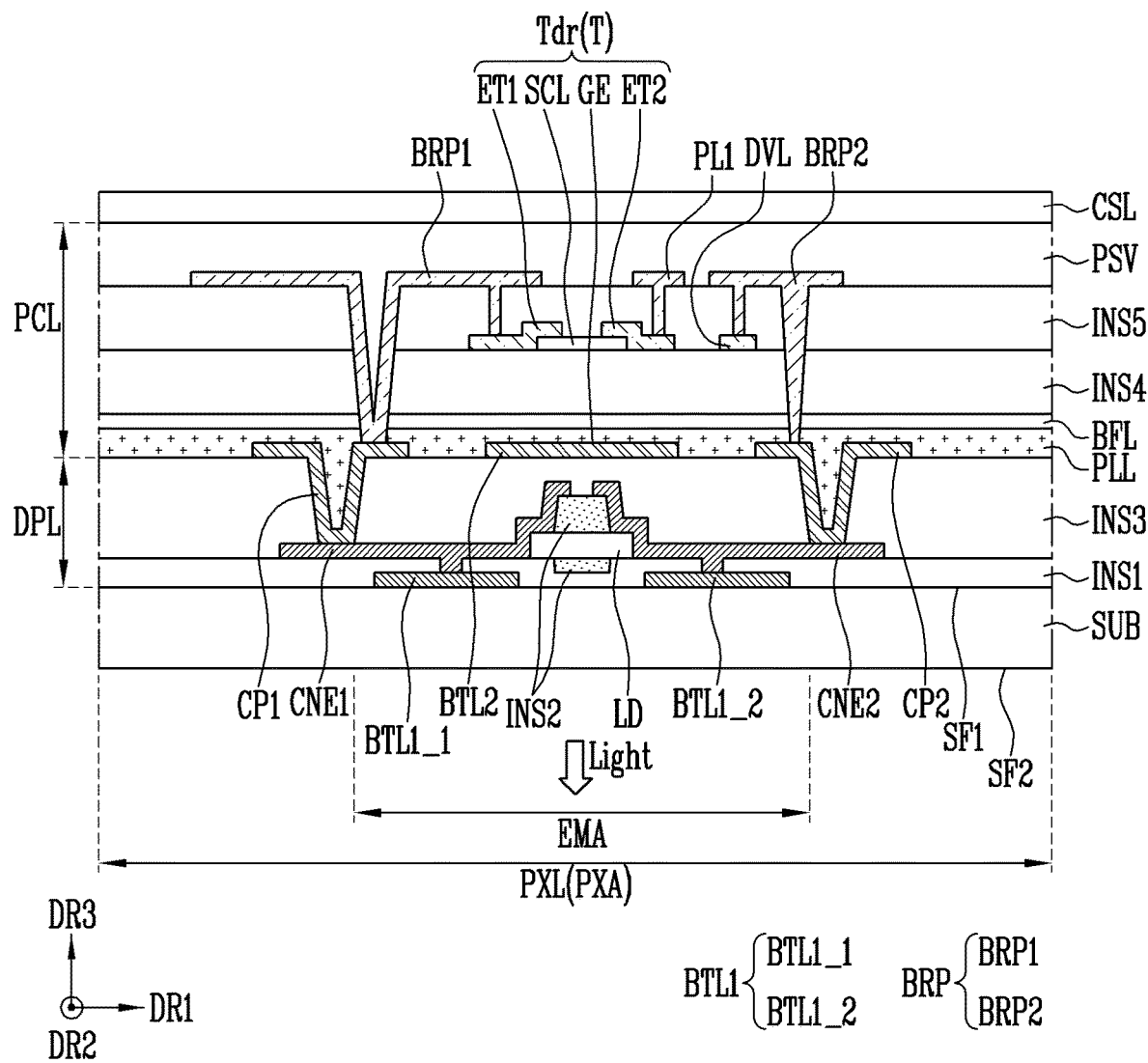
Figure 12:
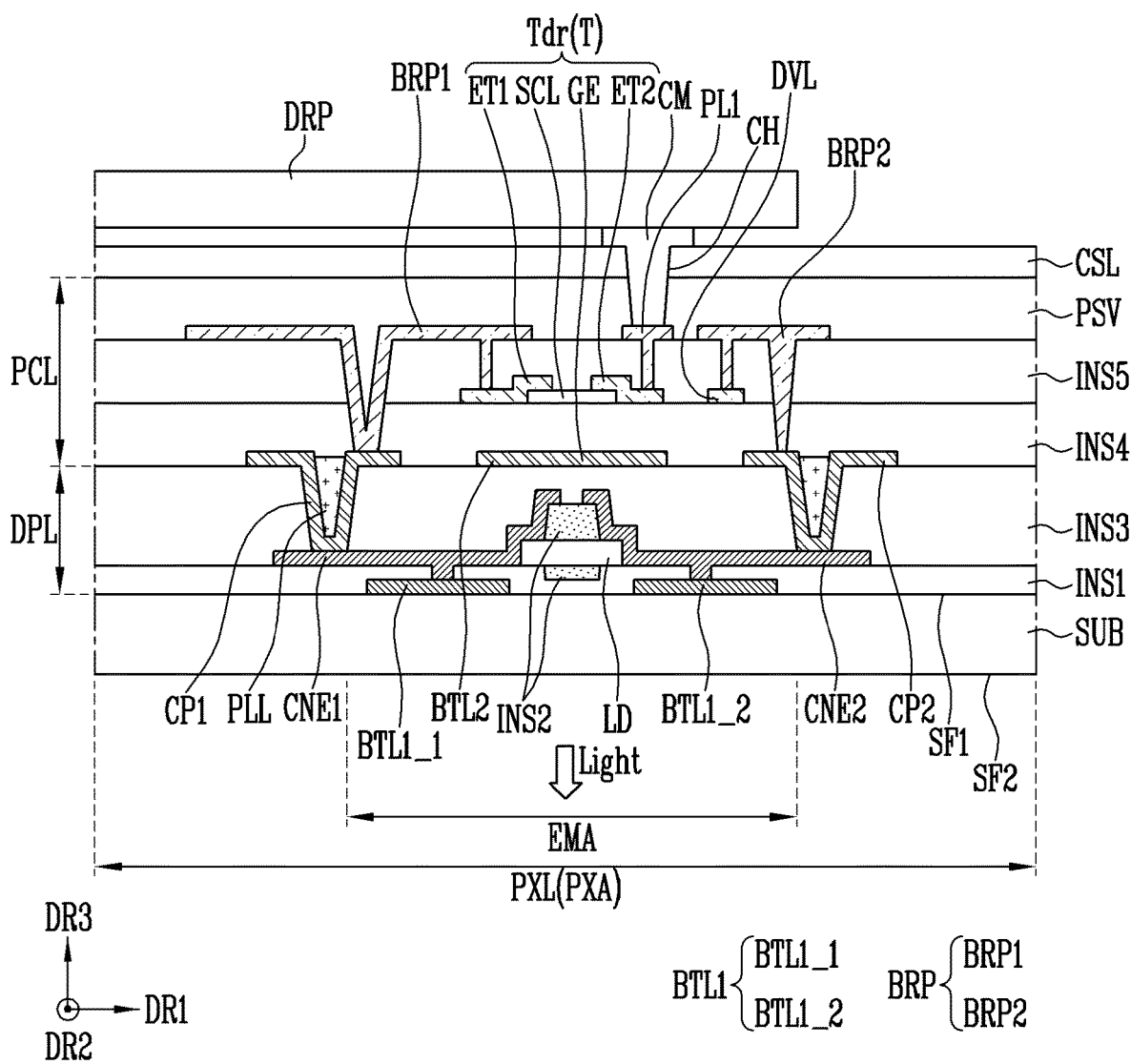
FIG. 12 is a schematic cross-sectional view illustrating the display device in accordance with an embodiment.

FIGS. 9A, 10, and 11 illustrate various embodiments of pixels PXL where a contact hole CH and a connector CM are not disposed in a pixel area PXA. FIGS. 9B, 9C, and 12 illustrate an example where the contact hole CH and the connector CM are disposed in the pixel area PXA, and an individual pixel PXL may be electrically connected or directly and electrically connected to the driver through the contact hole CH and the connector CM.

Although FIGS. 9A to 12 simply illustrate a pixel PXL in which each electrode is formed as a single electrode and each insulating layer is formed as a single insulating layer, the disclosure is not limited thereto.

Although FIGS. 9A to 12 illustrate the case where a light emitting element LD is disposed in the pixel area PXA in which a pixel PXL is provided or disposed, the disclosure is not limited thereto. For example, at least two or more light emitting elements LD may be disposed in the pixel area PXA.

Furthermore, in the description of embodiments, the words "components are provided or disposed and/or formed on the same layer" may mean that the components are formed by the same process, and the words "components are provided or disposed and/or formed on different layers" may mean that the components are formed by different processes.

As illustrated in FIG. 4, the first to third directions DR1, DR2, and DR3 may refer to the directions indicated by the first to third directions DR1, DR2, and DR3.

Referring to FIGS. 4, 5A, 5B, and 9A to 12, the display panel DPP in accordance with an embodiment may include a substrate SUB, at least one pixel PXL, and a cushion layer CSL.

The substrate SUB may include a first surface SF1 and a second surface SF2 that face each other in the third direction DR3 (or in a thickness direction of the substrate SUB). In an embodiment, the first surface SF1 may be an upper surface of the substrate SUB, and the second surface SF2 may be a lower surface of the substrate SUB. In an embodiment, the second surface SF2 may be an image display surface of the display device DD.

Insulating layers and conductive layers may be disposed on the first surface SF1 of the substrate SUB. For example, the insulating layers may include first to fifth insulating layers INS1 to INS5, a passivation layer PSV, or the like, which may be successively stacked on the first surface SF1 of the substrate SUB.

The conductive layers may be provided or disposed and/or formed between the insulating layers. For instance, the conductive layers may include a first conductive layer provided or disposed and/or formed on the substrate SUB, a second conductive layer provided or disposed and/or formed on the first and second insulating layers INS1 and INS2, a third conductive layer provided or disposed and/or formed on the third insulating layer INS3, and a fourth conductive layer provided or disposed on the fourth insulating layer INS4, and a fifth conductive layer provided or disposed on the fifth insulating layer INS5. However, the insulating layers and the conductive layers provided or disposed on the substrate SUB are not limited to those of the foregoing embodiment. In an embodiment, except the insulating layers and the conductive layers, other insulating layers and other conductive layers may be provided or disposed on the first surface SF1 of the substrate SUB.

The pixel PXL may be provided or disposed in a pixel area PXA disposed in the display area DA of the substrate SUB. The pixel area PXA may include an emission area EMA emitting light, and a peripheral area enclosing the emission area EMA. Here, the peripheral area may include a non-emission area from which no light is emitted. The pixel PXL may include a display element layer DPL dispose on the substrate SUB of the pixel area PXA and a pixel circuit layer PCL provided or disposed on the display element layer DPL. The pixel PXL may emit light toward the second surface SF2 of the substrate SUB in the direction of the arrows of FIGS. 9A to 12.

The display element layer DPL may include a first bottom layer BTL1 provided or disposed and/or the first surface SF1 of the substrate SUB, at least one light emitting element LD disposed on the first insulating layer INS1, and first and second contact electrodes CNE1 and CNE2 and a third insulating layer INS3 which are provided or disposed and/or formed on the first and second insulating layers INS1 and INS2.

The first bottom layer BTL1 may include a 1-1-th or first bottom pattern BTL1_1 and a 1-2-th or second bottom pattern BTL1_2 which may be provided or disposed on the first surface SF1 of the substrate SUB and are spaced apart from each other in the first direction DR1. The 1-1-th bottom pattern BTL1_1 and the 1-2-th bottom pattern BTL1_2 may be electrically and/or physically separated from each other on the first surface SF1 of the substrate SUB. For the convenience of illustration, although FIGS. 9A to 12 illustrate that a distance between the 1-1-th bottom pattern BTL1_1 and the 1-2-th bottom pattern BTL1_2 in the first direction DR1 is greater than the length L of the light emitting element LD, the disclosure is not limited thereto. In an embodiment, the distance between the 1-1-th bottom pattern BTL1_1 and the 1-2-th bottom pattern BTL1_2 in the first direction DR1 may be equal to or different from the length L (refer to FIG. 6) of the light emitting element LD.

The 1-1-th and 1-2-th bottom patterns BTL1_1 and BTL1_2 may include transparent conductive material (or transparent conductive substance) to prevent the path of light emitted by the light emitting element LD from being impeded by the 1-1-th or 1-2-th bottom pattern BTL1_1 or BTL1_2 when the light travels in the image display direction (e.g., in a direction toward the second surface SF2 of the substrate SUB) of the display device DD. The transparent conductive material (or the transparent conductive substance) may include conductive oxides such as indium tin oxide (ITO), indium zinc oxide (IZO), zinc oxide (ZnO), indium gallium zinc oxide (IGZO), and indium tin zinc oxide (ITZO) and a conductive polymer such as poly(3,4-ethylenedioxythiophene) (PEDOT). In an embodiment, the 1-1-th bottom pattern BTL1_1 and the 1-2-th bottom pattern BTL1_2 may include translucent (or opaque) metal. For example, the translucent metal may include metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In case that the 1-1-th bottom pattern BTL1_1 and the 1-2-th bottom pattern BTL1_2 include opaque metal, the 1-1-th and 1-2-th bottom patterns BTL1_1 and BTL1_2 may be disposed on the first surface SF1 of the substrate SUB without overlapping the path of light emitted by the light emitting element LD so as to minimize light loss when the light travels toward the second surface SF2 of the substrate SUB.

The materials of the 1-1-th and 1-2-th bottom patterns BTL1_1 and BTL1_2 are not limited to the foregoing materials.

Although each of the 1-1-th and 1-2-th bottom patterns BTL1_1 and BTL1_2 may be provided or disposed and/or formed in a single-layer structure, the disclosure is not limited thereto. In an embodiment, each of the 1-1-th and 1-2-th bottom patterns BTL1_1 and BTL1_2 may be provided or disposed and/or formed in a multilayer structure formed by stacking at least two materials among metals, alloys, conductive oxides, and conductive polymers.

As described above, in case that the 1-1-th bottom pattern BTL1_1 and the 1-2-th bottom pattern BTL1_2 include transparent or translucent material (or transparent or translucent material substance), the first bottom layer BTL1 may be a first conductive layer provided or disposed and/or formed on the substrate SUB.

In an embodiment, the 1-1-th bottom pattern BTL1_1 and the 1-2-th bottom pattern BTL1_2 may be used as alignment electrodes (or alignment lines) for aligning the light emitting element LD by receiving alignment signals (or alignment voltages) from corresponding alignment pads before the light emitting element LD is aligned in the emission area EMA of the pixel PXL. The alignment signals (or the alignment voltages) to be transmitted to the 1-1-th bottom pattern BTL1_1 and the 1-2-th bottom pattern BTL1_2 may be signals having a voltage difference and/or phase difference suitable to align the light emitting element LD between the 1-1-th and 1-2-th bottom patterns BTL1_1 and BTL1_2. At least one alignment signal (or at least one alignment voltage) of the alignment signals (or the alignment voltages) to be respectively transmitted to the 1-1-th and 1-2-th bottom patterns BTL1_1 and BTL1_2 may be an alternating current (AC) signal (or an AC voltage), but the disclosure is not limited thereto.

The first insulating layer INS1 may be provided or disposed and/or formed on the first bottom layer BTL1 including the 1-1-th and 1-2-th bottom patterns BTL1_1 and BTL1_2. In an embodiment, the first insulating layer INS1 may be provided or disposed and/or formed on the 1-1-th and 1-2-th bottom patterns BTL1_1 and BTL1_2. For example, the first insulating layer INS1 may be disposed between the first surface SF1 of the substrate SUB and the first bottom layer BTL1.

The first insulating layer INS1 may be an inorganic insulating layer including inorganic material. For example, the first insulating layer INS1 may include at least one of metal oxides such as silicon nitride ($SiN_x$), silicon oxide ($SiO_x$), silicon oxynitride ($SiO_xN_y$), and aluminum oxide ($AlO_x$). The first insulating layer INS1 and the first insulating layer INS1 described with reference to FIG. 5B may have a same configuration.

The first insulating layer INS1 may be provided or disposed and/or formed on the first surface SF1 of the substrate SUB to cover or overlap the overall surfaces of the 1-1-th and 1-2-th bottom patterns BTL1_1 and BTL1_2. After the light emitting element LD is supplied (fed) onto and aligned on the first insulating layer INS1, the first insulating layer INS1 may be partially opened to expose an area of each of the 1-1-th and 1-2-th bottom patterns BTL1_1 and BTL1_2. In an embodiment, the first insulating layer INS1 may be patterned in the form of an individual pattern which is sectionally disposed under or below the light emitting element LD after the supply (feed) and alignment of the light emitting element LD. The first insulating layer INS1 may cover or overlap the other areas of the 1-1-th and 1-2-th bottom patterns BTL1_1 and BTL1_2 except the area of each of the 1-1-th and 1-2-th bottom patterns BTL1_1 and BTL1_2. In an embodiment, the first insulating layer INS1 may be omitted. In an embodiment, as illustrated in FIG. 10, the first insulating layer INS1 may completely cover or overlap the 1-1-th and 1-2-th bottom patterns BTL1_1 and BTL1_2 without exposing an area of each of the 1-1-th and 1-2-th bottom patterns BTL1_1 and BTL1_2.

The light emitting element LD may be disposed in the emission area EMA of the pixel PXL in which the first insulating layer INS1 is formed.

The light emitting element LD may be a light emitting diode which is made of material having an inorganic crystal structure and has a subminiature or an ultrasmall size, e.g., a size to a degree of the nanometer scale to the micrometer scale. The light emitting element LD may be a subminiature or an ultrasmall light emitting diode fabricated by an etching method or a growth method.

Although at least two to several tens of light emitting elements LD may be aligned and/or provided or disposed in the emission area EMA of the pixel PXL, the number of light emitting elements LD aligned and/or provided or disposed in the emission area EMA is not limited thereto. In an embodiment, the number of light emitting elements LD aligned and/or provided or disposed in the emission area EMA may be changed in various ways.

The light emitting element LD may emit one of color light and/or white light. In an embodiment, the light emitting element LD may emit blue light having a short-wavelength band, but the disclosure is not limited thereto.

The light emitting element LD may be aligned on the first insulating layer INS1 between the 1-1-th bottom pattern BTL1_1 and the 1-2-th bottom pattern BTL1_2 such that the extension direction of the light emitting element LD (or the longitudinal direction thereof) is parallel to the first direction DR1 in a cross-sectional view. If the first insulating layer INS1 is omitted, the light emitting element LD may be aligned on the substrate SUB between the 1-1-th bottom pattern BTL1_1 and the 1-2-th bottom pattern BTL1_2. The light emitting element LD may be dispersed in a solution and supplied (or fed) to the pixel area PXA (or the emission area EMA) of the pixel PXL.

The light emitting element LD may be supplied (or fed) to the pixel area PXA (or the emission area EMA) of each pixel PXL by an inkjet printing method, a slit coating method, or various other methods. For example, the light emitting element LD may be mixed with a volatile solvent and supplied (or fed) to the pixel area PXA (or the emission area EMA) by an inkjet printing method or a slit coating method. Here, if corresponding alignment signals (or corresponding alignment voltages) are applied to the 1-1-th and 1-2-th bottom patterns BTL1_1 and BTL1_2 provided or disposed in the pixel area PXA, an electric field may be formed between the 1-1-th bottom pattern BTL1_1 and the 1-2-th bottom pattern BTL1_2. Therefore, the light emitting element LD may be aligned between the 1-1-th bottom pattern BTL1_1 and the 1-2-th bottom pattern BTL1_2.

After the alignment of the light emitting element LD, the solvent may be removed by volatilization or other methods. As a result, the light emitting element LD may be aligned and/or provided or disposed in the pixel area PXA (or the emission area EMA) of the pixel PXL.

The second insulating layer INS2 may be provided or disposed and/or formed on the light emitting element LD. The second insulating layer INS2 may be provided or disposed and/or formed on the light emitting element LD to partially cover or overlap the outer circumferential surface (or the surface) of the light emitting element LD such that the opposite ends of the light emitting element LD are exposed to the outside.

The second insulating layer INS2 may be formed of a single layer or multiple layers and include an inorganic insulating layer including at least one inorganic material or an organic insulating layer including at least one organic material. The second insulating layer INS2 may further fix the light emitting element LD. The second insulating layer INS2 may include an inorganic insulating layer that has an advantage in protecting the active layer 12 (refer to FIG. 6) of the light emitting element LD from external oxygen, water, or the like within the spirit and the scope of the disclosure. However, the disclosure is not limited to this. The second insulating layer INS2 may be formed as an organic insulating layer including organic material, depending on design conditions, or the like of the display device DD in which the light emitting element LD is used as a light source.

Since the second insulating layer INS2 is formed on the light emitting element LD after the alignment of the light emitting element LD in the pixel area PXA (or the emission area EMA) of the pixel PXL has been completed, the light emitting element LD may be prevented from being displaced from the aligned position. In case that a gap (or space) is present between the first insulating layer INS1 and the light emitting element LD before the formation of the second insulating layer INS2, the gap may be filled with the second insulating layer INS2 during a process of forming the second insulating layer INS2. Therefore, the second insulating layer INS2 may be formed as an organic insulating layer that has an advantage in filling the gap between the first insulating layer INS1 and the light emitting element LD with the second insulating layer INS2.

The first and second contact electrodes CNE1 and CNE2 may be provided or disposed and/or formed on the first insulating layer INS1 including the light emitting element LD and the second insulating layer INS2.

The first contact electrode CNE1 may be provided or disposed and/or formed on the first insulating layer INS1, one of the opposite ends of the light emitting element LD, and the second insulating layer INS2. The first contact electrode CNE1 may be electrically and/or physically connected to an end of the light emitting element LD that is externally exposed by the second insulating layer INS2. For example, an end of the light emitting element LD may correspond to the second semiconductor layer 13 of the light emitting element LD described with reference to FIGS. 6 and 7.

Furthermore, the first contact electrode CNE1 may be disposed on an area of the 1-1-th bottom pattern BTL1_1 that is not covered or overlapped by the first insulating layer INS1, so that the first contact electrode CNE1 contacts the 1-1-th bottom pattern BTL1_1. The first contact electrode CNE1 may be electrically connected with the 1-1-th bottom pattern BTL1_1 to form a double layer structure for reducing line resistance and minimizing distortion due to a signal delay. However, the disclosure is not limited thereto. In an embodiment, in case that the 1-1-th bottom pattern BTL1_1 is completely covered or overlapped by the first insulating layer INS1, the first contact electrode CNE1 may be separated from the 1-1-th bottom pattern BTL1_1 without being electrically connected with the 1-1-th bottom pattern BTL1_1, and thus may be provided as a separate component from the 1-1-th bottom pattern BTL1_1.

The second contact electrode CNE2 may be provided or disposed and/or formed on the first insulating layer INS1, the other end of the opposite ends of the light emitting element LD, and the second insulating layer INS2. The second contact electrode CNE2 may be electrically and/or physically connected to the other end of the light emitting element LD that is externally exposed by the second insulating layer INS2. For example, the other end of the light emitting element LD may correspond to the first semiconductor layer 11 of the light emitting element LD described with reference to FIGS. 6 and 7.

Furthermore, the second contact electrode CNE2 may be disposed on an area of the 1-2-th bottom pattern BTL1_2 that is not covered or overlapped by the first insulating layer INS1, so that the second contact electrode CNE2 contacts the 1-2-th bottom pattern BTL1_2. The second contact electrode CNE2 may be electrically connected with the 1-2-th bottom pattern BTL1_2 to form a double layer structure for reducing line resistance and minimizing distortion due to a signal delay. However, the disclosure is not limited thereto. In an embodiment, in case that the 1-2-th bottom pattern BTL1_2 is completely covered or overlapped by the first insulating layer INS1, the second contact electrode CNE2 may be separated from the 1-2-th bottom pattern BTL1_2 without being electrically connected with the 1-2-th bottom pattern BTL1_2, and thus may be provided as a separate component from the 1-2-th bottom pattern BTL1_2.

The first and second contact electrodes CNE1 and CNE2 may be formed of various transparent conductive materials to allow light emitted by the light emitting element LD to travel in the image display direction (e.g., toward the second surface SF2 of the substrate SUB) of the display device without loss. For example, the first and second contact electrodes CNE1 and CNE2 may include at least one of various transparent conductive materials (or various transparent conductive substances) including indium tin oxide (ITO), indium zinc oxide (IZO), zinc oxide (ZnO), indium gallium zinc oxide (IGZO), and indium tin zinc oxide (ITZO) and may be substantially transparent or translucent to satisfy a transmittancy (or a transmittance). The materials of the first and second contact electrodes CNE1 and CNE2 are not limited to the above-mentioned materials. In an embodiment, the first and second contact electrodes CNE1 and CNE2 may also be formed of various opaque conductive materials (or various opaque conductive substances). The first and second contact electrodes CNE1 and CNE2 each may be formed as a single layer or multiple layers.

In a cross-sectional view, the first contact electrode CNE1 and the second contact electrode CNE2 may be disposed on the second insulating layer INS2 to be spaced apart from each other in the first direction DR1. The first contact electrode CNE1 may overlap the 1-1-th bottom pattern BTL1_1 with the first insulating layer INS1 interposed therebetween. The second contact electrode CNE2 may overlap the 1-2-th bottom pattern BTL1_2 with the first insulating layer INS1 interposed therebetween. Although FIGS. 9A to 12 illustrate that the 1-1-th bottom pattern BTL1_1 completely overlaps the first contact electrode CNE1 with the first insulating layer INS1 interposed therebetween and the 1-2-th bottom pattern BTL1_2 completely overlaps the second contact electrode CNE2 with the first insulating layer INS1 interposed therebetween, the disclosure is not limited thereto. In an embodiment, the 1-1-th bottom pattern BTL1_1 may partially overlap the first contact electrode CNE1, and the 1-2-th bottom pattern BTL1_2 may partially overlap the second contact electrode CNE2.

The first and second contact electrodes CNE1 and CNE2 may be the second conductive layer provided or disposed and/or formed on the first and second insulating layers INS1 and INS2. The third insulating layer INS3 may be provided or disposed and/or formed on the first and second contact electrodes CNE1 and CNE2.

The third insulating layer INS3 may cover or overlap the first and second contact electrodes CNE1 and CNE2 so as to protect the first and second contact electrodes CNE1 and CNE2 and prevent oxygen, water, or the like from permeating the light emitting element LD. The third insulating layer INS3 may include an inorganic insulating layer including inorganic material or an organic insulating layer including organic material. In an embodiment, the third insulating layer INS3 may include an organic insulating layer including organic material to mitigate a step difference caused by components disposed therebelow. The organic insulating layer may include, for example, at least one of polyacrylate resin, epoxy resin, phenolic resin, polyamide resin, polyimide rein, unsaturated polyester resin, poly-phenylen ether resin, poly-phenylene sulfide resin, and benzocyclobutene resin. The third insulating layer INS3 may be the same as that described with reference to FIG. 5B.

The third insulating layer INS3 may be partially opened to expose an area of each of the first and second contact electrodes CNE1 and CNE2.

The pixel circuit layer PCL will be described below.

The pixel circuit layer PCL may include a first conductive pattern CP1, a second conductive pattern CP2, a second bottom layer BTL2, a planarization layer PLL, a fourth insulating layer INS4, at least one transistor T, a driving voltage line DVL, a fifth insulating layer INS5, a bridge pattern BRP, a first power line PL1, and a passivation layer PSV.

The first conductive pattern CP1 may be electrically connected with the first contact electrode CNE1 exposed by the third insulating layer INS3. The first conductive pattern CP1 may be an intermediate medium that electrically connects some or a number of components of the display element layer DPL, e.g., the first contact electrode CNE1, with some or a number of components of the pixel circuit layer PCL, e.g., the transistor T.

The second conductive pattern CP2 may be electrically connected with the second contact electrode CNE2 exposed by the third insulating layer INS3. The second conductive pattern CP2 may be an intermediate medium that electrically connects some or a number of components of the display element layer DPL, e.g., the second contact electrode CNE2, with some or a number of components of the pixel circuit layer PCL, e.g., the driving voltage line DVL.

In an embodiment, the first conductive pattern CP1 and the second conductive pattern CP2 may be provided or disposed on a same layer, include a same material or similar material, and be formed by a same process. The first conductive pattern CP1 and the second conductive pattern CP2 may be provided or disposed on the third insulating layer INS3 to be spaced apart from each other in the first direction DR1, in a cross-sectional view.

The first and second conductive patterns CP1 and CP2 may function as a light guide component provided or disposed on the third insulating layer INS3 to guide light emitted by the light emitting element LD in the image display direction of the display device (e.g., toward the second surface SF2 of the substrate SUB). To this end, the first and second conductive patterns CP1 and CP2 may be formed of conductive material (or conductive substance) having a reflectivity. The conductive material (or conductive substance) may include opaque metal. For example, the opaque metal may include metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In an embodiment, the first and second conductive patterns CP1 and CP2 may be formed of transparent conductive material (or transparent conductive substance). The transparent conductive material (or the transparent conductive substance) may include conductive oxides such as indium tin oxide (ITO), indium zinc oxide (IZO), zinc oxide (ZnO), indium gallium zinc oxide (IGZO), and indium tin zinc oxide (ITZO) and a conductive polymer such as poly(3,4-ethylenedioxythiophene) (PEDOT). In case that the first and second conductive patterns CP1 and CP2 include transparent conductive material (or transparent conductive substance), an additional conductive layer made of opaque metal may be provided to reflect light emitted by the light emitting element LD in the image display direction of the display device (e.g., toward the second surface SF2 of the substrate SUB or the lower surface of the substrate SUB).

The second bottom layer BTL2 may be provided or disposed and/or formed on the third insulating layer INS3 between the first conductive pattern CP1 and the second conductive pattern CP2.

The second bottom layer BTL2 may be provided or disposed and/or formed on the third insulating layer INS3 to correspond to the emission area EMA of the pixel PXL. For example, the second bottom layer BTL2 may be provided or disposed and/or formed on the third insulating layer INS3 such that the second bottom layer BTL2 overlaps the light emitting element LD in the emission area EMA.

The second bottom layer BTL2 may be a reflective component that reflects light emitted by the light emitting element LD in the image display direction of the display device (e.g., toward the second surface SF2 of the substrate SUB). Furthermore, the second bottom layer BTL2 may function as a light blocking component provided or disposed between the light emitting element LD and the transistor T to block light emitted by the light emitting element LD from traveling toward the transistor T. The second bottom layer BTL2 may function as a gate electrode GE of the transistor T (e.g., a driving transistor Tdr) included in the pixel circuit layer PCL.

The second bottom layer BTL2 may be formed of conductive material (or conductive substance) having a reflectivity. The conductive material (or the conductive substance) may include opaque metal. In an embodiment, the second bottom layer BTL2 and the first and second conductive patterns CP1 and CP2 may be provided or disposed on a same layer, include a same material or similar material, and be formed by a same process.

The second bottom layer BTL2 may be provided or disposed and/or formed on the third insulating layer INS3 to be spaced apart from each of the first and second conductive patterns CP1 and CP2. For example, as illustrated in FIGS. 9A to 12, the second bottom layer BTL2 may be provided or disposed and/or formed on the third insulating layer INS3 to be spaced apart from each of the first and second conductive patterns CP1 and CP2 in the first direction DR1 and overlap the light emitting element LD.

The first conductive pattern CP1, the second bottom layer BTL2, and the second conductive pattern CP2 that are disposed on the third insulating layer INS3 to be spaced apart from each other may be the third conductive layer.

The planarization layer PLL may be provided or disposed and/or formed on the first and second conductive patterns CP1 and CP2.

The planarization layer PLL may mitigate a step difference caused by components provided or disposed therebelow. To this end, the planarization layer PLL may be provided as an organic insulating layer including organic material. The planarization layer PLL and the third insulating layer INS3 may include a same material or similar material or may include one or more materials selected from among materials provided as examples of the material of the third insulating layer INS3.

The planarization layer PLL may be provided or disposed and/or formed in the form of an individual pattern which may be sectionally disposed or including sections disposed only in an area of each of the first and second conductive patterns CP1 and CP2. For example, the planarization layer PLL may be provided or disposed and/or formed on only each of an area of the first conductive pattern CP1 formed on the first contact electrode CNE1 exposed by the third insulating layer INS3 and an area of the second conductive pattern CP2 formed on the second contact electrode CNE2 exposed by the third insulating layer INS3. However, the disclosure is not limited thereto. In an embodiment, the planarization layer PLL may be provided or disposed and/or formed on the third insulating layer INS3 to cover or overlap the overall surfaces of the first conductive pattern CP1, the second conductive pattern CP2, and the second bottom layer BTL2, as illustrated in FIG. 11.

The fourth insulating layer INS4 may be provided or disposed and/or formed on the planarization layer PLL.

The fourth insulating layer INS4 and the fourth insulating layer INS4 described with reference to FIG. 5B may have a same configuration. The fourth insulating layer INS4 may be provided or disposed and/or formed on the first surface SF1 of the substrate SUB and be partially opened to expose an area of each of the first and second conductive patterns CP1 and CP2.

A semiconductor pattern SCL may be provided or disposed and/or formed on the fourth insulating layer INS4.

The semiconductor pattern SCL may be provided or disposed on the second bottom layer BTL2 with the fourth insulating layer INS4 interposed therebetween. The semiconductor pattern SCL may overlap the second bottom layer BTL2. The semiconductor pattern SCL may be a semiconductor pattern formed of polysilicon, amorphous silicon, an oxide semiconductor, or the like within the spirit and the scope of the disclosure. For example, the semiconductor pattern SCL may have a structure formed by successively stacking an active layer formed of amorphous silicon and an ohmic contact layer formed of impure amorphous silicon, but the disclosure is not limited thereto.

A first terminal ET1 and a second terminal ET2 may be formed on the semiconductor pattern SCL.

The first terminal ET1 may be formed on the semiconductor pattern SCL and contact an end of the semiconductor pattern SCL. The first terminal ET1 may partially overlap the second bottom layer BTL2 with the fourth insulating layer INS4 interposed therebetween, in a cross-sectional view. The second terminal ET2 may be formed on the semiconductor pattern SCL, may be spaced apart from the first terminal ET1, and may contact the other end of the semiconductor pattern SCL. The second terminal ET2 may partially overlap the second bottom layer BTL2 with the fourth insulating layer INS4 interposed therebetween, in a cross-sectional view.

Each of the first and second terminals ET1 and ET2 may have a single-layer structure formed of at least one selected from the group consisting of copper (Cu), molybdenum (Mo), tungsten (W), aluminum neodymium (AlNd), titanium (Ti), aluminum (Al), silver (Ag), and an alloy thereof, or may have a double-layer or multilayer structure formed of molybdenum (Mo), titanium (Ti), copper (Cu), aluminum (Al), or silver (Ag) to reduce line resistance.

The semiconductor pattern SCL and the first and second terminals ET1 and ET2 may form a bottom-gate-type transistor T along with the second bottom layer BTL2. Here, the bottom-gate-type transistor T may be a driving transistor Tdr of the pixel PXL. The driving transistor Tdr and the first transistor T1 described with reference to FIG. 8 may have a same configuration. In an embodiment, the first terminal ET1 may be a source electrode of the first transistor T1 described with reference to FIG. 8, and the second terminal ET2 may be a drain electrode of the first transistor T1 described with reference to FIG. 8.

The driving voltage line DVL may be provided or disposed and/or formed on the fourth insulating layer INS4. The driving voltage line DVL and the second power line PL2 described with reference to FIG. 8 may have a same configuration. The driving voltage line DVL and the first and second terminals ET1 and ET2 may be provided or disposed on a same layer, but the disclosure is not limited thereto. In an embodiment, the driving voltage line DVL and one of the conductive layers provided or disposed on the pixel circuit layer PCL may be provided or disposed on a same layer. For example, the location of the driving voltage line DVL in the pixel circuit PCL may be changed in various ways.

Although not directly illustrated in the drawings, the driving voltage line DVL may be electrically connected, through a separate connector, with the driver DRP disposed over the display panel DPP. Therefore, a low-potential driving voltage (e.g., a voltage of the second driving power supply VSS described with reference to FIG. 8) may be applied to the driving voltage line DVL from a power source mounted on the driver DRP. Here, the separate connector may include a pad electrode and an anisotropic conductive film electrically connected to the pad electrode.

The first and second terminals ET1 and ET2 of the driving transistor Tdr and the driving voltage line DVL may be the fourth conductive layer provided or disposed and/or formed on the fourth insulating layer INS4.

The fifth insulating layer INS5 may be provided or disposed and/or formed on the driving transistor Tdr and the driving voltage line DVL.

The fifth insulating layer INS5 may be provided or disposed and/or formed on the driving transistor Tdr and the driving voltage line DVL to protect the driving transistor Tdr and the driving voltage line DVL. The fifth insulating layer INS5 may include an organic insulating layer, an inorganic insulating layer, or an organic insulating layer disposed on an inorganic insulating layer. The fifth insulating layer INS5 may be partially opened to expose an area of each of the first terminal ET1, the second terminal ET2, and the driving voltage line DVL. Furthermore, the fifth insulating layer INS5 may be partially opened in an area thereof corresponding to an area of each of the first and second conductive patterns CP1 and CP2 that is exposed by the fourth insulating layer INS4.

The bridge pattern BRP and the first power line PL1 may be provided or disposed and/or formed on the fifth insulating layer INS5.

The bridge pattern BRP may include a first bride pattern BRP1 and a second bridge pattern BRP2. The first bridge pattern BRP1 and the second bridge pattern BRP2 may be provided or disposed and/or formed on the fifth insulating layer INS5 to be electrically and/or physically spaced apart from each other.

The first bridge pattern BRP1 may be an intermediate medium which electrically connects the driving transistor Tdr with the first conductive pattern CP1. An end of the first bridge pattern BRP1 may be electrically connected with the first terminal ET1 of the driving transistor Tdr that is exposed by the fifth insulating layer INS5, and the other end thereof may be electrically connected with the first conductive pattern CP1 that is exposed by the fourth and fifth insulating layers INS4 and INS5. As described above, as the first conductive pattern CP1 is electrically connected with the first contact electrode CNE1, the first contact electrode CNE1 and the driving transistor Tdr may be electrically connected to each other through the first conductive pattern CP1 and the first bridge pattern BRP1.

The second bridge pattern BRP2 may be an intermediate medium which electrically connects the driving voltage line DVL with the second conductive pattern CP2. An end of the second bridge pattern BRP2 may be electrically connected with the driving voltage line DVL that is exposed by the fifth insulating layer INS5, and the other end thereof may be electrically connected with the second conductive pattern CP2 that is exposed by the fourth and fifth insulating layers INS4 and INS5. As described above, as the second conductive pattern CP2 is electrically connected with the second contact electrode CNE2, the second contact electrode CNE2 and the driving voltage line DVL may be electrically connected to each other through the second conductive pattern CP2 and the second bridge pattern BRP2.

The first power line PL1 may be electrically connected with the second end ET2 of the driving transistor Tdr that is exposed by the fifth insulating layer INS5. The first power line PL1 and the first power line PL1 described with reference to FIG. 8 may have a same configuration.

The bridge pattern BRP and the first power line PL1 may be the fifth conductive layer provided or disposed and/or formed on the fifth insulating layer INS5. The fifth conductive layer and the fourth conductive layer may include a same material or similar material or include one or more materials selected from among materials provided as examples of the material of the fourth conductive layer. Each of the bridge pattern BRP and the first power line PL1 may have a single-layer structure, but the disclosure is not limited thereto. In an embodiment, each of the bridge pattern BRP and the first power line PL1 may have a multilayer structure including at least two or more layers.

The passivation layer PSV may be provided or disposed and/or formed on the overall surfaces of the bridge pattern BRP and the first power line PL1.

The passivation layer PSV may be provided or disposed on the bridge pattern BRP and the first power line PL1 and protect the bridge pattern BRP and the first power line PL1. The passivation layer PSV may include an organic insulating layer, an inorganic insulating layer, or an organic insulating layer disposed on an inorganic insulating layer. The passivation layer PSV and the passivation layer PSV described with reference to FIG. 5B may have a same configuration.

In an embodiment, the passivation layer PSV may be partially opened to expose an area of the first power line PL1. For example, in case that the individual pixel PXL is electrically connected or directly electrically connected with the driver DRP, the passivation layer PSV may be partially opened to expose an area of the first power line PL1, as illustrated in FIGS. 9B, 9C, and 12. The first power line PL1 included in the individual pixel PXL may be exposed and electrically connected or directly electrically connected with the driver DRP through the connector CM. In an embodiment, a pad electrode PD' may be selectively provided or disposed between the connector CM and the first power line PL1. The pad electrode PD' may be provided or disposed and/or formed on the passivation layer PSV. The pad electrode PD' may functions as an intermediate medium that electrically connects the connector CM with the first power line PL1 so that the connector CM and the first power line PL1 can be more reliably connected to each other.

In an embodiment, in case that the individual pixel PXL is electrically connected with the driver DRP through the signal line SL and the pad electrode PD that are disposed in the non-display area NDA of the display panel DPP rather than being electrically connected or directly and electrically connected with the driver DRP, the passivation layer PSV in the pixel area PXA of the individual pixel PXL may cover or overlap the first power line PL1 without exposing the first power line PL1, as illustrated in FIGS. 9A, 10, and 11. The first power line PL1 provided or disposed in the pixel area PXA of the individual pixel PXL may be electrically connected with the corresponding signal line SL and the corresponding pad electrode PD (refer to FIG. 5B) in the non-display area NDA and be electrically connected with the driver DRP disposed on the upper surface of the display panel DRP through the signal line SL, the pad electrode PD, and the connector CM.

The cushion layer CSL may be provided or disposed and/or formed on the passivation layer PSV. The cushion layer CSL may be that described with reference to FIGS. 1 to 5B.

The cushion layer CSL may include at least one contact hole CH. The contact hole CH may pass through the cushion layer CSL.

In case that the individual pixel PXL is electrically connected or directly electrically connected with the driver DRP, the contact hole CH may be disposed in the cushion layer CSL of the pixel area PXA in which the individual pixel PXL is provided or disposed, such that the contact hole CH corresponds to the first power line PL1 exposed by the passivation layer PSV. In an embodiment, in case that the individual pixel PXL is electrically connected with the driver DRP through the signal line SL and the pad electrode PD that are disposed in the non-display area NDA of the display panel DPP rather than being electrically connected or directly and electrically connected with the driver DRP, the contact hole CH may be disposed in the non-display area NDA rather than being disposed in the pixel area PXA in which the individual pixel PXL is provided or disposed.

The connector CM may be provided or disposed in the contact hole CH of the cushion layer CSL.

The connector CM may include a conductive adhesive component and be a component for electrically connecting the driver DRP with a signal line electrically connected to the pixel PXL, e.g., the first power line PL1. In an embodiment, the connector CM may be an anisotropic conductive film, but the disclosure is not limited thereto.

The connector CM may be an intermediate medium for electrically connecting some or a number of components of the display panel DPP with the driver DRP. In case that the individual pixel PXL may be electrically connected or directly and electrically connected with the driver DRP, the connector CM may electrically connect the first power line PL1 of the display panel DPP with the driver DRP disposed over the cushion layer CSL, as shown in FIG. 12. The connector CM may be disposed in the pixel area PXA in which the individual pixel PXL is provided or disposed. In an embodiment, in case that as shown in FIGS. 9A, 10, and 11, the individual pixel PXL is electrically connected with the driver DRP through the signal line SL and the pad electrode PD that are disposed in the non-display area NDA of the display panel DPP rather than being electrically connected or directly and electrically connected with the driver DRP, the connector CM may be electrically connected with the signal lines provided or disposed in the individual pixel PXL, e.g., the first power line PL1, through the signal line SL and the pad electrode PD.

A high-potential driving voltage (e.g., a voltage of the first driving power supply VDD described with reference to FIG. 8) may be applied to the first power line PL1 from a power source mounted on the driver DRP As described above, as the first power line PL1 is electrically connected with the driving transistor Tdr, the high-potential driving voltage applied to the first power line PL1 may be transmitted to the second terminal ET2 of the driving transistor Tdr.

In case that driving current flows from the first power line PL1 to the second power line PL2 via the pixel circuit PXC (refer to FIG. 8), the driving current may flow into the first contact electrode CNE1 of the display element layer DPL through the driving transistor Tdr of the pixel circuit layer PCL. The driving current may flow to the second contact electrode CNE2 via the light emitting element LD that contact or directly contacts (or electrically connected with) the first contact electrode CNE1. Therefore, the light emitting element LD may emit light at a luminance corresponding to distributed current. In an embodiment, the first contact electrode CNE1 may be defined as an anode for electrically connecting the driving transistor Tdr with the light emitting element LD. The second contact electrode CNE2 may be defined as a cathode for electrically connecting the driving voltage line DVL with the light emitting element LD. The first contact electrode CNE1 and the first electrode EL1 described with reference to FIG. 8 may have a same configuration. The second contact electrode CNE2 and the second electrode EL2 described with reference to FIG. 8 may have a same configuration.

As described above, the pixel PXL including the pixel circuit layer PCL and the display element layer DPL that may be successively stacked may be disposed on the first surface SF1 of the substrate SUB, and the driver DRP may be disposed over the pixel PXL. Therefore, the non-display area NDA may be minimized in the second surface SF2 (or the image display surface of the display device DD) of the substrate SUB, so that a wider image may be provided to a user. Furthermore, since the non-display area NDA is minimized in each display device DD, the boundary area between display devices DD may be minimized from being visually recognized when a multi-screen display device TDD (refer to FIG. 1) using display devices DD is implemented. Therefore, an image having an enhanced quality may be displayed.

Furthermore, in accordance with the above-mentioned embodiments, after the pixel PXL is formed on the first surface SF1 of the substrate SUB, and the cushion layer SCL including at least one contact hole CH is formed, the driver DRP and the pixel PXL may be electrically connected to each other through the connector CM. In case that the pixel PXL and the driver DRP are successively provided or disposed on a same surface (e.g., the first surface SF1) of the substrate SUB, the process of fabricating the display device DD may be simplified, compared to that of fabricating the conventional display device in which the pixel PXL is formed on a surface of the substrate SUB, the substrate SUB is turned upside down, a via hole is formed in a rear surface of the substrate SUB by using laser emitting and etching process, the via hole is filled with a conductive filler, and the driver DRP and the pixel PXL are electrically connected to each other.

Furthermore, in the conventional display device, the pixel PXL that is provided or disposed on the surface of the substrate SUB may be damaged by the laser emission and etching process that is performed on the rear surface of the substrate SUB after the substrate SUB is turned upside down. To overcome the above problems, in the disclosure, the pixel PXL and the driver DRP may be successively provided or disposed on the first surface SF1 of the substrate SUB, so that the laser emission and etching process may be omitted. Therefore, in an embodiment, damage to the pixel PXL provided or disposed on the first surface SF1 of the substrate SUB may be minimized, and the reliability may be enhanced.

Furthermore, in accordance with the above-mentioned embodiments, after the display element layer DPL including the light emitting element LD is formed on the first surface SF1 of the substrate SUB, the pixel circuit layer PCL including the transistor T may be formed. Generally, the pixel circuit layer PCL may be formed on a surface of the substrate SUB, and the display element layer DPL may be formed over the pixel circuit layer PCL. Since the light emitting element LD included in the display element layer DPL is fabricated by a metalorganic chemical vapor deposition (MOCVD) method at high temperatures, the transistor T of the pixel circuit layer PCL disposed under or below the light emitting element LD may be affected by the process of fabricating the light emitting element LD, and thus the electrical characteristics of the transistor T may be changed, or the transistor T may malfunction. To overcome the foregoing problem, in accordance with the above-mentioned embodiments, after the display element layer DPL including the light emitting element LD is formed on the first surface SF1 of the substrate SUB, the pixel circuit layer PCL including the transistor T may be formed. Therefore, the foregoing problem may be minimized.

In an embodiment, as illustrated in FIG. 10, a dummy layer DML may be disposed on the second surface SF2 of the substrate SUB.

The dummy layer DML may be provided or disposed and/or formed on the second surface SF2 of the substrate SUB so that components disposed on the first surface SF1 of the substrate SUB may be prevented from being visually recognized by externally incident light. For example, the dummy layer DML may be formed as a polarizing film.

Figure 13:
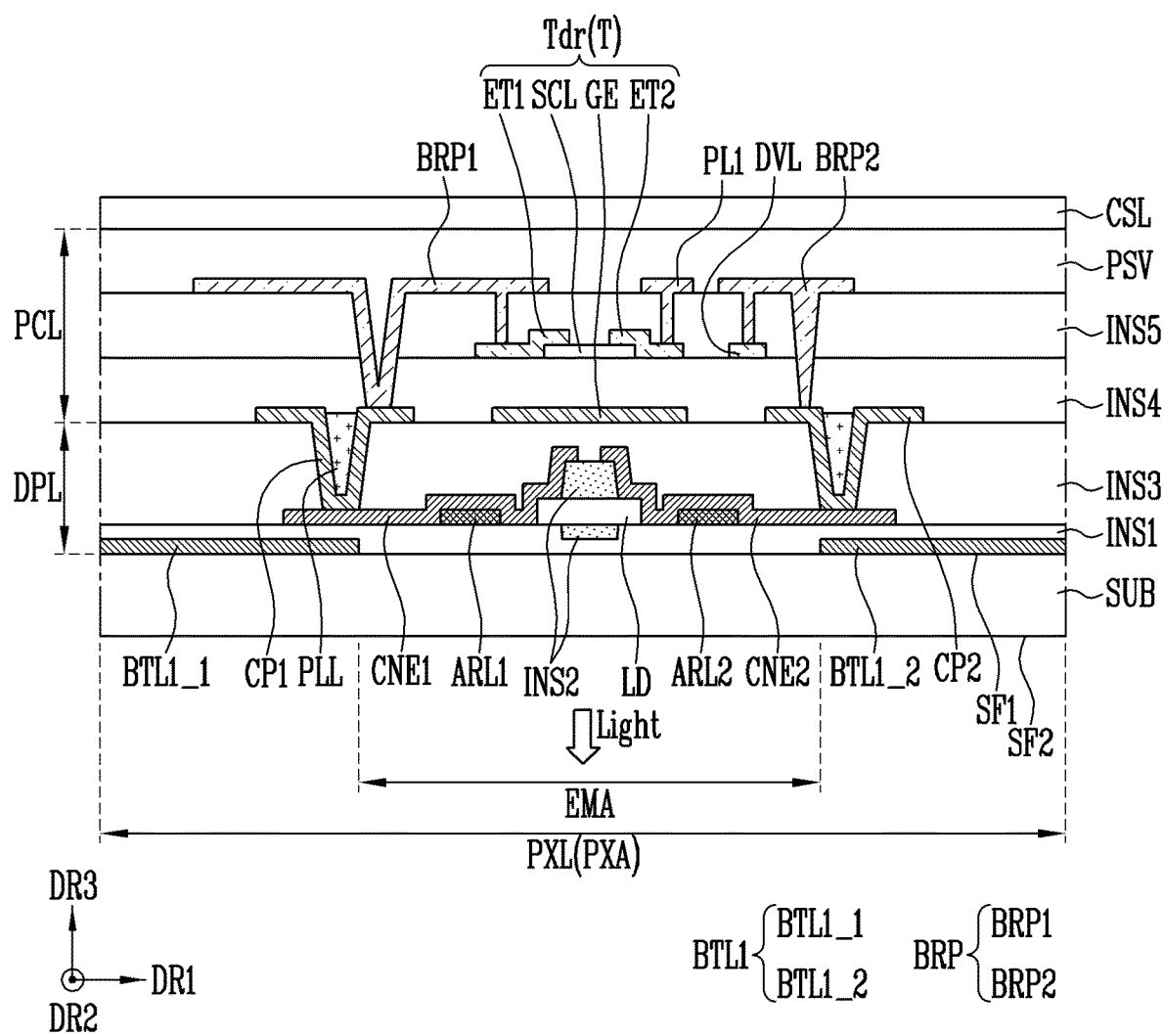
FIGS. 13 and 14 are schematic cross-sectional views of a display panel in accordance with an embodiment.
Figure 14:
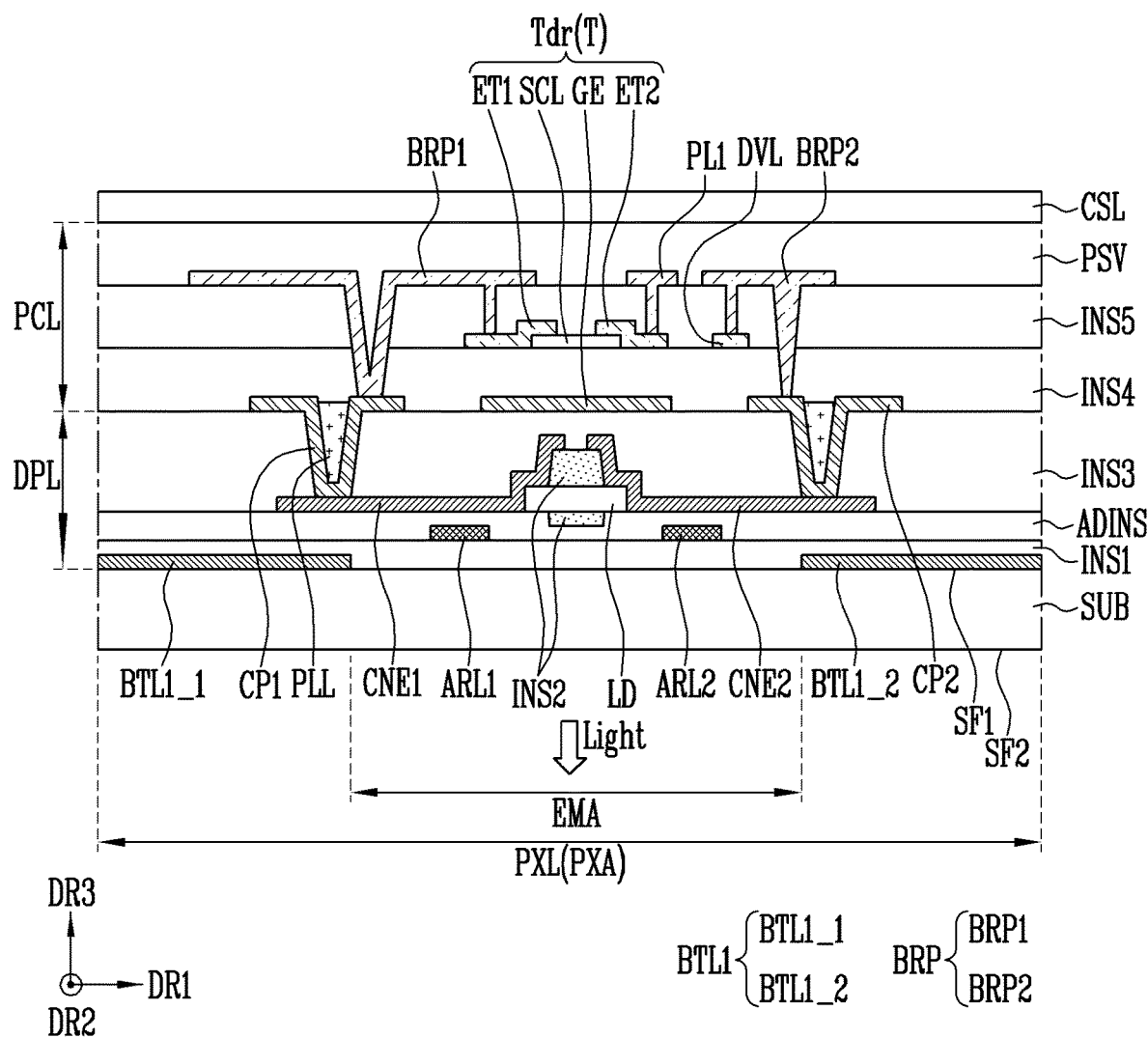

FIGS. 13 and 14 are schematic cross-sectional views of a display panel in accordance with an embodiment.

The display panel illustrated in FIGS. 13 and 14 and the pixel of FIG. 9B may have a substantially equal or similar configuration except that a first electrode ARL1 is provided or disposed between the first insulating layer INS1 and the first contact electrode CNE1 and a second electrode ARL2 is provided or disposed between the first insulating layer INS1 and the second contact electrode CNE2.

Therefore, to avoid repetitive descriptions, the description of the display panel of FIGS. 13 and 14 will be focused on differences from that of the foregoing embodiments. Components which are not separately explained in the following description of the embodiment may be identical to those of the foregoing embodiments. The same reference numeral will be used to designate the same component, and a similar reference numeral will be used to designate a similar component.

Referring to FIGS. 4, 5A, 13, and 14, the display panel DPP in accordance with an embodiment may include a substrate SUB, at least one pixel PXL, a thin-film encapsulation layer TFE, and a cushion layer CSL. Here, the pixel PXL may include a display element layer DPL and a pixel circuit layer PCL that may be successively stacked on the first surface SF1 of the substrate SUB.

The display element layer DPL may include a first bottom layer BTL1, a first insulating layer INS1, first and second electrodes ARL1 and ARL2, a light emitting element LD, a second insulating layer INS2, first and second contact electrodes CNE1 and CNE2, and a third insulating layer INS3.

The first bottom layer BTL1 may include a 1-1-th bottom pattern BTL1_1 and a 1-2-th bottom pattern BTL1_2 which are provided or disposed on the first surface SF1 of the substrate SUB. The 1-1-th bottom pattern BTL1_1 and the 1-2-th bottom pattern BTL1_2 may be disposed on the first surface SF1 of the substrate SUB to be spaced apart from each other in the first direction DR1, in a cross-sectional view.

In an embodiment, the 1-1-th bottom pattern BTL1_1 and the 1-2-th bottom pattern BTL1_2 may be provided or disposed on the first surface SF1 of the substrate SUB without overlapping the emission area EMA of the pixel PXL. The 1-1-th bottom pattern BTL1_1 and the 1-2-th bottom pattern BTL1_2 each may be a light blocking component that absorbs or blocks external light to prevent the components disposed on the first surface SF1 of the substrate SUB from being visually recognized. For example, the 1-1-th bottom pattern BTL1_1 and the 1-2-th bottom pattern BTL1_2 each may be a black matrix.

The 1-1-th bottom pattern BTL1_1 and the 1-2-th bottom pattern BTL1_2 each may include at least one light blocking material and/or light reflecting material. The 1-1-th bottom pattern BTL1_1 and the 1-2-th bottom pattern BTL1_2 may be disposed on the first surface SF1 of the substrate SUB without overlapping the emission area EMA of the pixel PXL so as to minimize loss of light that is emitted by the light emitting element LD and travels toward the second surface SF2 of the substrate SUB.

The first insulating layer INS1 may be provided or disposed and/or formed on the first bottom layer BTL1. In an embodiment, the first insulating layer INS1 may completely cover or overlap the first bottom layer BTL1.

The first electrode ARL1 and the second electrode ARL2 may be provided or disposed and/or formed on the first insulating layer INS1.

The first electrode ARL1 and the second electrode ARL2 may be provided or disposed and/or formed on the first insulating layer INS1 to be spaced apart from each other in the first direction DR1, in a cross-sectional view. The first electrode ARL1 and the second electrode ARL2 may be electrically and/or physically separated from each other on the first insulating layer INS1.

The first electrode ARL1 and the second electrode ARL2 may include transparent conductive material (or transparent conductive substance) to prevent the path of light emitted by the light emitting element LD from being impeded by the first electrode ARL1 and the second electrode ARL2 when the light travels in the image display direction (e.g., toward the second surface SF2 of the substrate SUB) of the display device DD. The transparent conductive material (or the transparent conductive substance) may include conductive oxides such as indium tin oxide (ITO), indium zinc oxide (IZO), zinc oxide (ZnO), indium gallium zinc oxide (IGZO), and indium tin zinc oxide (ITZO) and a conductive polymer such as poly(3,4-ethylenedioxythiophene) (PEDOT). In an embodiment, the first electrode ARL1 and the second electrode ARL2 may include translucent (or opaque) metal.

The first electrode ARL1 and the second electrode ARL2 may be used as alignment electrodes (or alignment lines) for aligning the light emitting element LD by receiving alignment signals (or alignment voltages) from corresponding alignment pads before the light emitting element LD is aligned in the emission area EMA of the pixel PXL. After the light emitting element LD is aligned in the emission area EMA of the pixel PXL, a signal (or a voltage) may be applied to each of the first electrode ARL1 and the second electrode ARL2, or no signal (or no voltage) may be applied thereto.

If corresponding alignment signals (or corresponding alignment voltages) are applied to the first electrode ARL1 and the second electrode ARL2, an electric field may be formed between the first electrode ARL1 and the second electrode ARL2, so that the light emitting element LD may be provided or disposed and/or aligned on the first insulating layer INS1 between the first electrode ARL1 and the second electrode ARL2. In case that the light emitting element LD is aligned on the first insulating layer INS1 between the first electrode ARL1 and the second electrode ARL2, the first electrode ARL1 may be electrically connected to an end of the opposite ends of the light emitting element LD through the first contact electrode CNE1, and the second electrode ARL2 may be electrically connected to the other end of the opposite ends of the light emitting element LD through the second contact electrode CNE2. In the foregoing embodiment, the light emitting element LD is aligned on the first insulating layer INS1 between the first electrode ARL1 and the second electrode ARL2, but the disclosure is not limited thereto. In an embodiment, the light emitting element LD may be aligned on each of the first and second electrodes ARL1 and ARL2 and partially overlap each of the first and second electrodes ARL1 and ARL2. The first electrode ARL1 may contact or directly contact a first end of the light emitting element LD, and the second electrode ARL2 may contact or directly contact a second end of the light emitting element LD.

The first contact electrode CNE1 may be provided or disposed and/or formed on the first electrode ARL1, the first insulating layer INS1, the first end of the light emitting element LD, and the second insulating layer INS2. The first contact electrode CNE1 may be disposed on or directly disposed on the first electrode ARL1 and be electrically and/or physically connected with the first electrode ARL1. Since the first contact electrode CNE1 is disposed on or directly disposed on the first electrode ARL1, the first contact electrode CNE1 may have a double layer structure capable of reducing line resistance and minimizing distortion due to a signal delay. However, the disclosure is not limited thereto, and the first electrode ARL1 and the first contact electrode CNE1 may be electrically and/or physically separate from each other. For example, as illustrated in FIG. 14, in case that an additional insulating layer ADINS is disposed between the first electrode ARL1 and the first contact electrode CNE1 and completely covers or overlaps the first electrode ARL1, the first contact electrode CNE1 may be electrically and/or physically separated from the first electrode ARL1 to thus be provided or disposed as a separate component from the first electrode ARL1.

The second contact electrode CNE2 may be provided or disposed and/or formed on the second electrode ARL2, the first insulating layer INS1, the second end of the light emitting element LD, and the second insulating layer INS2. The second contact electrode CNE2 may be disposed on or directly disposed on the second electrode ARL2 and be electrically and/or physically connected with the second electrode ARL2. Since the second contact electrode CNE2 is disposed on or directly disposed on the second electrode ARL2, the second contact electrode CNE2 may have a double layer structure capable of reducing line resistance and minimizing distortion due to a signal delay. However, the disclosure is not limited thereto, and the second electrode ARL2 and the second contact electrode CNE2 may be electrically and/or physically separate from each other. For example, as illustrated in FIG. 14, in case that an additional insulating layer ADINS is disposed between the second electrode ARL2 and the second contact electrode CNE2 and completely covers or overlaps the second electrode ARL2, the second contact electrode CNE2 may be electrically and/or physically separated from the second electrode ARL2 to thus be provided or disposed as a separate component from the second electrode ARL2.

The third insulating layer INS3 may be provided or disposed and/or formed on the first and second contact electrodes CNE1 and CNE2.

Figure 15A:
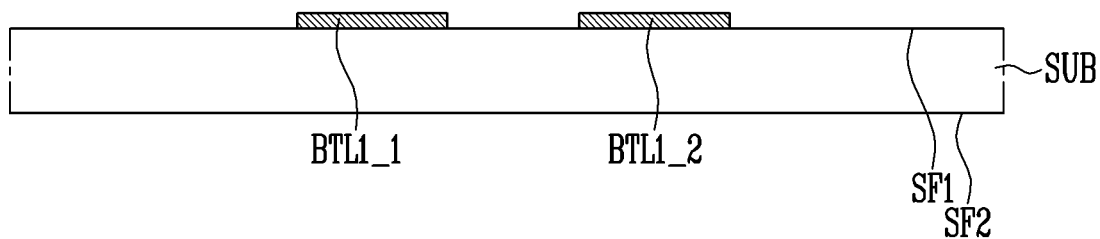
FIGS. 15A to 15N are schematic cross-sectional views illustrating a method of fabricating the display panel of FIG. 9A.
Figure 15B:
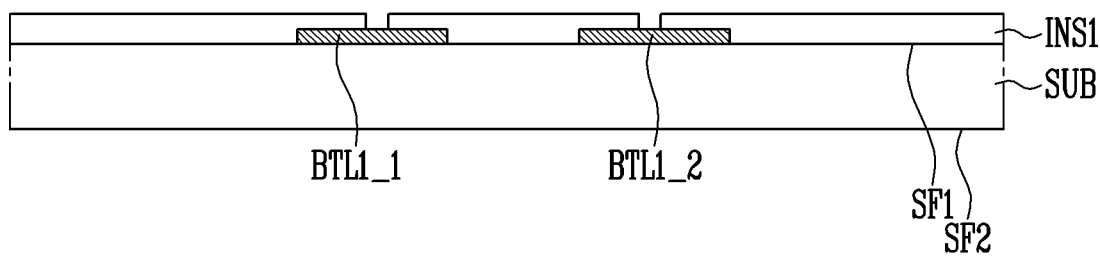
Figure 15C:
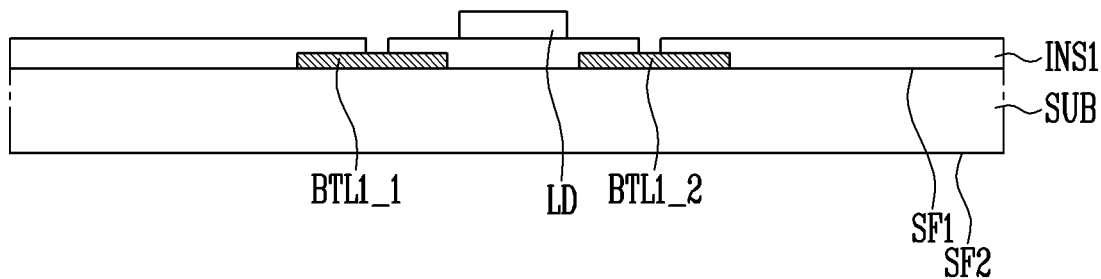
Figure 15C:
Figure 15D:
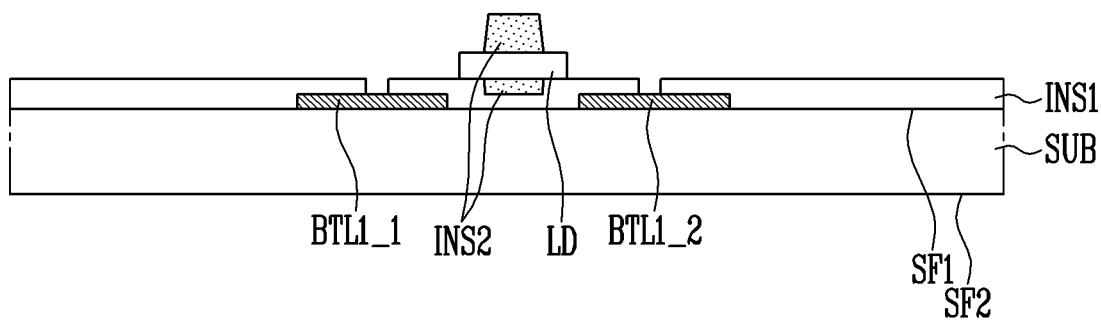
Figure 15D:
Figure 15E:
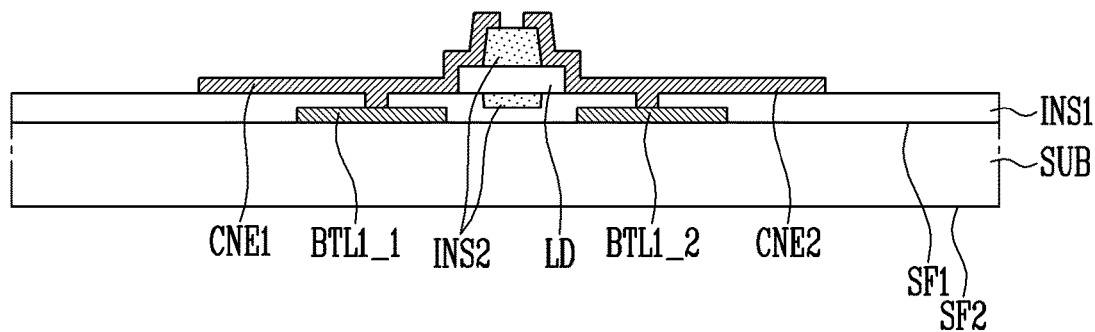
Figure 15E:
Figure 15F:
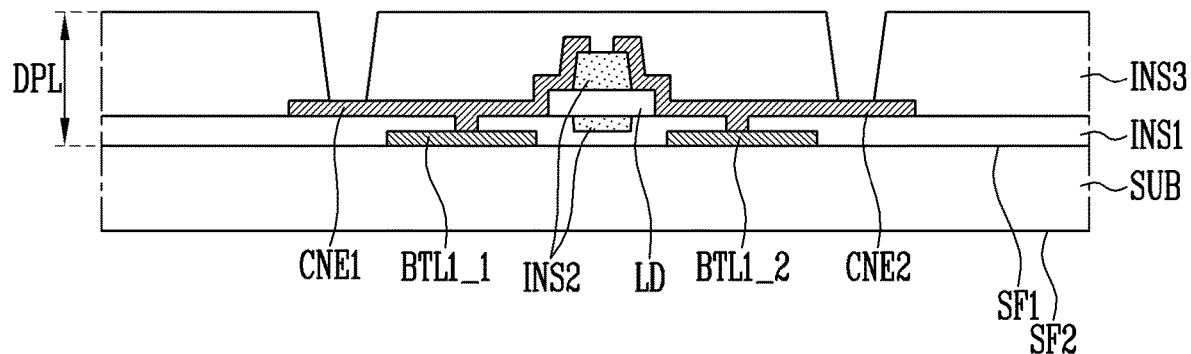
Figure 15F:
Figure 15G:
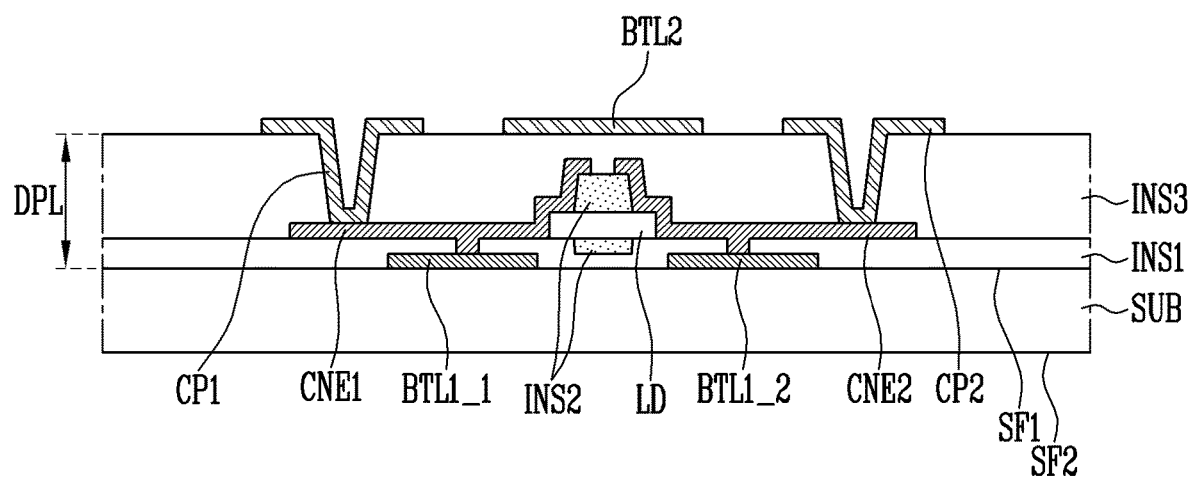
Figure 15G:
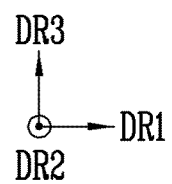
Figure 15H:
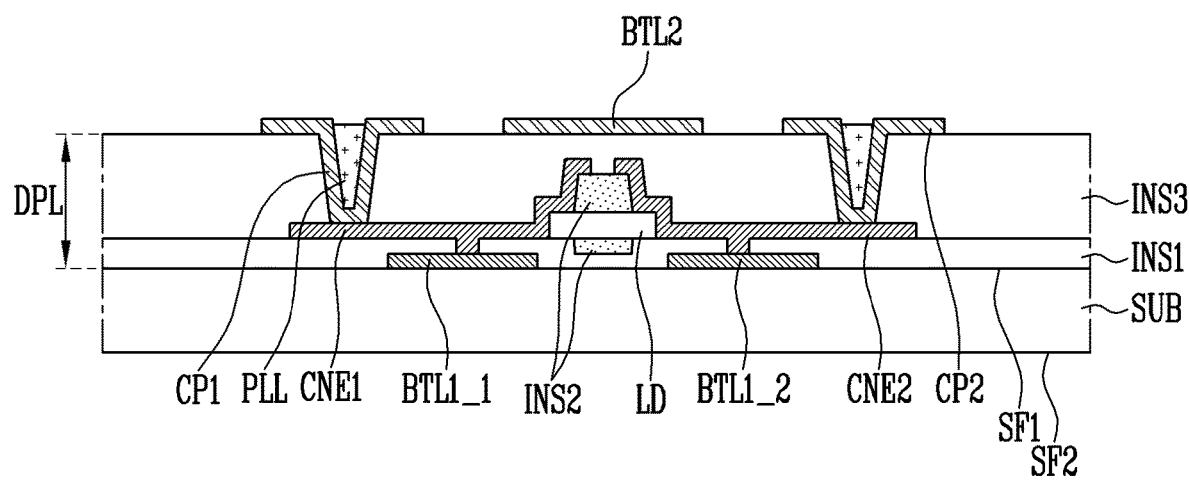
Figure 15H:
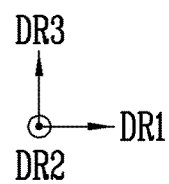
Figure 15I:
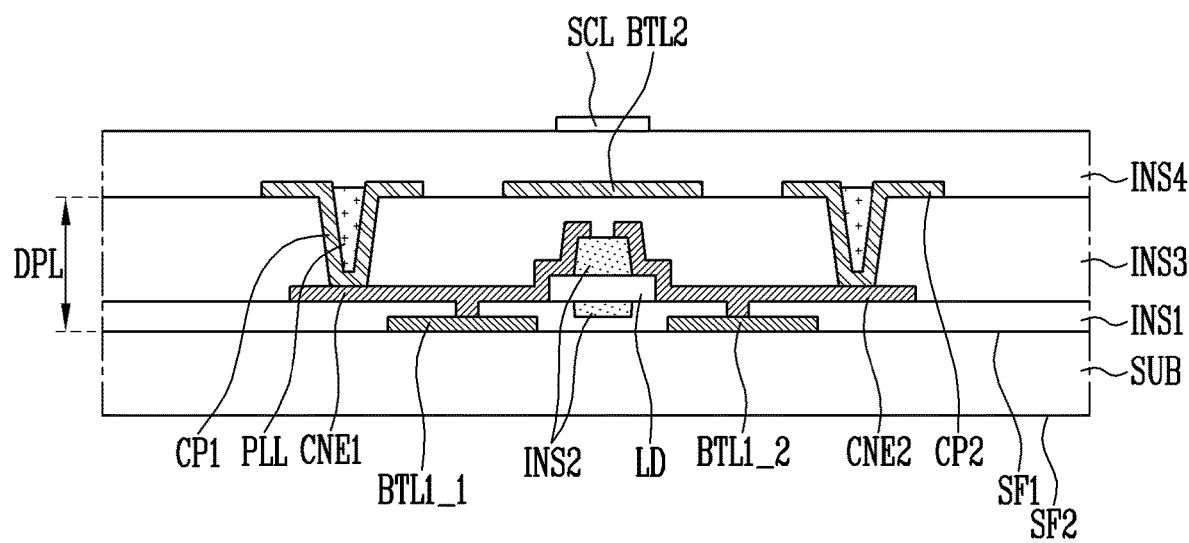
Figure 15I:
Figure 15J:
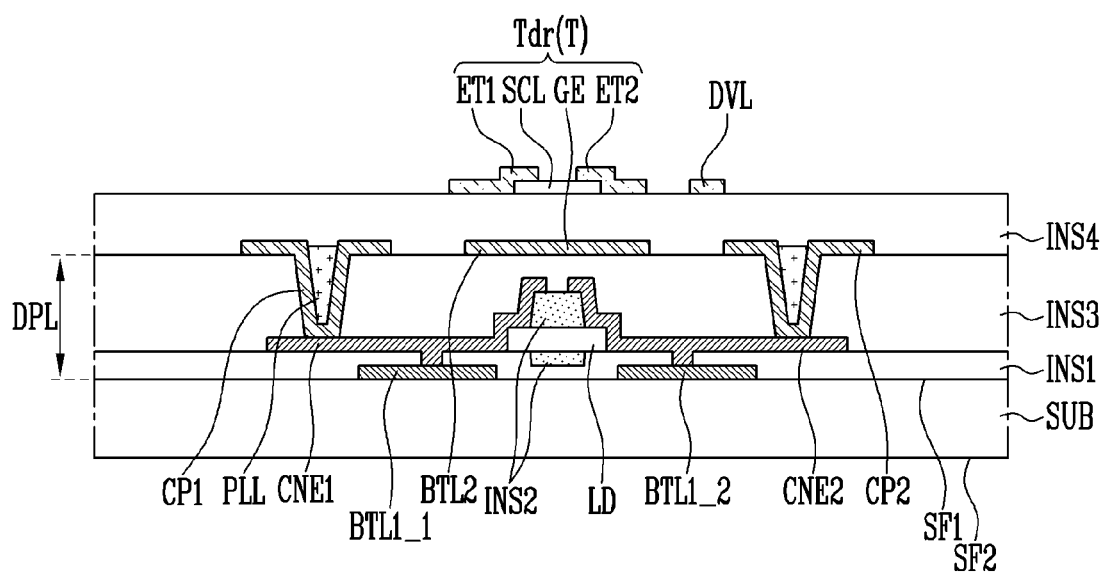
Figure 15K:
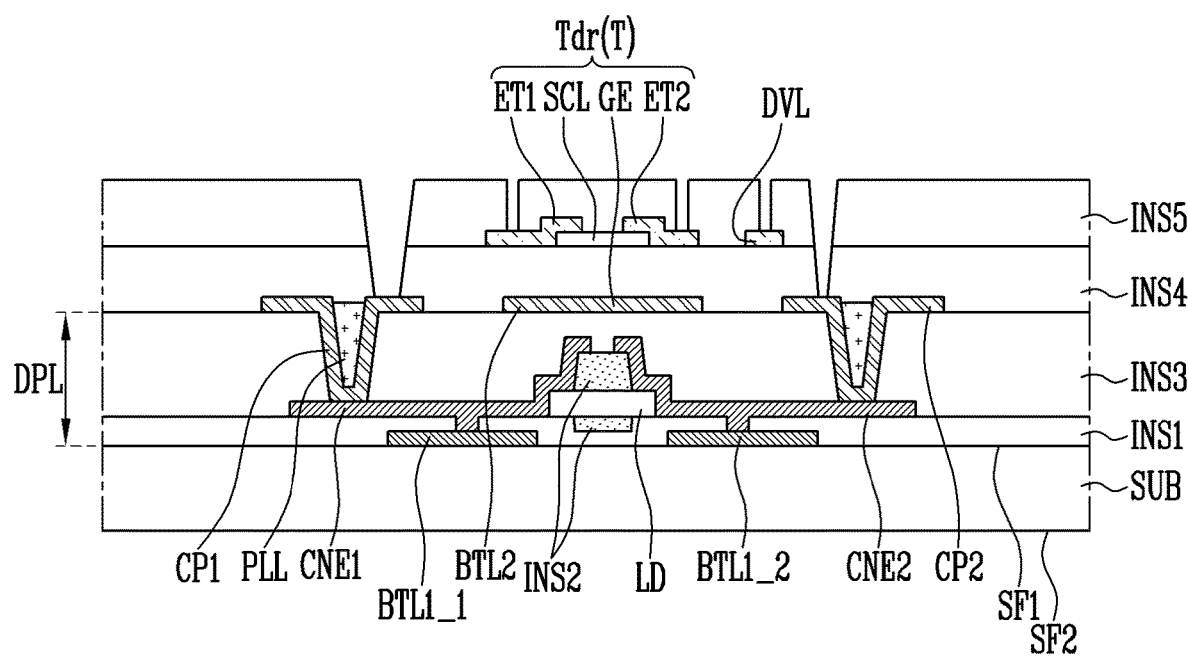
Figure 15K:
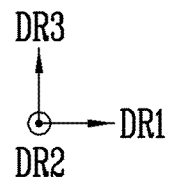
Figure 15L:
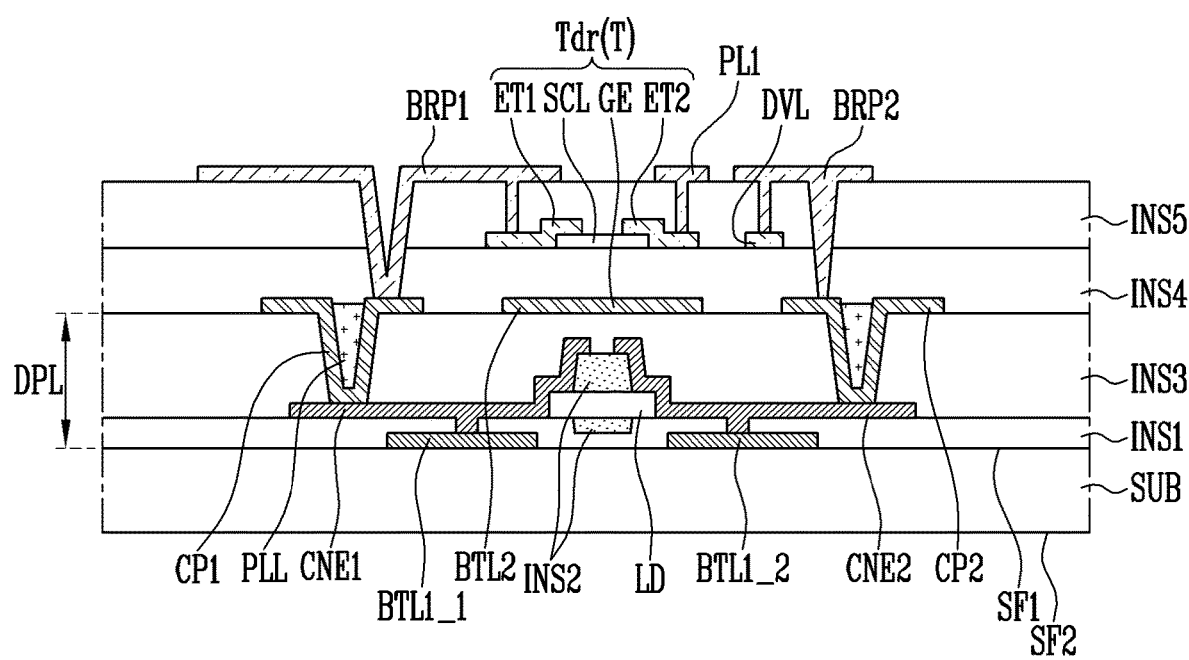
Figure 15M:
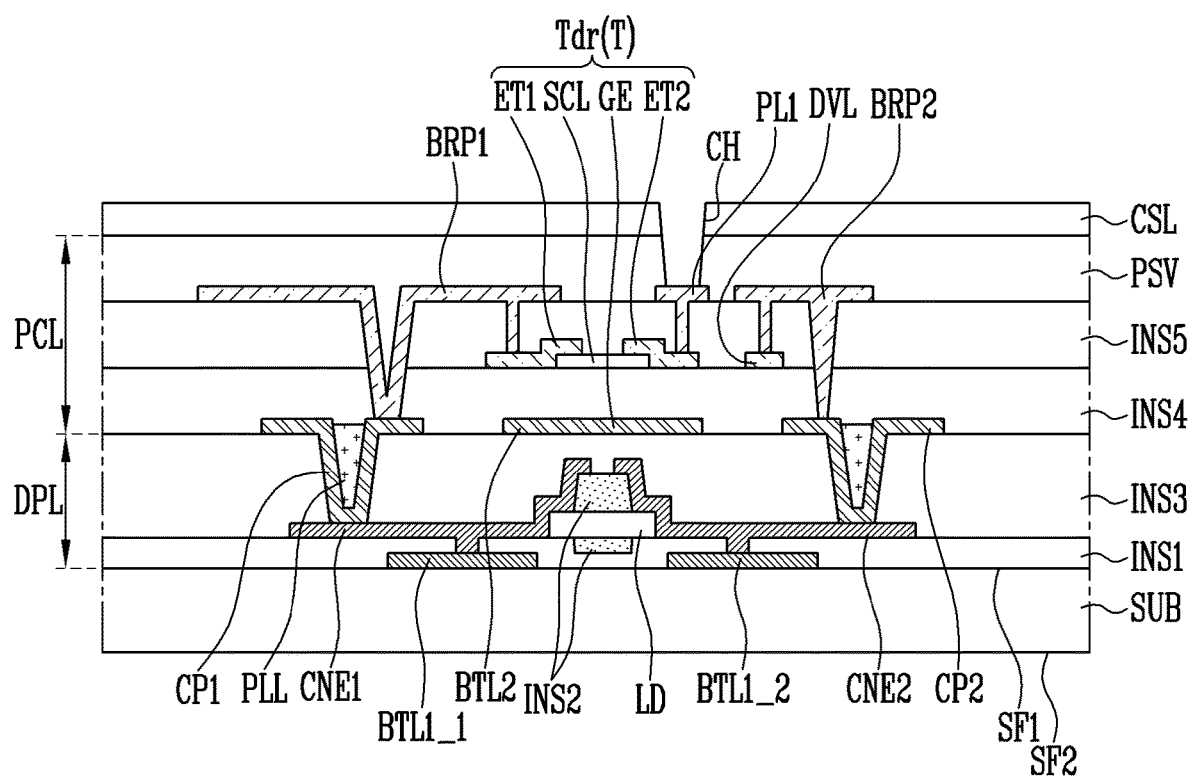
Figure 15M:
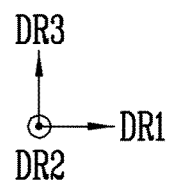
Figure 15N:
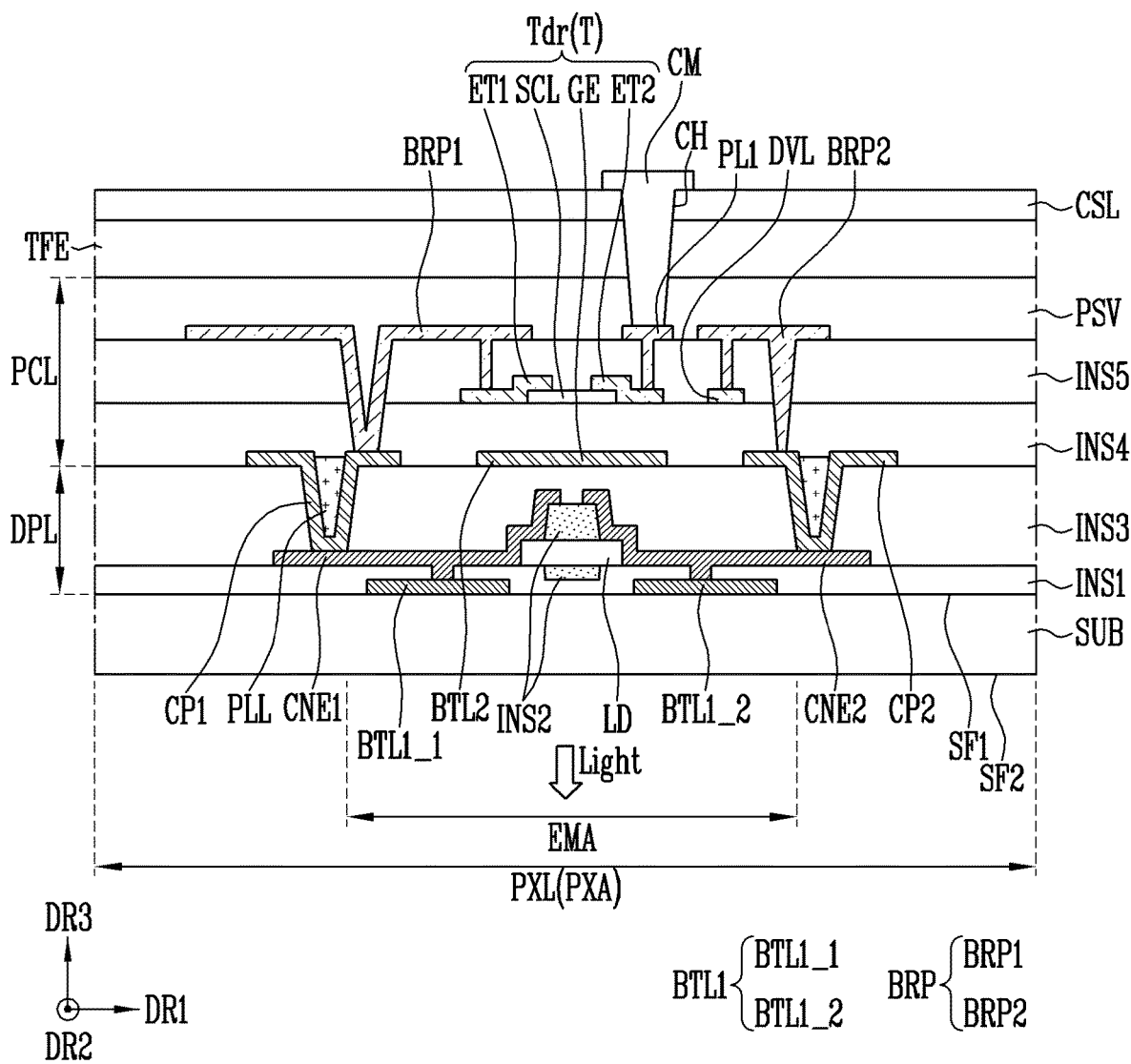

FIGS. 15A to 15N are schematic cross-sectional views illustrating a method of fabricating the display panel of FIG. 9A.

Hereinafter, the method of fabricating the display panel in accordance with an embodiment shown in FIG. 9B will be sequentially described with reference to FIGS. 15A to 15N.

Referring to FIGS. 9B and 15A, the first conductive layer may be formed on the first surface SF1 of the substrate SUB. The first conductive layer may include a first bottom layer BTL1 including 1-1-th and 1-2-th bottom patterns BTL1_1 and BTL1_2. The first bottom layer BTL1 may include transparent conductive material (or transparent conductive substance).

Referring to FIGS. 9B, 15A, and 15B, the first insulating layer INS1 may be formed on the overall surface of the substrate SUB including the first bottom layer BTL1. The first insulating layer INS1 may be partially opened to expose an area of each of the 1-1-th and 1-2-th bottom patterns BTL1_1 and BTL1_2. However, the disclosure is not limited thereto. In an embodiment, the first insulating layer INS1 may completely cover or overlap the 1-1-th and 1-2-th bottom patterns BTL1_1 and BTL1_2 without exposing the 1-1-th or 1-2-th bottom patterns BTL1_1 and BTL1_2.

The first insulating layer INS1 may be partially opened to expose an area of each of the 1-1-th and 1-2-th bottom patterns BTL1_1 and BTL1_2 during a process of forming the second insulating layer INS2, which is described below.

Referring to FIGS. 9B and 15A to 15C, corresponding alignment signals (or corresponding alignment voltages) may be applied to the 1-1-th and 1-2-th bottom patterns BTL1_1 and BTL1_2, so that an electric field may be formed between the 1-1-th bottom pattern BTL1_1 and the 1-2-th bottom pattern BTL1_2.

The 1-1-th bottom pattern BTL1_1 and the 1-2-th bottom pattern BTL1_2 may be alignment electrodes (or alignment lines) for aligning the light emitting element LD in the pixel area PXA (or the emission area EMA) of the pixel PXL.

In case that an alignment signal (or an alignment voltage) of AC power or direct current (DC) power having a voltage and a cycle is applied to each of the 1-1-th bottom pattern BTL1_1 and the 1-2-th bottom pattern BTL1_2, an electric field may be formed by a difference in potential between the 1-1-th bottom pattern BTL1_1 and the 1-2-th bottom pattern BTL1_2. After the electric field has been formed between the 1-1-th bottom pattern BTL1_1 and the 1-2-th bottom pattern BTL1_2, mixed liquid (or solution) including the light emitting element LD may be supplied (or fed) to the pixel area PXA (or the emission area EMA) by using an inkjet printing method or the like within the spirit and the scope of the disclosure. For example, an inkjet nozzle may be disposed over the first insulating layer INS1 of the pixel area PXA (or the emission area EMA), and mixed liquid (or solution) including at least one light emitting element LD may be supplied (or fed) to the pixel area PXA (or the emission area EMA) through the inkjet nozzle. Here, solvent may be at least one of acetone, water, alcohol, and toluene, but the disclosure is not limited thereto. For example, the solvent may have the form of ink or paste. The method of supplying (or feeding) the light emitting element LD to the pixel area PXA (or the emission area EMA) is not limited to that of the foregoing embodiment. The method of feeding the light emitting element LD may be changed in various ways.

After the light emitting element LD is supplied (or fed) to the pixel area PXA (or the emission area EMA), the solvent may be removed.

In case that the light emitting element LD is supplied (or fed) to the pixel area PXA (or the emission area EMA), self-alignment of the light emitting element LD may be induced by an electric field formed between the 1-1-th bottom pattern BTL1_1 and the 1-2-th bottom pattern BTL1_2. The light emitting element LD may be aligned on the first insulating layer INS1 between the 1-1-th bottom pattern BTL1_1 and the 1-2-th bottom pattern BTL1_2.

Referring to FIGS. 9B and 15A to 15D, after an insulating layer is applied onto the overall surface of the first insulating layer INS1 including the light emitting element LD, a process using a mask may be performed thereon, and thus the second insulating layer INS2 may be formed to be disposed on a surface of the light emitting element LD. The second insulating layer INS2 may be formed as a single layer or multiple layers and include an inorganic insulating layer including at least one inorganic material or an organic insulating layer including at least one organic material.

The second insulating layer INS2 may be provided or disposed on the surface of the light emitting element LD such that the opposite ends of the light emitting element LD are exposed to the outside. The second insulating layer INS2 may be provided or disposed on the surface of the light emitting element LD and fix the light emitting element LD to an aligned position, thereby preventing the light emitting element LD from being displaced from the aligned position.

Referring to FIGS. 9B and 15A to 15E, the second conductive layer may be formed on the first and second insulating layers INS1 and INS2. The second conductive layer may include first and second contact electrodes CNE1 and CNE2.

The first contact electrode CNE1 may be formed on the first insulating layer INS1 on the 1-1-th bottom pattern BTL1_1, the first end of the light emitting element LD, and the second insulating layer INS2. The first contact electrode CNE1 may be provided or disposed on or directly provided or disposed on the 1-1-th bottom pattern BTL1_1 and the first end of the light emitting element LD that are exposed by the first insulating layer INS1 to thus be electrically connected to each of the 1-1-th bottom pattern BTL1_1 and the first end of the light emitting element LD. If the 1-1-th bottom pattern BTL1_1 is completely covered or overlapped by the first insulating layer INS1, the first contact electrode CNE1 may be electrically insulated from the 1-1-th bottom pattern BTL1_1 and electrically connected to the first end of the light emitting element LD.

The second contact electrode CNE2 may be formed on the first insulating layer INS1 on the 1-2-th bottom pattern BTL1_2, the second end of the light emitting element LD, and the second insulating layer INS2. The second contact electrode CNE2 may be provided or disposed on or directly provided or disposed on the 1-2-th bottom pattern BTL1_2 and the second end of the light emitting element LD that are exposed by the first insulating layer INS1 to thus be electrically connected to each of the 1-2-th bottom pattern BTL1_2 and the second end of the light emitting element LD. If the 1-2-th bottom pattern BTL1_2 is completely covered or overlapped by the first insulating layer INS1, the second contact electrode CNE2 may be electrically insulated from the 1-2-th bottom pattern BTL1_2 and electrically connected to the second end of the light emitting element LD.

Referring to FIGS. 9B and 15A to 15F, after an insulating layer is applied to the overall surfaces of the first and second contact electrodes CNE1 and CNE2, a process using a mask may be performed thereon to form the third insulating layer INS3 that exposes an area of each of the first and second contact electrodes CNE1 and CNE2.

The third insulating layer INS3 may include an inorganic insulating layer including inorganic material or an organic insulating layer including organic material.

Referring to FIGS. 9B and 15A to 15G, the third conductive layer may be formed on the third insulating layer INS3. The third conductive layer may include first and second conductive patterns CP1 and CP2 and a second bottom layer BTL2.

The first conductive pattern CP1 may be provided or disposed on the first contact electrode CNE1 exposed by the third insulating layer INS3 to thus be electrically and/or physically connected with the first contact electrode CNE1. The second conductive pattern CP2 may be provided or disposed on the second contact electrode CNE2 exposed by the third insulating layer INS3 to thus be electrically and/or physically connected with the second contact electrode CNE2. The second bottom layer BTL2 may be formed on the third insulating layer INS3 to overlap the light emitting element LD.

The first conductive pattern CP1, the second bottom layer BTL2, and the second conductive pattern CP2 may be formed of conductive material (or conductive substance) having a reflectivity.

Referring to FIGS. 9B and 15A to 15H, the planarization layer PLL may be formed on only each of one area or an area of the first conductive pattern CP1 formed or disposed on the first contact electrode CNE1 exposed by the third insulating layer INS3 and an area of the second conductive pattern CP2 formed on the second contact electrode CNE2 exposed by the third insulating layer INS3.

The planarization layer PLL may be a component for mitigating a step difference due to components disposed therebelow and include an organic insulating layer including organic material.

Referring to FIGS. 9B and 15A to 15I, the fourth insulating layer INS4 may be formed on the overall surfaces of the planarization layer PLL, the first and second conductive patterns CP1 and CP2, the second bottom layer BTL2, and the third insulating layer IN3. The fourth insulating layer INS4 may include an inorganic insulating layer including inorganic material or an organic insulating layer including organic material.

Subsequently, the semiconductor pattern SCL may be formed on the fourth insulating layer INS4. The semiconductor pattern SCL may be formed of silicon, for example, amorphous silicon, or may be formed of polysilicon. In case that the semiconductor pattern SCL is formed of amorphous silicon, a crystallization process using a laser or the like may be further performed.

In an embodiment, the semiconductor pattern SCL may be formed of semiconductor oxide including a binary compound ($AB_x$), a ternary compound ($AB_xC_y$), a quaternary compound ($AB_xC_yD_z$), or the like, containing indium (In), zinc (Zn), gallium (Ga), tin (Sn), titanium (Ti), aluminum (Al), hafnium (Hf), zirconium (Zr), magnesium (Mg), or the like within the spirit and the scope of the disclosure. These components may be used alone or in combination.

In an embodiment, the semiconductor pattern SCL may be formed on the fourth insulating layer INS4 to overlap the second bottom layer BTL2. In a cross-sectional view, the semiconductor pattern SCL may completely overlap the second bottom layer BTL2. Since light emitted by the light emitting element LD travels toward the second surface SF2 of the substrate SUB by the second bottom layer BTL2, the second bottom layer BTL2 may function as a light blocking component for blocking the light from traveling toward the semiconductor pattern SCL.

Referring to FIGS. 9B and 15A to 15J, the fourth conductive layer may be formed on the fourth insulating layer INS4 including the semiconductor pattern SCL. The fourth conductive layer may include a first terminal ET1, a second terminal ET2, and a driving voltage line DVL.

The first terminal ET1 may be formed on the semiconductor pattern SCL to contact an end of the semiconductor pattern SCL. The second terminal ET2 may be formed on the semiconductor pattern SCL to contact the other end of the semiconductor pattern SCL. The first terminal ET1 and the second terminal ET2 may be spaced apart from each other on the semiconductor pattern SCL.

The first terminal ET1 may be a source electrode, and the second terminal ET2 may be a drain electrode. Here, the second bottom layer BTL2 disposed under or below the semiconductor pattern SCL with the fourth insulating layer INS4 interposed therebetween may be used as a gate electrode GE.

Therefore, the second bottom layer BTL2, the semiconductor pattern SCL, the first terminal ET1, and the second terminal ET2 may form a bottom-gate-type transistor T. Here, the bottom-gate-type transistor T may be, for example, a driving transistor Tdr.

Referring to FIGS. 9B and 15A to 15K, after an insulating layer is applied onto the driving transistor Tdr and the driving voltage line DVL, a process using a mask may be performed thereon to form the fifth insulating layer INS5 that exposes an area of each of the first terminal ET1, the second terminal ET2, and the driving voltage line DVL.

Furthermore, during the foregoing process, an area of each of the fourth and fifth insulating layers INS4 and INS5 may be removed such that an area of each of the first and second conductive patterns CP1 and CP2 are exposed.

Referring to FIGS. 9B and 15A to 15L, the fifth conductive layer may be formed on the fifth insulating layer INS5. The fifth conductive layer may include a bridge pattern BRP and a first power line PL1. The bridge pattern BRP may include a first bride pattern BRP1 and a second bridge pattern BRP2 which are spaced apart from each other on the fifth insulating layer INS5.

The first bridge pattern BRP1 may be electrically connected both with the first conductive pattern CP1 exposed by the fourth and fifth insulating layers INS4 and INS5 and with the first terminal ET1 exposed by the fifth insulating layer INS5. Therefore, the first terminal ET1 and the first conductive pattern CP1 may be electrically connected to each other by the first bridge pattern BRP1.

The second bridge pattern BRP2 may be electrically connected both with the second conductive pattern CP2 exposed by the fourth and fifth insulating layers INS4 and INS5 and with the driving voltage line DVL exposed by the fifth insulating layer INS5. Therefore, the driving voltage line DVL and the second conductive pattern CP2 may be electrically connected to each other by the second bridge pattern BRP2.

The first power line PL1 may be electrically connected with the second end ET2 exposed by the fifth insulating layer INS5.

Referring to FIGS. 9B and 15A to 15M, the passivation layer PSV may be formed on the fifth conductive layer. Subsequently, after an insulating layer is formed on the passivation layer PSV, a process using a mask may be performed thereon to form the cushion layer CSL including a contact hole CH corresponding to an area of the first power line PL1.

Thereafter, an area of the first power line PL1 may be exposed by removing a portion of the passivation layer PSV that is disposed under or below the cushion layer CSL and corresponds to the contact hole CH of the cushion layer CSL.

Referring to FIGS. 9B and 15A to 15N, the connector CM may be disposed in the contact hole CH. The driver DRP (refer to FIG. 4) may be disposed over the connector CM so that the driver DRP and the first power line PL1 may be electrically connected to each other.

In the display device formed by the above-mentioned fabricating process, the pixel PXL and the driver DRP may be successively formed on a same surface (e.g., the first surface SF1) of the substrate SUB, so that the fabricating process may be simplified. Furthermore, since an image is display on the second surface SF2 of the substrate SUB on which the pixel PXL and the driver DRP are not formed, the non-display area (or the display surface) of the second surface SF2 may be minimized, so that a wider image may be provided to the user.

In the foregoing embodiments, although the second bottom layer BTL2 is illustrated as being used as the gate electrode GE of the transistor T to form the bottom-gate type driving transistor Tdr, the disclosure is not limited thereto. In an embodiment, the gate electrode GE may be provided or disposed as a separate component form the second bottom layer BTL2 and be disposed on the semiconductor pattern SCL. Hereinafter, there will be described an embodiment where the gate electrode GE is provided or disposed as a separate component form the second bottom layer BTL2 and disposed over the semiconductor pattern SCL.

Figure 16:
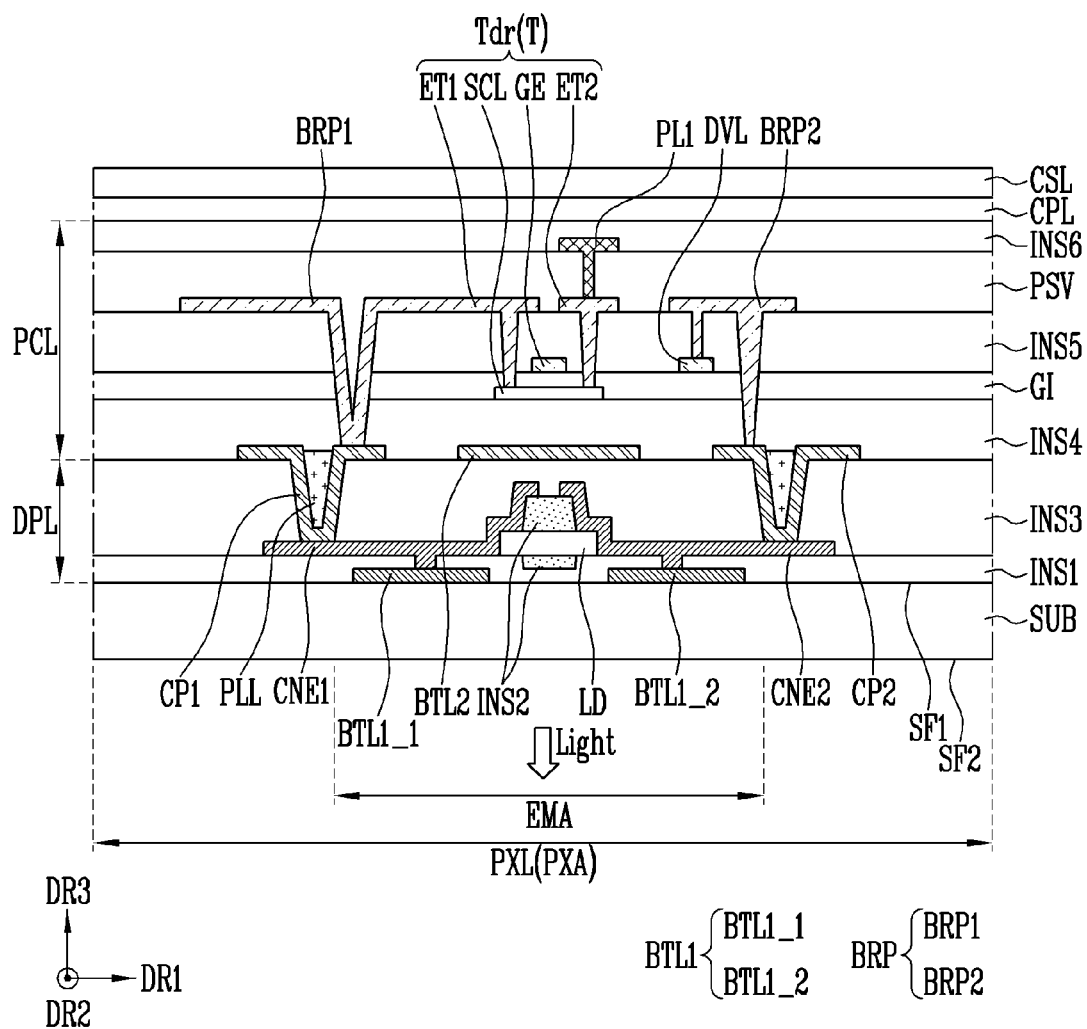
FIGS. 16 and 17 are schematic cross-sectional views of a display panel in accordance with an embodiment.
Figure 17:
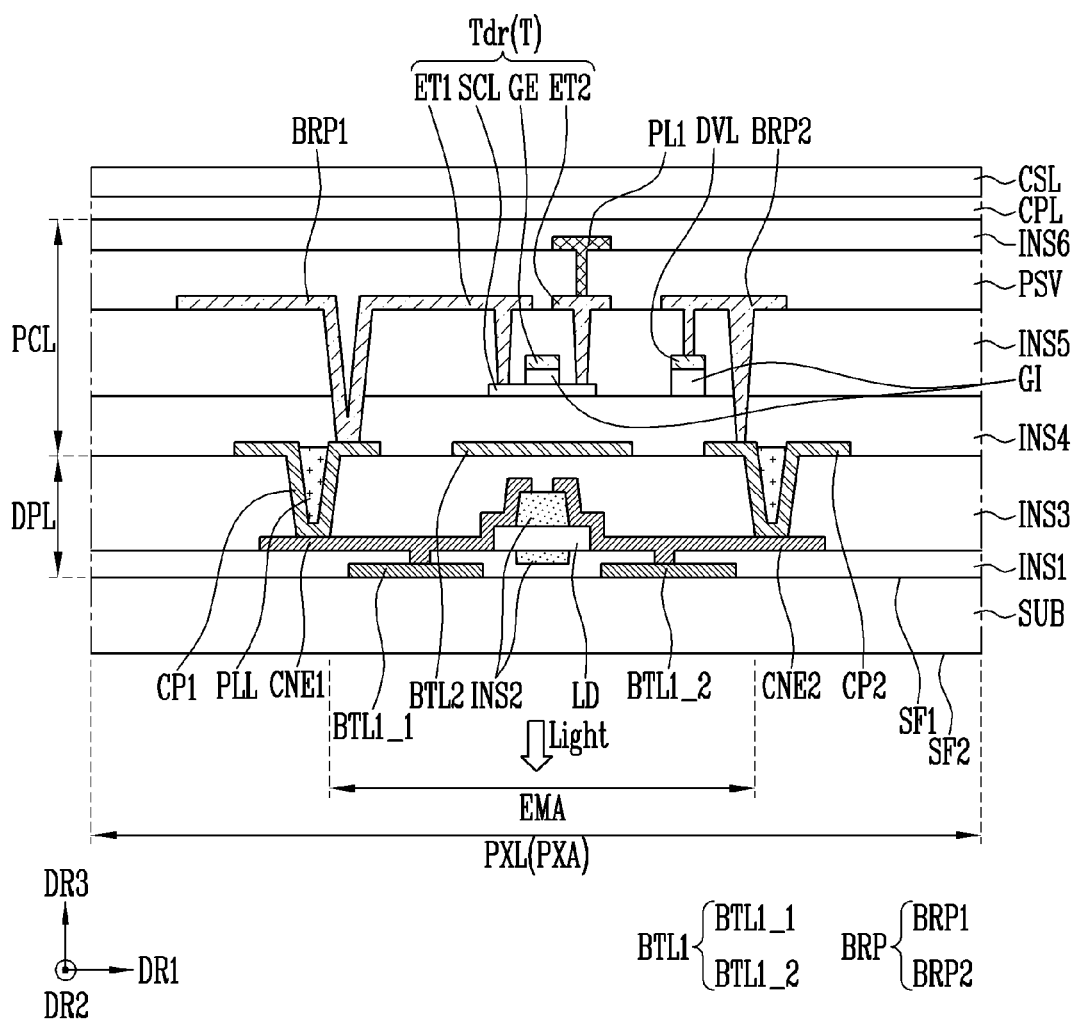

FIGS. 16 and 17 are schematic cross-sectional views of a display panel in accordance with an embodiment.

The display panel illustrated in FIGS. 16 and 17 and the pixel of FIG. 9A may have a substantially equal or similar component, except that the transistor included in the pixel circuit layer PCL is a top-gate-type transistor and an additional capping layer CPL is disposed.

Therefore, to avoid repetitive descriptions, the description of the display panel of FIGS. 16 and 17 will be focused on differences from that of the foregoing embodiments. Components which are not separately explained in the following description of the embodiment are identical to those of the foregoing embodiments. The same reference numeral will be used to designate the same component, and a similar reference numeral will be used to designate a similar component.

Referring to FIGS. 4, 5A, 5B, 16, and 17, the display panel DPP in accordance with an embodiment may include a substrate SUB, at least one pixel PXL, a capping layer CPL, and a cushion layer CSL. Here, the pixel PXL may include a display element layer DPL and a pixel circuit layer PCL that may be successively stacked on the first surface SF1 of the substrate SUB.

The pixel circuit layer PCL may include first and second conductive patterns CP1 and CP2, a second bottom layer BTL2, a planarization layer PLL, fourth to sixth insulating layers INS4, INS5, and INS6, at least one transistor T, a driving voltage line DVL, a gate insulating layer GI, a bridge pattern BRP, a passivation layer PSV, and a first power line PL1.

The first conductive pattern CP1 may be electrically connected with some or a number of components of the display element layer DPL, e.g., the first contact electrode CNE1. The second conductive pattern CP2 may be electrically connected with some or a number of components of the display element layer DPL, e.g., the second contact electrode CNE2. The first and second conductive patterns CP1 and CP2 may function as a light guide component that guides light emitted by the light emitting element LD of the display element layer DPL in the image display direction (e.g., toward the second surface SF2 of the substrate SUB) of the display device. To this end, the first and second conductive patterns CP1 and CP2 may be formed of opaque conductive material (or opaque conductive substance) having a reflectivity.

The second bottom layer BTL2 may be provided or disposed and/or formed on the third insulating layer INS3 of the display element layer DPL to correspond to the light emitting element LD disposed in the emission area EMA of the pixel PXL. In an embodiment, the second bottom layer BTL2 may be a light blocking component provided or disposed between the light emitting element LD of the display element layer DPL and the transistor T of the pixel circuit layer PCL so as to block light emitted by the light emitting element LD to travel toward the transistor T. The second bottom layer BTL2 may be formed of opaque conductive material (or opaque conductive substance) having a reflectivity.

The second bottom layer BTL2 may be provided or disposed and/or formed on the third insulating layer INS3 to correspond to a position at which the semiconductor pattern SCL of the transistor T is to be formed, and may function to maintain constant voltage characteristics of the semiconductor pattern SCL, thereby enhancing characteristics of the transistor T. In an embodiment, the second bottom layer BTL2 may be electrically connected with some or a number of components of the transistor T, e.g., the first terminal ET1 (or the source electrode), thereby increasing a driving range of a gate voltage to be applied to the gate electrode GE of the transistor T.

The first conductive pattern CP1, the second conductive pattern CP2, and the second bottom layer BTL2 may be provided or disposed on a same layer, include a same material or similar material, and be formed by a same process.

The fourth insulating layer INS4 may be provided or disposed and/or formed on the first conductive pattern CP1, the second conductive pattern CP2, and the second bottom layer BTL2. The transistor T may be disposed on the fourth insulating layer INS4. In an embodiment, the transistor T may be a driving transistor Tdr that controls driving current of the light emitting element LD.

The driving transistor Tdr may include a semiconductor pattern SCL, a gate electrode GE, a first terminal ET1, and a second terminal ET2. The first terminal ET1 may be a source electrode, and the second terminal ET2 may be a drain electrode.

The semiconductor pattern SCL may be provided or disposed and/or formed on the fourth insulating layer INS4 to correspond to the second bottom layer BTL2. The semiconductor pattern SCL may include a first contact area which contacts the first terminal ET1 and a second contact area which contacts the second terminal ET2. An area between the first contact area and the second contact area may be a channel area. The channel area may overlap the gate electrode GE of the driving transistor Tdr. The semiconductor pattern SCL may be a semiconductor pattern formed of polysilicon, amorphous silicon, an oxide semiconductor, or the like within the spirit and the scope of the disclosure. For example, the channel area may be a semiconductor pattern undoped with impurities and may be an intrinsic semiconductor. Each of the first contact area and the second area may be a semiconductor pattern doped with impurities.

The gate electrode GE may be provided or disposed and/or formed on the gate insulating layer GI to correspond to the channel area of the semiconductor pattern SCL. The gate electrode GE may be provided or disposed on the gate insulating layer GI and overlap the channel area of the semiconductor pattern SCL. The gate electrode GE may have a single-layer structure formed of at least one selected from the group consisting of copper (Cu), molybdenum (Mo), tungsten (W), aluminum neodymium (AlNd), titanium (Ti), aluminum (Al), silver (Ag), and an alloy thereof, or may have a double-layer or multilayer structure formed of molybdenum (Mo), titanium (Ti), copper (Cu), aluminum (Al), or silver (Ag) to reduce line resistance.

The driving voltage line DVL and the gate electrode GE may be provided or disposed and/or formed on a same layer. The driving voltage line DVL and the second power line PL2 described with reference to FIG. 8 may have a same configuration. The driving voltage line DVL may be electrically connected, through a separate connector, with the driver DRP disposed over the display component DPP.

The gate insulating layer GI may be an inorganic insulating layer formed of inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to that of the foregoing embodiments. In an embodiment, the gate insulating layer GI may be formed of an organic insulating layer including organic material. Although the gate insulating layer GI may be provided in a single-layer structure, the gate insulating layer GI may be provided in a multilayer structure having at least two or more layers. Although the gate insulating layer GI may be formed on the overall surface of the fourth insulating layer INS4 including the semiconductor pattern SCL, the disclosure is not limited thereto. In an embodiment, the gate insulating layer GI may be provided or disposed and/or formed in the form of an individual pattern which is sectionally disposed and provided only in an area in which the gate electrode GE and the driving voltage line DVL are disposed, as illustrated in FIG. 17.

The first terminal ET1 and the second terminal ET2 each may be provided or disposed and/or formed on the fifth insulating layer INS5 and respectively contact the first contact area and the second contact area of the semiconductor pattern SCL through contact holes successively passing through the gate insulating layer GI and the fifth insulating layer INS5. For example, the first terminal ET1 may contact the first contact area of the semiconductor pattern SCL, and the second terminal ET2 may contact the second contact area of the semiconductor pattern SCL. Each of the first and second terminals ET1 and ET2 and the gate electrode GE may include a same material or similar material or include one or more materials selected from among materials provided as examples of the material of the gate electrode GE.

The bridge pattern BRP may be provided or disposed and/or formed on the fifth insulating layer INS5. The bridge pattern BRP may include a first bride pattern BRP1 and a second bridge pattern BRP2 which are spaced apart from each other on the fifth insulating layer INS5.

The first bridge pattern BRP1 may be electrically connected with the first conductive pattern CP1 that is exposed by removing respective areas of the fifth insulating layer INS5, the gate insulating layer GI, and the fourth insulating layer INS4. Furthermore, the first bridge pattern BRP1 may be integral with or disposed with the first terminal ET1 of the driving transistor Tdr to be electrically and/or physically connected with the first terminal ET1. The driving transistor Tdr of the pixel circuit layer PCL and the first contact electrode CNE1 of the display element layer DPL may be electrically connected to each other through the first bridge pattern BRP1 and the first conductive pattern CP1.

The second bridge pattern BRP2 may be electrically connected with the second conductive pattern CP2 that is exposed by removing respective areas of the fifth insulating layer INS5, the gate insulating layer GI, and the fourth insulating layer INS4. Furthermore, the second bridge pattern BRP2 may be electrically connected with the driving voltage line DVL exposed by removing another area of the fifth insulating layer INS5. The driving voltage line DVL of the pixel circuit layer PCL and the second contact electrode CNE2 of the display element layer DPL may be electrically connected to each other through the second bridge pattern BRP2 and the second conductive pattern CP2.

As illustrated in FIG. 17, in case that the gate insulating layer GI is sectionally provided in the form of an individual pattern such that the gate insulating layer GI is disposed only in a specific or selected area, the first bridge pattern BRP1 may be electrically connected with the first conductive pattern CP1 exposed by removing respective areas of the fourth and fifth insulating layers INS4 and INS5, and the second bridge pattern BRP2 may be electrically connected with the second conductive pattern CP2 exposed by removing respective areas of the fourth and fifth insulating layers INS4 and INS5.

The passivation layer PSV may be provided or disposed and/or formed on the bridge pattern BRP. The passivation layer PSV may include an inorganic insulating layer including inorganic material or an organic insulating layer including organic material. In an embodiment, the passivation layer PSV may be partially opened to expose an area of the second terminal ET2.

The first power line PL1 may be provided or disposed and/or formed on the passivation layer PSV. The first power line PL1 and the first power line PL1 described with reference to FIG. 8 may have a same configuration.

The sixth insulating layer INS6 may be provided or disposed and/or formed on the first power line PL1. The sixth insulating layer INS6 and the gate insulating layer GI may include a same material or similar material, or may include one or more materials selected from among materials provided as examples of the material of the gate insulating layer GI. The sixth insulating layer INS6 may be partially opened to expose an area of the first power line PL1.

The capping layer CPL may be provided or disposed and/or formed on the sixth insulating layer INS6. The capping layer CPL may be partially opened to expose the first power line PL1 exposed by the sixth insulating layer INS6. The capping layer CPL may include an inorganic insulating layer including inorganic material so as to prevent external air, water, or the like from permeating the pixel circuit layer PCL. However, in an embodiment, the capping layer CPL may be omitted.

The cushion layer CSL may be provided or disposed and/or formed on the capping layer CPL. The cushion layer CSL may be a protective film for protecting the pixels PXL disposed therebelow. The cushion layer CSL may include an organic insulating layer including organic material.

In a display device and a method of fabricating the display device in accordance with an embodiment, a display element layer including a light emitting element that emits light may be formed or disposed on a first surface (or an upper surface) of a substrate. A pixel circuit layer including a transistor may be formed or disposed on the display element layer. A driver electrically connected with the pixel circuit layer may be disposed on the pixel circuit layer. Therefore, pixels and the driver may be successively provided or disposed on the first surface (or the upper surface) of the substrate. Resultantly, a process of fabricating the display device may be simplified.

In an embodiment, a conductive reflective component may be disposed between the display element layer and the pixel circuit layer so that light emitted by the light emitting elements toward the first surface (or the upper surface) of the substrate may be guided toward a second surface (or a lower surface) facing the first surface. Therefore, components included in the pixel circuit layer may be protected, and loss of light due to the components included in the pixel circuit layer may be minimized.

Furthermore, in accordance with an embodiment, the pixels may be disposed on the first surface (or the upper surface) of the substrate, and the driver may be disposed over the pixels. Therefore, a non-display area on a display surface, e.g., the second surface (or the lower surface) of the substrate, may be minimized, so that a wider image may be provided to a user.

The effects of an embodiment are not limited by the foregoing, and other various effects are anticipated herein.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit and scope of the disclosure. The scope of the disclosure is to be defined by the accompanying claims.

What is claimed is:
1. A display device comprising:
a substrate including:
a display area and a non-display area; and
a first surface and a second surface that face each other;
a plurality of pixels disposed on the first surface in the display area;
a signal line disposed on the first surface in the non-display area, and electrically connected to each of the plurality of pixels;
a cushion layer disposed on the plurality of pixels and the signal line, the cushion layer including at least one contact hole that exposes a portion of the signal line;
a connector disposed in the at least one contact hole and electrically connected to the signal line; and
a driver disposed on the cushion layer and electrically connected to the plurality of pixels through the connector,
wherein each of the plurality of pixels comprises:
a display element layer disposed on the first surface of the substrate and including at least one light emitting element; and
a pixel circuit layer disposed on the display element layer and including at least one transistor electrically connected to the at least one light emitting element.

2. The display device according to claim 1, further comprising:
a pad electrode disposed in the non-display area between the pixel circuit layer and the cushion layer,
wherein the pad electrode electrically connects the signal line to the connector through the at least one contact hole.

3. The display device according to claim 1, wherein the display element layer comprises:
a first bottom layer including a first bottom pattern and a second bottom pattern spaced apart from each other;

the at least one light emitting element disposed between the first bottom pattern and the second bottom pattern; and a first contact electrode and a second contact electrode disposed on the at least one light emitting element, the pixel circuit layer comprises:

a first conductive pattern electrically connected to the first contact electrode;

a second conductive pattern electrically connected to the second contact electrode;

a second bottom layer disposed on the display element layer and spaced apart from the first conductive pattern and the second conductive pattern; and the at least one transistor disposed on the first conductive pattern and the second conductive pattern, and the second bottom layer overlaps the at least one light emitting element and the at least one transistor.

4. The display device according to claim 3, wherein the second bottom layer comprises a light block component disposed between the at least one light emitting element and the at least one transistor that blocks light to the at least one transistor.

5. The display device according to claim 4, wherein the second bottom layer comprises a gate electrode of the at least one transistor.

6. The display device according to claim 5, wherein the first conductive pattern, the second conductive pattern, and the second bottom layer each include a conductive material having a reflectivity.

7. The display device according to claim 6, wherein the display element layer comprises:

a first insulating layer disposed on the first bottom layer and exposing a portion of each of the first bottom pattern and the second bottom pattern; and a second insulating layer disposed on the first contact electrode and the second contact electrode and exposing a portion of each of the first contact electrode and the second contact electrode, and the pixel circuit layer comprises:

a planarization layer disposed on the first conductive pattern and the second conductive pattern on the second insulating layer;

a third insulating layer disposed on the at least one transistor and exposing a portion of each of the first conductive pattern and the second conductive pattern;

a first bridge pattern disposed on the third insulating layer and electrically connected to the first conductive pattern; and a second bridge pattern spaced apart from the first bridge pattern and electrically connected to the second conductive pattern.

8. The display device according to claim 7, each of the plurality of pixels includes an emission area that emits light, and the first bottom layer overlaps the emission area.

9. The display device according to claim 8, wherein the first bottom layer, the first contact electrode, and the second contact electrode each include a transparent conductive material.

10. The display device according to claim 8, wherein the planarization layer includes sections disposed on only the first conductive pattern and the second conductive pattern.

11. The display device according to claim 8, wherein the planarization layer is disposed on the first conductive pattern, the second conductive pattern, and the second bottom layer and overlaps all of the first conductive pattern, the second conductive pattern, and the second bottom layer.

12. The display device according to claim 8, further comprising:

a dummy layer disposed on the second surface of the substrate.

13. The display device according to claim 4, wherein the display element layer comprises:

a first insulating layer disposed on the first bottom layer;

a first electrode and a second electrode disposed on the first insulating layer and spaced apart from each other; and a second insulating layer disposed on the first contact electrode and the second contact electrode and exposing a portion of each of the first contact electrode and the second contact electrode, and the pixel circuit layer comprises:

a planarization layer disposed on the first conductive pattern and the second conductive pattern on the second insulating layer;

a third insulating layer disposed on the at least one transistor and exposing a portion of each of the first conductive pattern and the second conductive pattern;

a first bridge pattern disposed on the third insulating layer and electrically connected to the first conductive pattern; and a second bridge pattern spaced apart from the first bridge pattern and electrically connected to the second conductive pattern.

14. The display device according to claim 13, wherein each of the plurality of pixels includes an emission area that emits light, and the first bottom layer does not overlap the emission area.

15. The display device according to claim 14, wherein the first bottom layer comprises a light block component that absorbs or blocks external light.

16. The display device according to claim 15, wherein the at least one light emitting element is disposed on the first insulating layer between the first electrode and the second electrode.

17. The display device according to claim 15, wherein the display element layer further comprises an additional insulating layer disposed between the first electrode and the second electrode and the first contact electrode and the second contact electrode, and the at least one light emitting element is disposed on the additional insulating layer between the first electrode and the second electrode.

18. The display device according to claim 4, wherein the at least one transistor comprises:

an insulating layer disposed between a semiconductor layer and the second bottom layer;

a gate electrode that overlaps an area of the semiconductor layer;

a gate insulating layer disposed between the gate electrode and the semiconductor layer; and a first terminal and a second terminal electrically contacting opposite ends of the semiconductor layer.

19. A multi-screen display device comprising:

a plurality of display devices each comprising:

a display panel including a plurality of pixels disposed on a substrate;

a cushion layer disposed on the display panel and including a contact hole exposing a portion of the display panel; and a driver disposed on the cushion layer and electrically connected to the plurality of pixels through a connector disposed in the contact hole, wherein each of the plurality of pixels comprises:

a first bottom layer disposed on the substrate and including a first bottom pattern and a second bottom pattern spaced apart from each other;

at least one light emitting element disposed between the first bottom pattern and the second bottom pattern; and a first contact electrode and a second contact electrode disposed on the at least one light emitting element;

a first insulating layer disposed on the first contact electrode and the second contact electrode and exposing a portion of each of the first contact electrode and the second contact electrode;

a second bottom layer disposed on the first insulating layer that overlaps a first conductive pattern electrically connected to the first contact electrode, a second conductive pattern electrically connected to the second contact electrode, and the at least one light emitting element;

a second insulating layer disposed on the first conductive pattern, the second conductive pattern, and the second bottom layer;

at least one transistor disposed on the second insulating layer and electrically connected to the at least one light emitting element;

a first bridge pattern disposed on the at least one transistor and electrically connected to the first conductive pattern; and a second bridge pattern spaced apart from the first bridge pattern and electrically connected to the second conductive pattern.

20. A method of fabricating a display device, comprising:

providing a pixel including at least one pixel area on a substrate, wherein the providing of the pixel comprises:

forming a first bottom layer including a first bottom pattern and a second bottom pattern spaced apart from each other on a first surface of the substrate;

aligning at least one light emitting element between the first bottom pattern and the second bottom pattern;

forming a first contact electrode and a second contact electrode spaced apart from each other on the at least one light emitting element;

forming a first insulating layer on the first contact electrode and the second contact electrode, the first insulating layer exposing a portion of each of the first contact electrode and the second contact electrode;

forming a first conductive pattern, a second conductive pattern, and a second bottom layer spaced apart from each other on the first insulating layer;

forming at least one transistor on the first conductive pattern, the second conductive pattern, and the second bottom layer;

forming a second insulating layer exposing an area of each of the first conductive pattern and the second conductive pattern on the at least one transistor; and forming a first bridge pattern electrically connected to the first conductive pattern and a second bridge pattern electrically connected to the second conductive pattern on the second insulating layer, and the second bottom layer is disposed between the at least one light emitting element and the at least one transistor, and overlaps the at least one light emitting element and the at least one transistor.

* * * * *